(12) United States Patent
Kelley

(10) Patent No.: US 11,198,640 B2
(45) Date of Patent: Dec. 14, 2021

(54) SYSTEMS, DEVICES, AND/OR METHODS FOR IMAGES

(71) Applicant: Dylan Kelley, Colorado Springs, CO (US)

(72) Inventor: Dylan Kelley, Colorado Springs, CO (US)

(*) Notice: Subject to any disclaimer, the term of this patent is extended or adjusted under 35 U.S.C. 154(b) by 0 days.

(21) Appl. No.: 16/436,778

(22) Filed: Jun. 10, 2019

(65) Prior Publication Data

US 2019/0375674 A1 Dec. 12, 2019

Related U.S. Application Data

(60) Provisional application No. 62/682,983, filed on Jun. 10, 2018, provisional application No. 62/712,117, filed on Jul. 30, 2018.

(51) Int. Cl.
| | |
|---|---|
| *C03C 15/00* | (2006.01) |
| *G05B 19/18* | (2006.01) |
| *G06F 30/23* | (2020.01) |
| *B81C 1/00* | (2006.01) |
| *A24F 1/30* | (2006.01) |
| *A47G 19/22* | (2006.01) |
| *B33Y 80/00* | (2015.01) |

(52) U.S. Cl.
CPC .......... *C03C 15/00* (2013.01); *B81C 1/00539* (2013.01); *G05B 19/182* (2013.01); *G06F 30/23* (2020.01); *A24F 1/30* (2013.01); *A47G 19/2205* (2013.01); *B33Y 80/00* (2014.12); *B65D 2203/00* (2013.01); *C03C 2218/34* (2013.01); *G05B 2219/35044* (2013.01); *G05B 2219/45244* (2013.01)

(58) Field of Classification Search
CPC . C03C 15/00; C03C 2218/34; B81C 1/00539; G06F 30/23; G05B 19/182; G05B 2219/35044; G05B 2219/45244; A24F 1/30; A47G 19/2205; B65D 2203/00; B33Y 80/00; B24C 1/04
USPC ...................................... 216/95, 99
See application file for complete search history.

(56) References Cited

U.S. PATENT DOCUMENTS

| | | | |
|---|---|---|---|
| 9,555,470 B1* | 1/2017 | Heneveld | F01D 5/147 |
| 2014/0183395 A1* | 7/2014 | Popke | F16K 5/205 |
| | | | 251/283 |
| 2014/0323981 A1* | 10/2014 | Giraud | A61M 5/343 |
| | | | 604/218 |
| 2015/0306657 A1* | 10/2015 | Frank | C04B 35/505 |
| | | | 164/23 |

OTHER PUBLICATIONS

Translation of JP-2007-557806 (Year: 2009).*

* cited by examiner

*Primary Examiner* — Duy Vu N Deo
(74) *Attorney, Agent, or Firm* — Dale Jensen, PLC; Dale Jensen

(57) ABSTRACT

Certain exemplary embodiments can provide a method comprising, via computer aided design, designing parts of an object that comprises an outer shell and an inner body, at least one of the outer shell and the inner body defining a specific volume negative space relief. In certain exemplary embodiments, the specific volume negative space relief defines a channel constructed to pass at least one of a fluid and a gas.

13 Claims, 107 Drawing Sheets
(55 of 107 Drawing Sheet(s) Filed in Color)

1000

4000

5000

6000

6100  6400

13700

14800

18000

22500

30500

46000

48000

50000

52000

52300

52600

57000

59000

62000

67000

68000

69000

75500

75600

76000

79000

SYSTEMS, DEVICES, AND/OR METHODS FOR IMAGES

CROSS-REFERENCES TO RELATED APPLICATIONS

This application claims priority to, and incorporates by reference herein in its entirety, U.S. Provisional Patent Application Ser. No. 62/682,983, filed Jun. 10, 2018. This application further claims priority to, and incorporates by reference herein in its entirety, U.S. Provisional Patent Application Ser. No. 62/712,117, filed Jul. 30, 2018.

BRIEF DESCRIPTION OF THE DRAWINGS

The patent or application file contains at lease one drawing executed in color Copies of this patent or patent application publication with color drawing(s) will be provided by the Office upon request and payment of the necessary fee. FIGS. 1-13, FIG. 13D, FIG. 14, FIGS. 14D-14E, FIGS. 15-15C, FIG. 15G, FIGS. 16-16B, FIG. 17, FIG. 17B, FIG. 17E, FIG. 18, FIGS. 21-22, FIG. 22B, FIG. 26, FIG. 30, FIG. 33, FIG. 35, FIG. 38, FIG. 42, FIG. 47, FIG. 50, FIGS. 53-54, FIGS. 57-64, FIGS. 67-68, FIG. 70, FIG. 75B, and FIG. 77 are executed in color. A wide variety of potential practical and useful embodiments will be more readily understood through the following detailed description of certain exemplary embodiments, with reference to the accompanying exemplary drawings in which:

FIG. 1 is a photograph of a perspective view of an exemplary embodiment of an information device 1000;

FIG. 2 is a photograph of a perspective view of an exemplary embodiment of a system 2000;

FIG. 3 is a photograph of a perspective view of an exemplary embodiment of a system 3000;

FIG. 4 is a photograph of a perspective view of an exemplary embodiment of a system 4000;

FIG. 5 is a photograph of a perspective view of an exemplary embodiment of a system 5000;

FIG. 6 is a photograph of a perspective view of an exemplary embodiment of a system 6000;

FIG. 7 is a photograph of a different perspective view of exemplary system 6000;

FIG. 8 is a photograph of a different perspective view of exemplary system 6000;

FIG. 9 is a photograph of a different perspective view of exemplary system 6000;

FIG. 10 is a photograph of a different perspective view of exemplary system 6000;

FIG. 11 is a photograph of a perspective view of exemplary system 11000;

FIG. 12 is a photograph of a perspective view of an exemplary embodiment of a system 12000;

FIG. 13 is a photograph of a perspective view of an exemplary embodiment of a ball fluid pipe 13000;

FIG. 13D is a diagram of a perspective view of an exemplary embodiment of a ball fluid pipe 13800 with fluid pipe, negative space relief passages;

FIG. 14 is a photograph of a perspective view of an exemplary embodiment of a fluid pipe 14000;

FIG. 14D is a perspective view of an exemplary embodiment of a fluid pipe 14800 showing negative relief passages through walls;

FIG. 14E is a side view of an exemplary embodiment of a fluid pipe 14900 showing negative relief passages through walls;

FIG. 15 is a photograph of a perspective view of an exemplary embodiment of a fluid pipe 15000;

FIG. 15C is a diagram of a perspective view of exemplary fluid pipe 15001 showing negative space relief passages;

FIG. 15G is a diagram of a side view of exemplary fluid pipe 15001 showing negative space relief passages;

FIG. 16 is a photograph of a perspective view of an exemplary embodiment of a fluid pipe 16000;

FIG. 16B is a photograph of a perspective view of exemplary fluid pipe 16000;

FIG. 17 is a photograph of a perspective view of an exemplary embodiment of a fluid pipe 17000;

FIG. 17B is a diagram of a perspective view of an exemplary embodiment of a fluid pipe 17001;

FIG. 17E is a diagram of a semi-transparent perspective view of fluid pipe 17001;

FIG. 18 is a photograph of a perspective view of an exemplary embodiment of a fluid pipe 18000;

FIG. 21 is a diagram of an exemplary embodiment of a cooling distiller 21000;

FIG. 22 is a side view of an exemplary embodiment of an inner cooling unit of a cooling distiller 22000;

FIG. 22B is a side view of an exemplary embodiment of an inner cooling unit of a cooling distiller 22500;

FIG. 26 is a perspective cutaway view of an exemplary embodiment of a fill and drain bucket/deepwater culture under-current bucket 26000 without an outer sleeve;

FIG. 30 is a perspective view of an exemplary embodiment of a fill and drain bucket 30000 without an outer sleeve;

FIG. 33 is a perspective view of an exemplary embodiment of a cup 33000;

FIG. 35 is a cutaway view of an exemplary embodiment of a system 35000;

FIG. 38 is a diagram of a perspective view of an exemplary embodiment of a fluid pipe 38000 showing negative space relief passages;

FIG. 42 is a diagram showing a perspective cutaway view of an exemplary embodiment of secret cup 42000;

FIG. 47 is a perspective view of an exemplary embodiment of a secret cup 47000 without an outer sleeve;

FIG. 50 is a perspective view of an exemplary embodiment of water flushing aeration bucket 50000 without an outer sleeve;

FIG. 53 is a perspective view of an exemplary embodiment of water flushing aeration bucket 52600 without an outer sleeve;

FIG. 54 is a diagram of a perspective view of an exemplary embodiment of a fluid pipe 54000;

FIG. 57 is a photograph of a perspective view of an exemplary CAD design 57000 of a vessel with a channel defined within the walls thereof;

FIG. 58 is a photograph of a perspective view of an exemplary embodiment of a system 58000;

FIG. 59 is a photograph of a perspective view of an exemplary embodiment of a system 59000;

FIG. 60 is a photograph of a perspective view of an exemplary embodiment of a system 60000;

FIG. 61 is a photograph of a perspective view of an exemplary embodiment of a system 61000;

FIG. 62 is a photograph of a perspective view of an exemplary embodiment of a system 62000;

FIG. 63 is a photograph of a perspective view of an exemplary embodiment of a fluid pipe 63000;

FIG. 64 is a diagram of a perspective view of an exemplary embodiment of a fluid pipe 64000;

FIG. 67 is a photograph of a perspective view of an exemplary CAD design 67000;

FIG. 68 is a photograph of an exemplary CAD design 68000;

FIG. 70 is a diagram of a perspective view of an exemplary embodiment of a drinking cup 70000;

FIG. 75B is an exploded diagram of a perspective view of an exemplary embodiment of a drinking container 75550;

FIG. 77 is a diagram of a perspective view of an exemplary embodiment of a drinking container 77000;

DETAILED DESCRIPTION

Certain exemplary embodiments can provide a method comprising, via computer aided design, designing parts of a vessel (e.g., a non-metal vessel), or any solid object made of any material, that comprises an outer shell and an inner body, at least one of the outer shell and the inner body defining a specific volume negative space relief. In certain exemplary embodiments, the specific volume negative space relief defines a channel constructed to pass at least one of a fluid and a gas.

Certain exemplary embodiments can provide a method comprising fabricating a vessel that comprises an outer shell, or layer, and an inner body. The inner body can define one or more patterns, which can be an image and/or any specific volume negative space relief In certain exemplary embodiments:
- the image or specific volume negative space relief is constructed for delivering, draining, holding, trapping, and/or recirculating a gas, fluid, plasma, electricity, or solid;
- the outer shell is substantially airtight and can be applied to any shaped surface;
- the inner body defines at least one aperture; and
- a gas, fluid, plasma, or solid is retained by the outer shell;
- when a gas or fluid is propelled from a reservoir defined by the outer shell, the gas or fluid flows through the at least one aperture and is recirculated to the reservoir; and
- the gas or fluid through the at least one aperture does at least one of:
  - recirculates to a chamber defined by the vessel; and
  - flows to a chamber defined by the vessel.

Certain exemplary embodiments define one or more negative space reliefs that are substantially airtight and/or watertight. In such embodiments, substances in the negative space reliefs remain in the negative space reliefs and behave accordingly.

Figure 1:
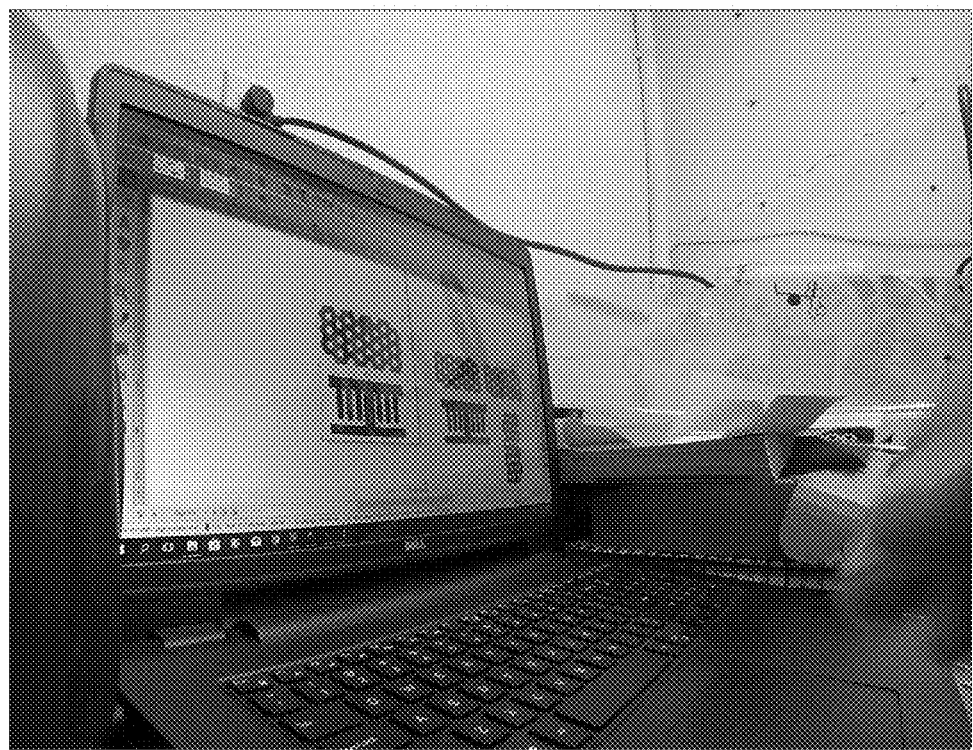

FIG. 1 is a photograph of a perspective view of an exemplary embodiment of an information device 1000, which can be utilized in the fabrication of devices and/or systems described herein. In certain exemplary embodiments, machine instructions utilized by information device 1000 can be used to create one or more masks that can be utilized for creating patterns such as images and/or negative spaces in objects. The masks can be created, for example, via a vinyl cutter. In certain exemplary embodiments, information device 1000 can be utilized for creation of certain devices and systems disclosed herein via 3-D printing. 3-D printed components can be utilized to create molds for use in fabricating devices and/or systems disclosed herein. In certain exemplary embodiments, molds can be injected with silicone to create silicone devices and/or systems in accordance with this disclosure.

Figure 2:
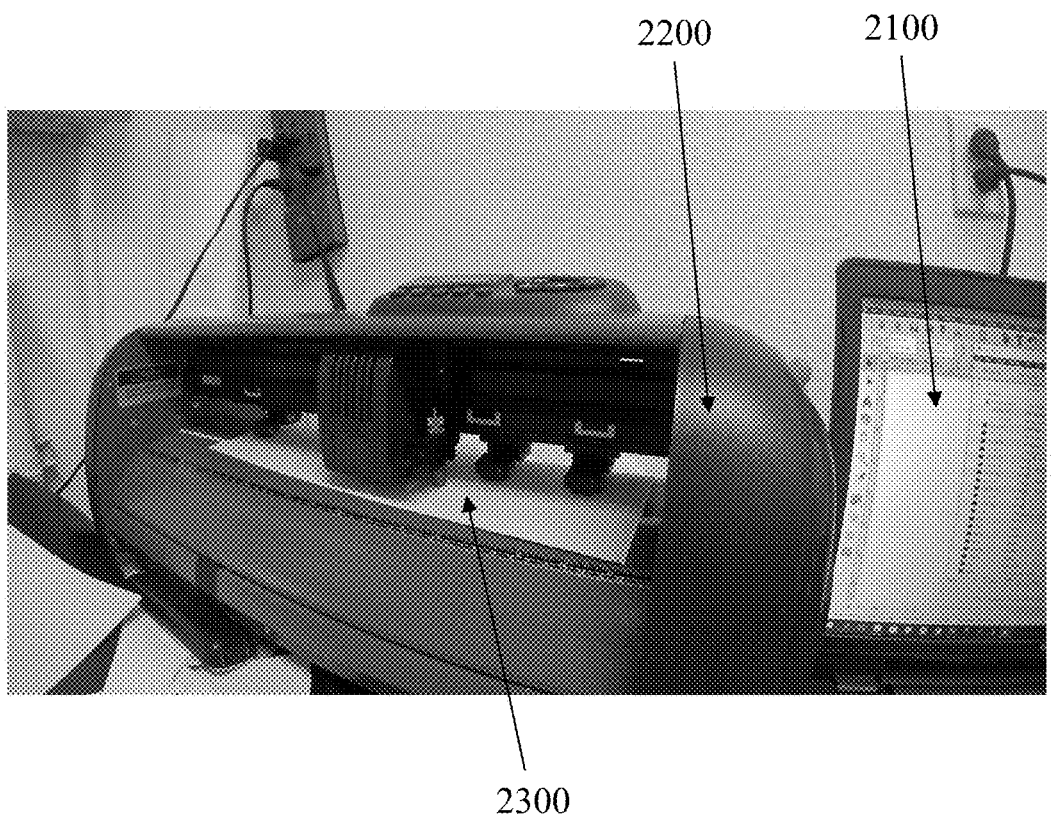

FIG. 2 is a photograph of a perspective view of an exemplary embodiment of a system 2000, which comprises an information device 2100 and a vinyl cutter plotter 2200. Via information device 2100 and vinyl cutter plotter 2200, a mask 2300 can be cut for use as a mask for defining patterns such as images and/or negative spaces for exemplary devices and/or systems.

Figure 3:
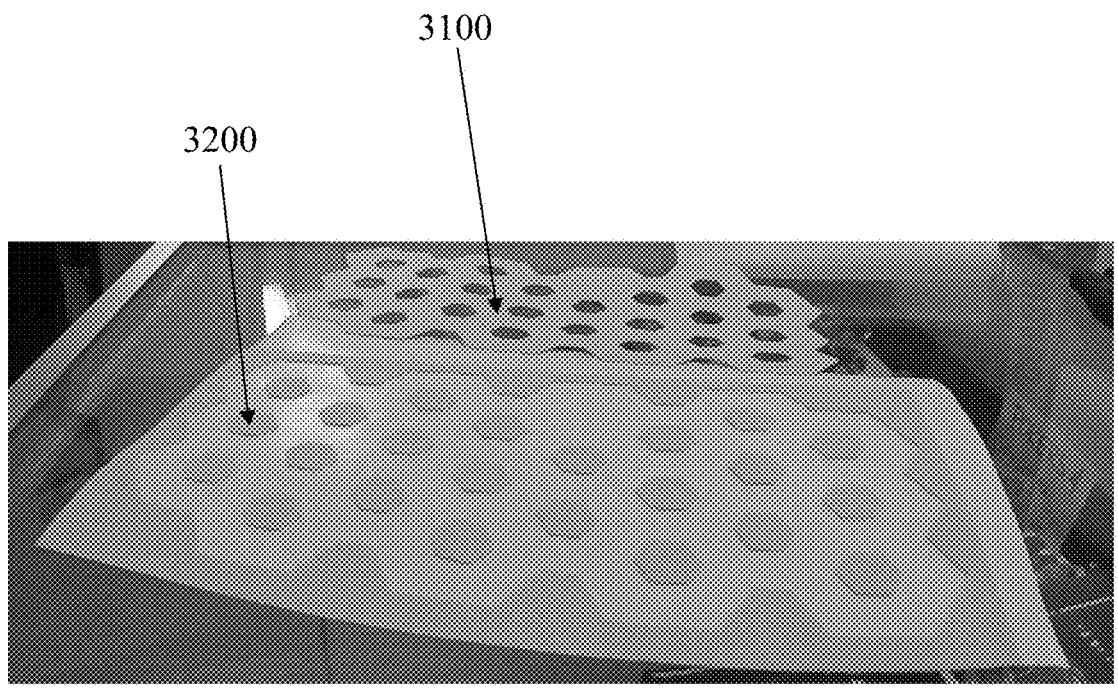

FIG. 3 is a photograph of a perspective view of an exemplary embodiment of a system 3000, which comprises a positive vinyl mask 3100 and a negative vinyl mask 3200. Either of positive vinyl mask 3100 or negative vinyl mask 3200 can be used as a mask for defining negative spaces for exemplary devices and/or systems.

Figure 4:
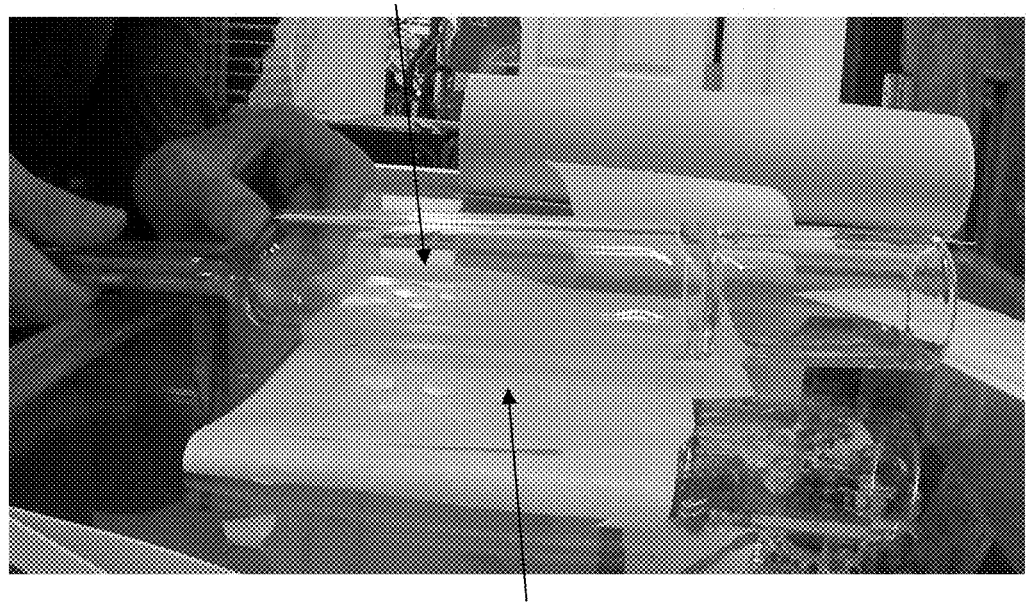

FIG. 4 is a photograph of a perspective view of an exemplary embodiment of a system 4000. System 4000 illustrates a beginning of application of a negative image 4100 to a glass body 4200 in preparation for cutting an image and/or pattern into glass body 4200.

Figure 5:

FIG. 5 is a photograph of a perspective view of an exemplary embodiment of a system 5000, which illustrates a body 5100 with a vinyl mask coupled thereto via adhesive. Body 5100 can be placed in an abrasive blasting machine 5200 (e.g., to be sandblasted) to cut glass from areas of body 5100 not covered by the vinyl mask. In certain exemplary embodiments, the vinyl mask is removed and the glass cleaned. In certain exemplary embodiments, the glass is pre-heated in a kiln.

Certain exemplary embodiments are fabricated with apertures that are created via a drill press (e.g., a water-fed core drill press).

Figure 6:
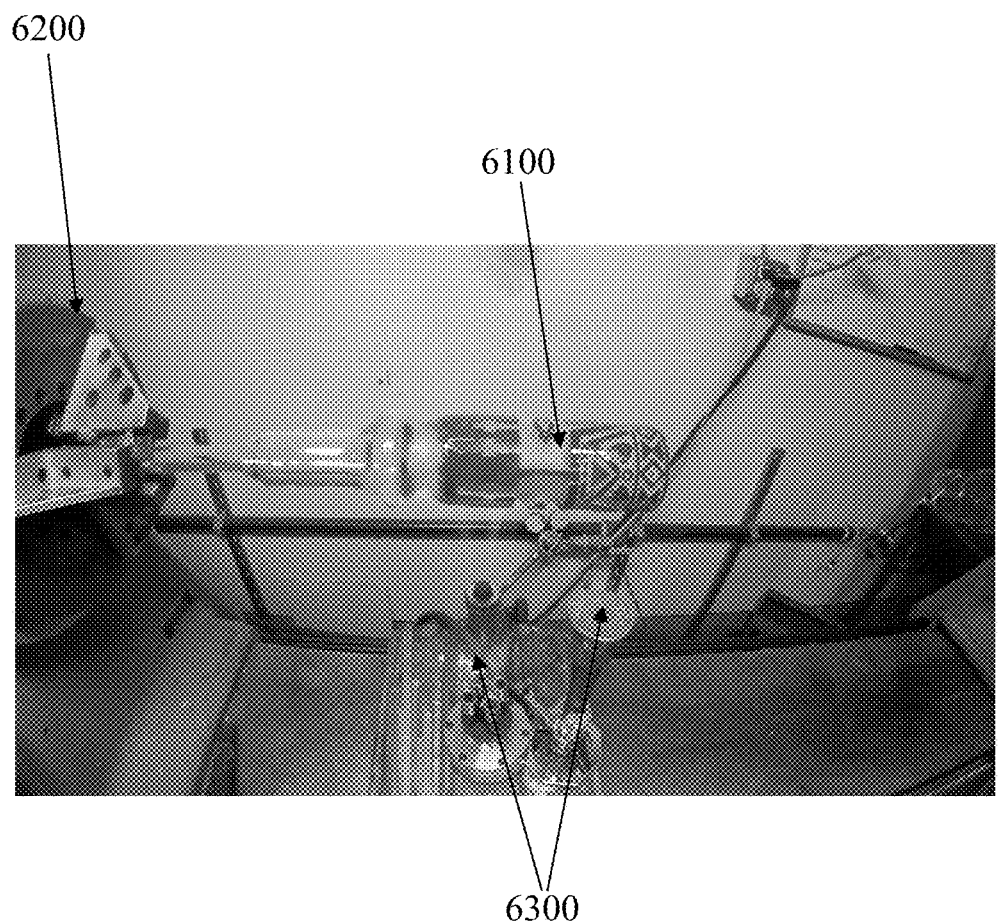

FIG. 6 is a photograph of a perspective view of an exemplary embodiment of a system 6000, which illustrates a body 6100 being turned on a lathe 6200. Body 6100 has had material cut therefrom to define an image or other negative space. System 6000 comprises a plurality of burners 6300, which are positioned to heat body 6100 to a substantially uniform temperature. Via system 6000, body 6100 can be processed to fabricate an exemplary device and/or system disclosed herein.

Figure 7:
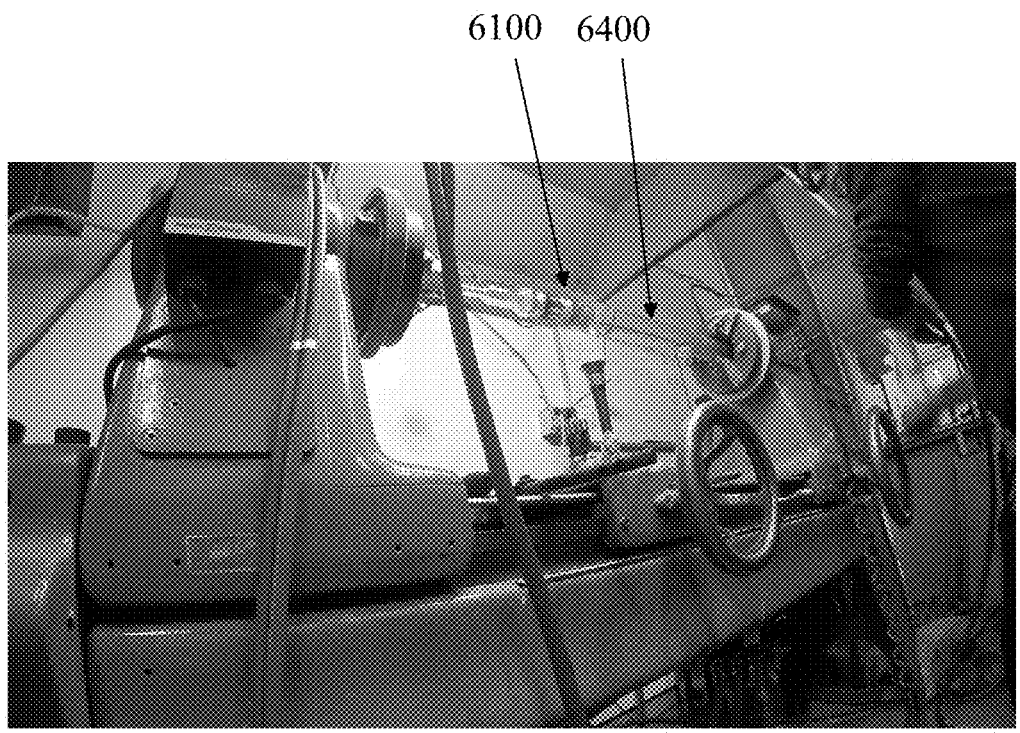

FIG. 7 is a photograph of a different perspective view of exemplary system 6000, which illustrates raw glass vessel 6400 being moved towards body 6100, relative to the positioning illustrated in FIG. 6, such that additional motion causes positioning of raw glass vessel 6400 to substantially surround a portion of body 6100. Consistent gentle inner pressure is maintained by the operator via a blow hose 6700.

Figure 8:
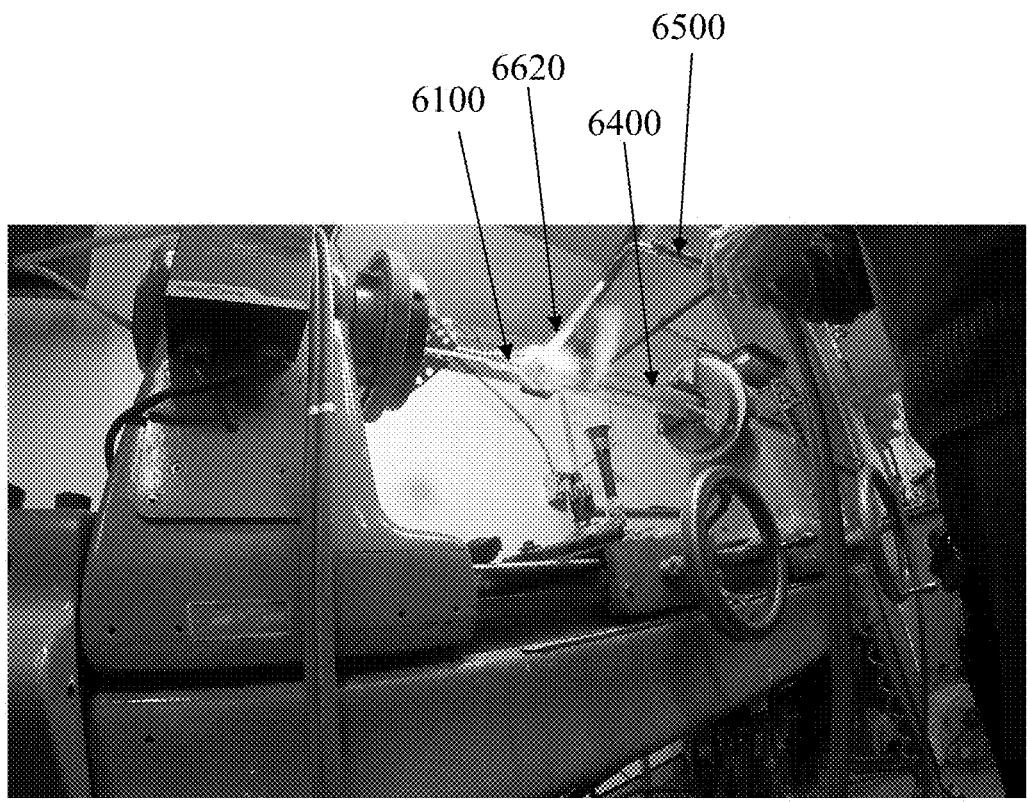

FIG. 8 is a photograph of a different perspective view of exemplary system 6000, which illustrates raw glass vessel 6400 substantially surrounding a portion of body 6100 relative to the positioning illustrated in FIG. 6. FIG. 8 shows additional heat being applied to raw glass vessel 6400 and body 6100 via a first torch 6500. Via first torch 6500 and a graphite paddle 6620, raw glass vessel 6400 can be shaped to substantially conform to a shape of body 6100.

Figure 9:
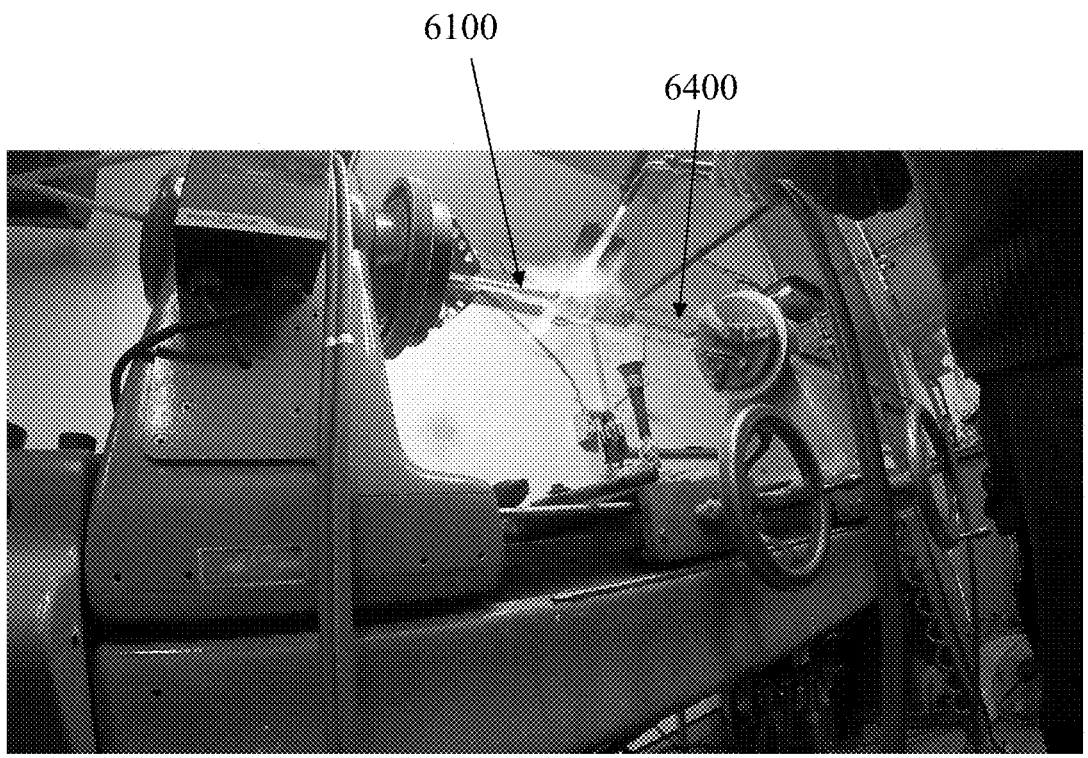

FIG. 9 is a photograph of a different perspective view of exemplary system 6000, which illustrates raw glass vessel 6400 having been processed such that its end shape substantially conforms to the shape of body 6100.

Figure 10:
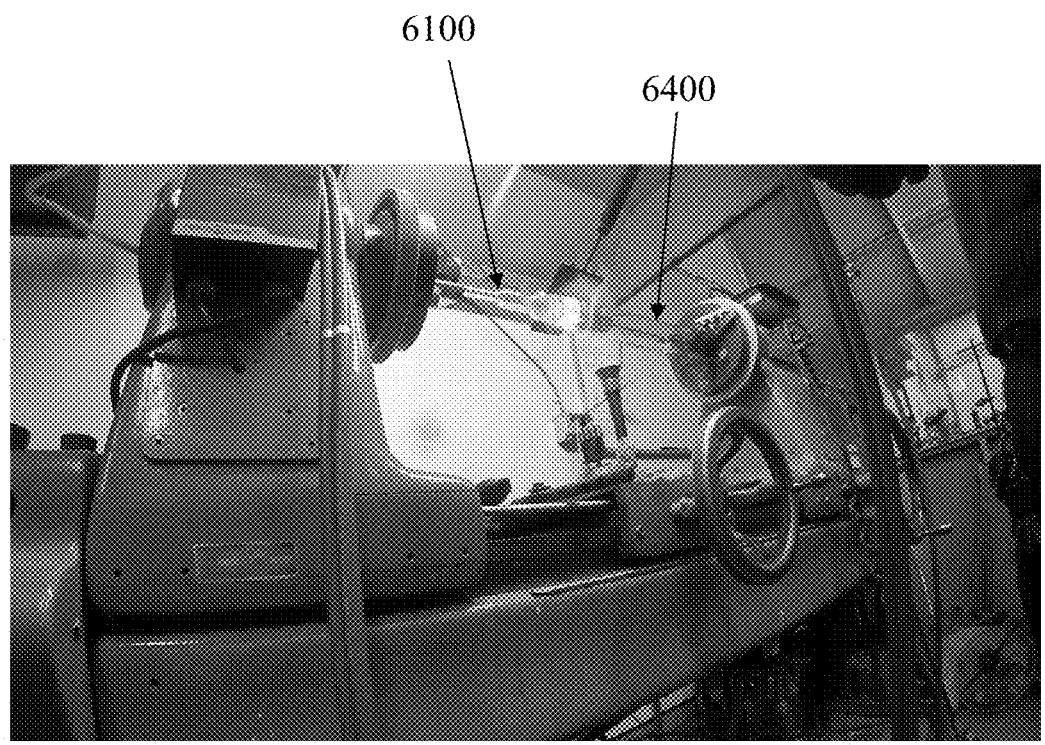

FIG. 10 is a photograph of a different perspective view of exemplary system 6000, which illustrates another view of raw glass vessel 6400 having been processed such that its end shape substantially conforms to the shape of body 6100.

Figure 11:
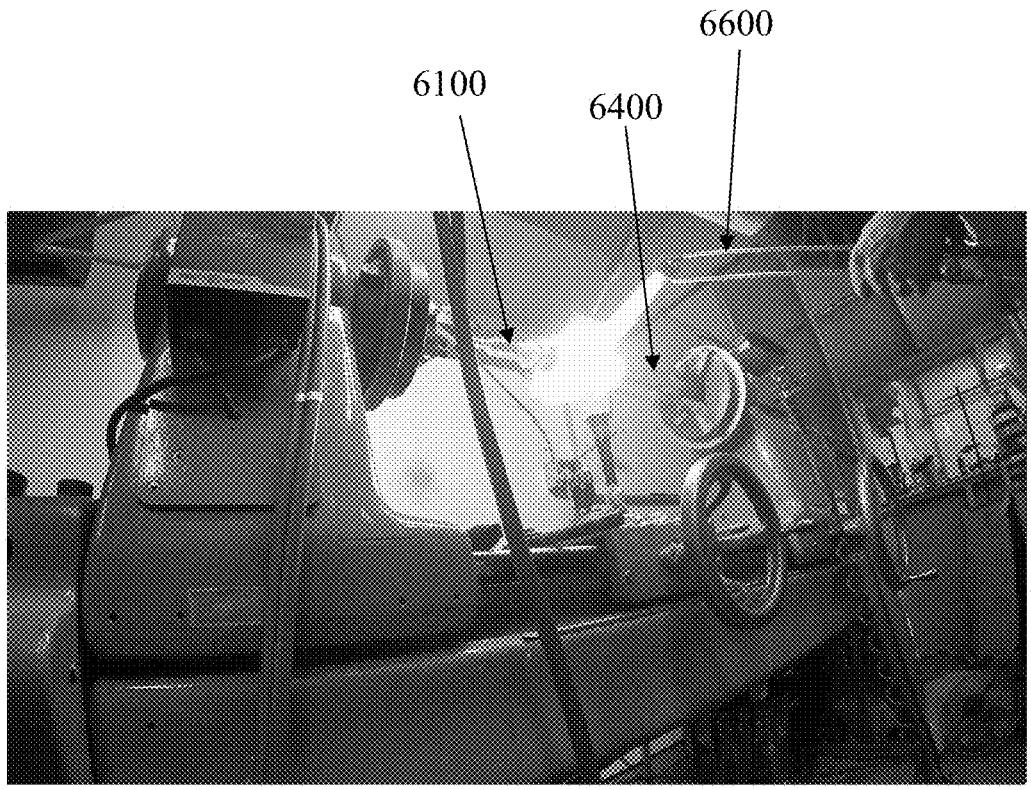

FIG. 11 is a photograph of a perspective view of exemplary system 11000, which illustrates a second torch 6600 being used to further define a shape of raw glass vessel 6400 to a final vessel shape. Second torch 6600 applies a higher level of heat energy than first torch 6500 as illustrated in FIG. 8. This allows both layers to fully fuse, relieving stress in the glass.

Figure 12:
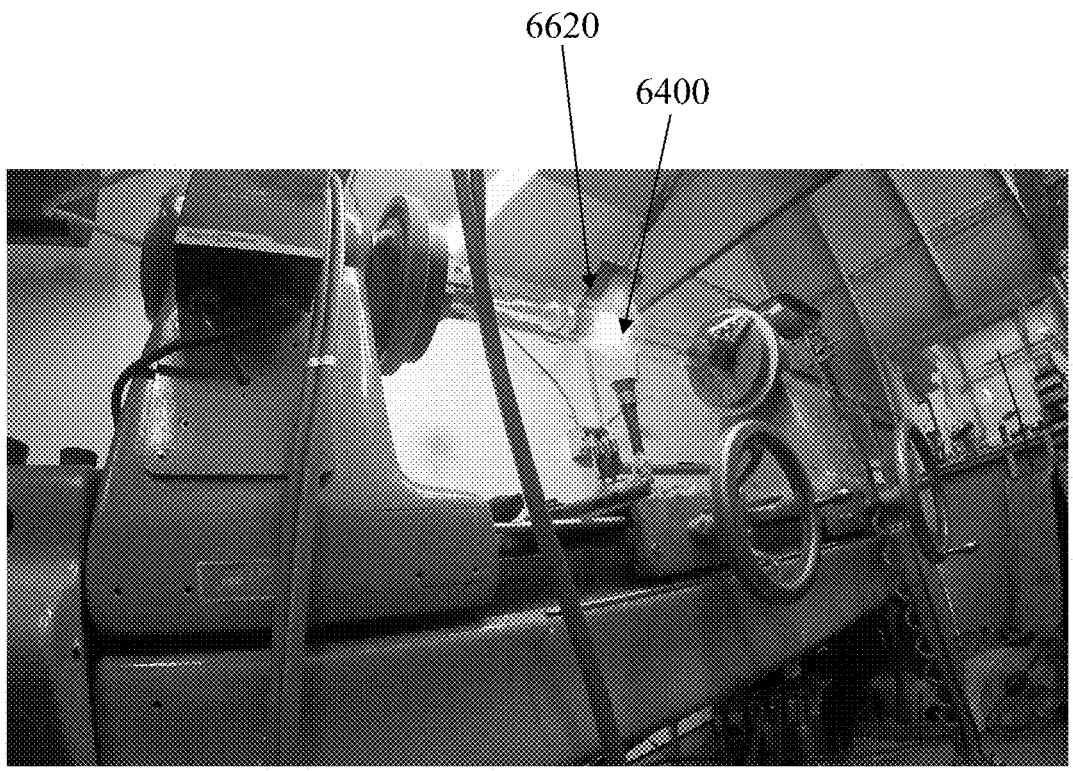

FIG. 12 is a photograph of an exemplary embodiment of a system 12000, which illustrates graphite paddle 6620 being used to further shape raw glass vessel 6400.

Figure 13:
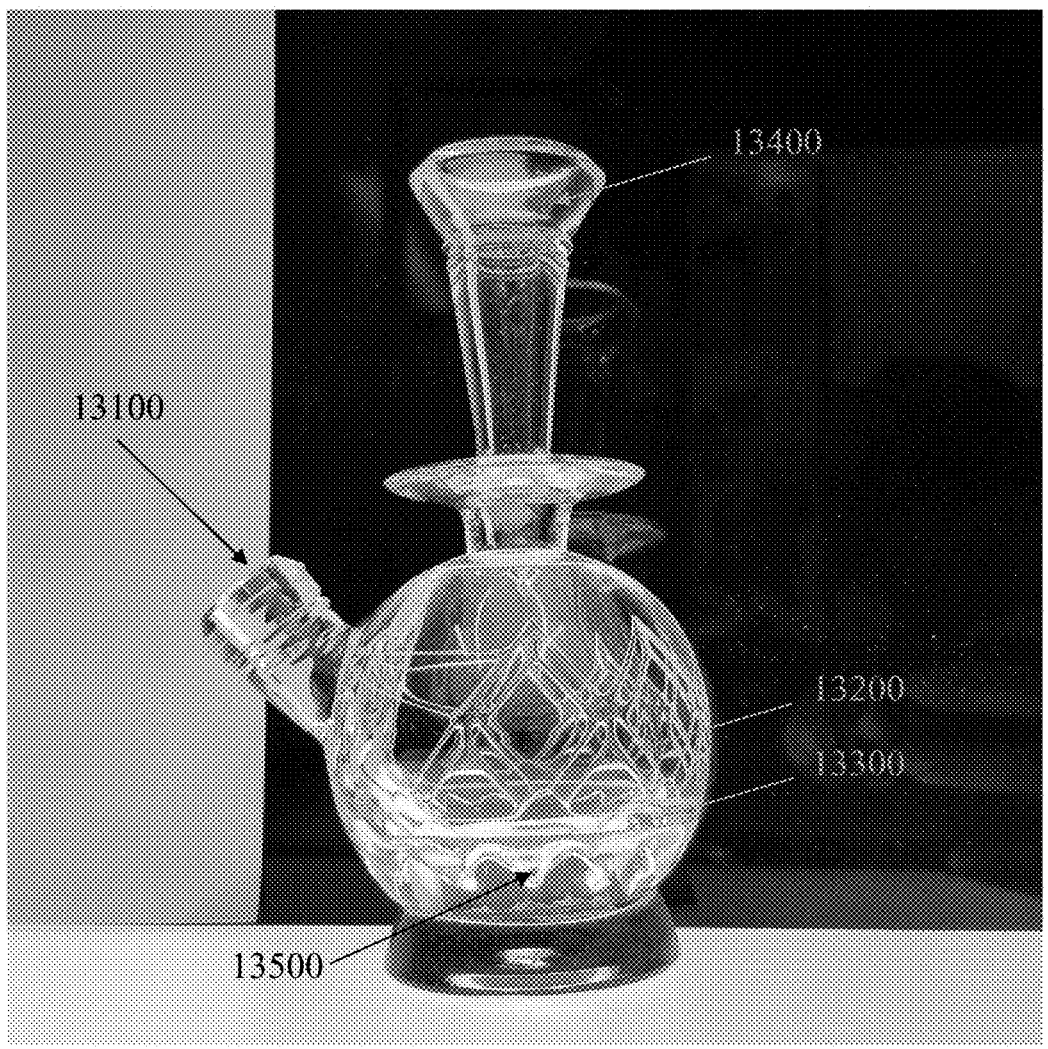

FIG. 13 is a photograph of a perspective view of an exemplary embodiment of a ball fluid pipe 13000, which comprises a smoke inlet 13100, negative space relief channels 13200, a fluid reservoir 13300, a smoke outlet 13400, and an aperture 13500.

Figure 13B:
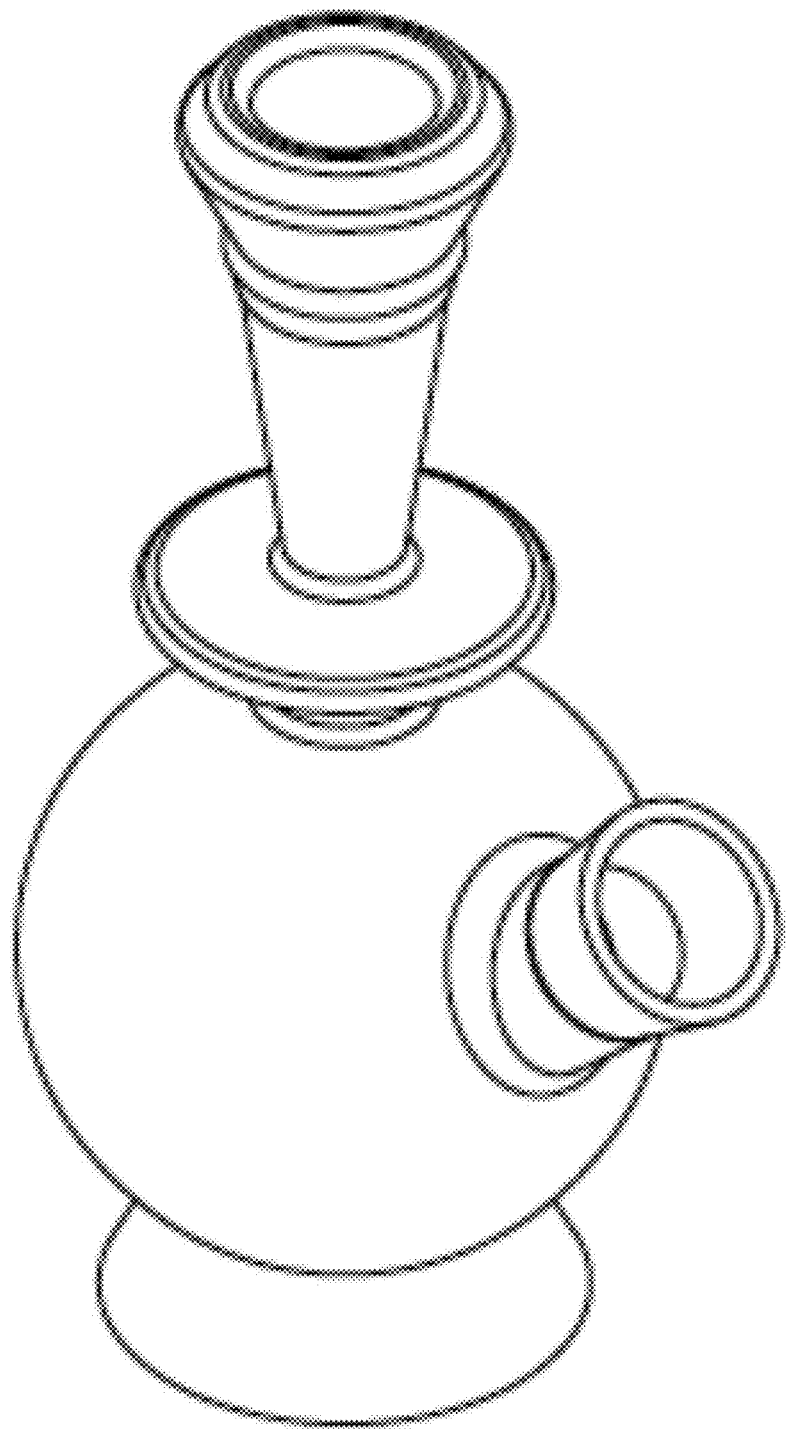
FIG. 13B is a diagram of a perspective view of an exemplary embodiment of a ball fluid pipe 13600.

FIG. 13B is a diagram of a perspective view of an exemplary embodiment of a ball fluid pipe 13600.

Figure 13C:
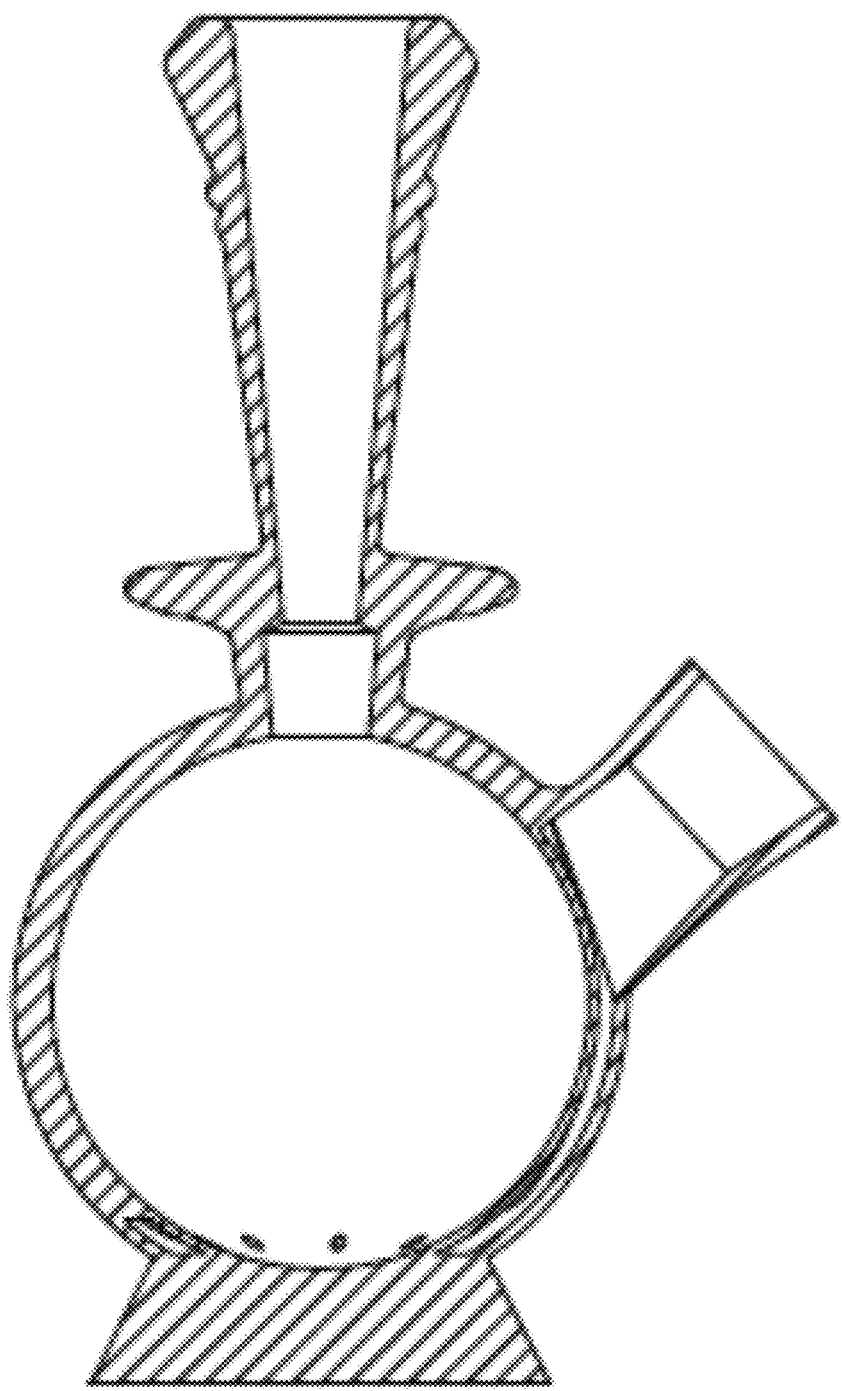
FIG. 13C is a diagram of a cross-sectional side view of an exemplary embodiment of a ball fluid pipe 13700.

FIG. 13C is a diagram of a cross-sectional side view of an exemplary embodiment of a ball fluid pipe 13700.

Figure 13D:
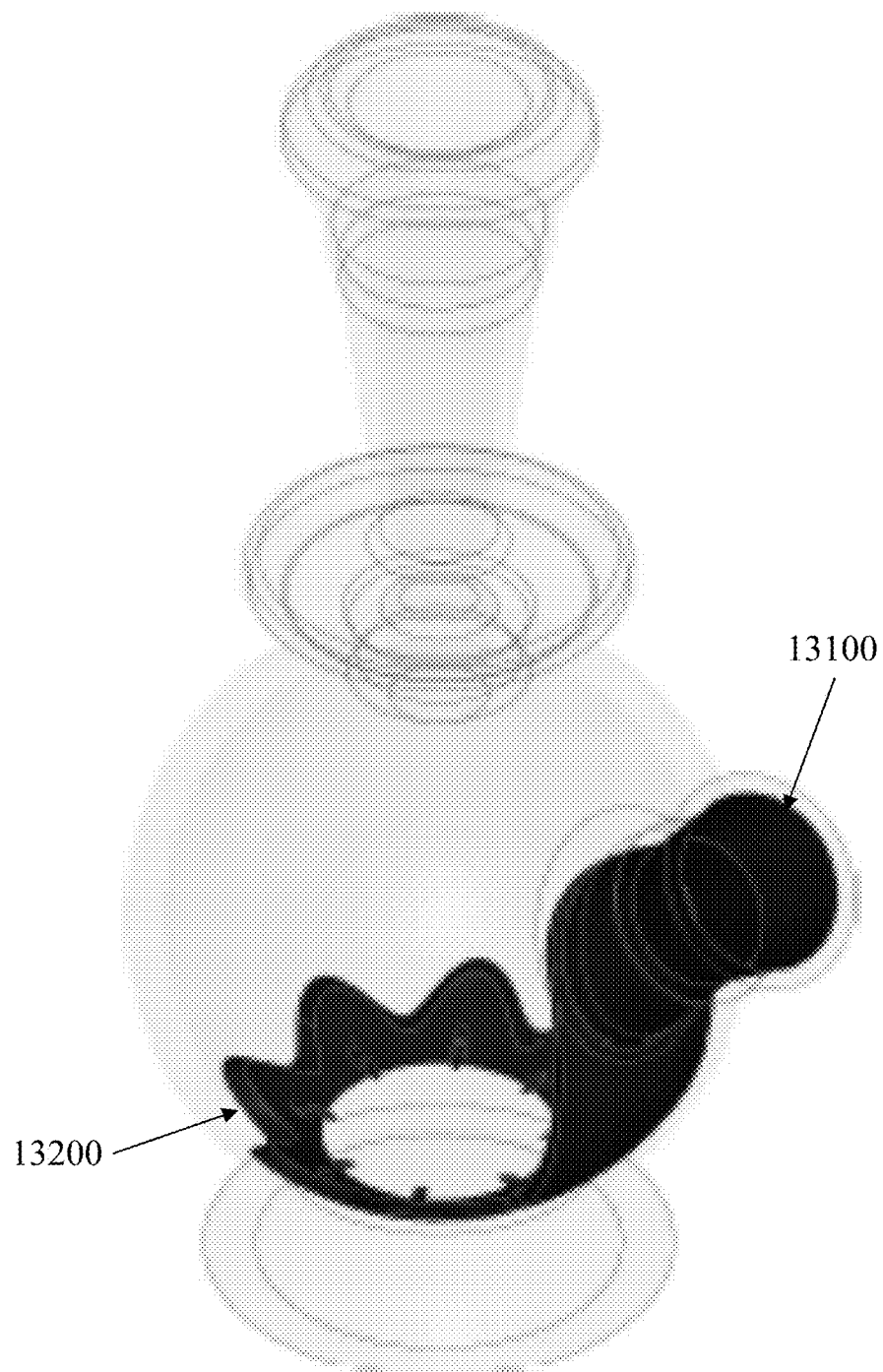

FIG. 13D is a diagram of a perspective view of an exemplary embodiment of a ball fluid pipe 13800 with fluid pipe showing negative space relief passages. The blue colored section illustrates the initial pathway of smoke entering ball fluid pipe 13800. Smoke passes from smoke inlet 13100 through negative space relief channels 13200.

Figure 14:
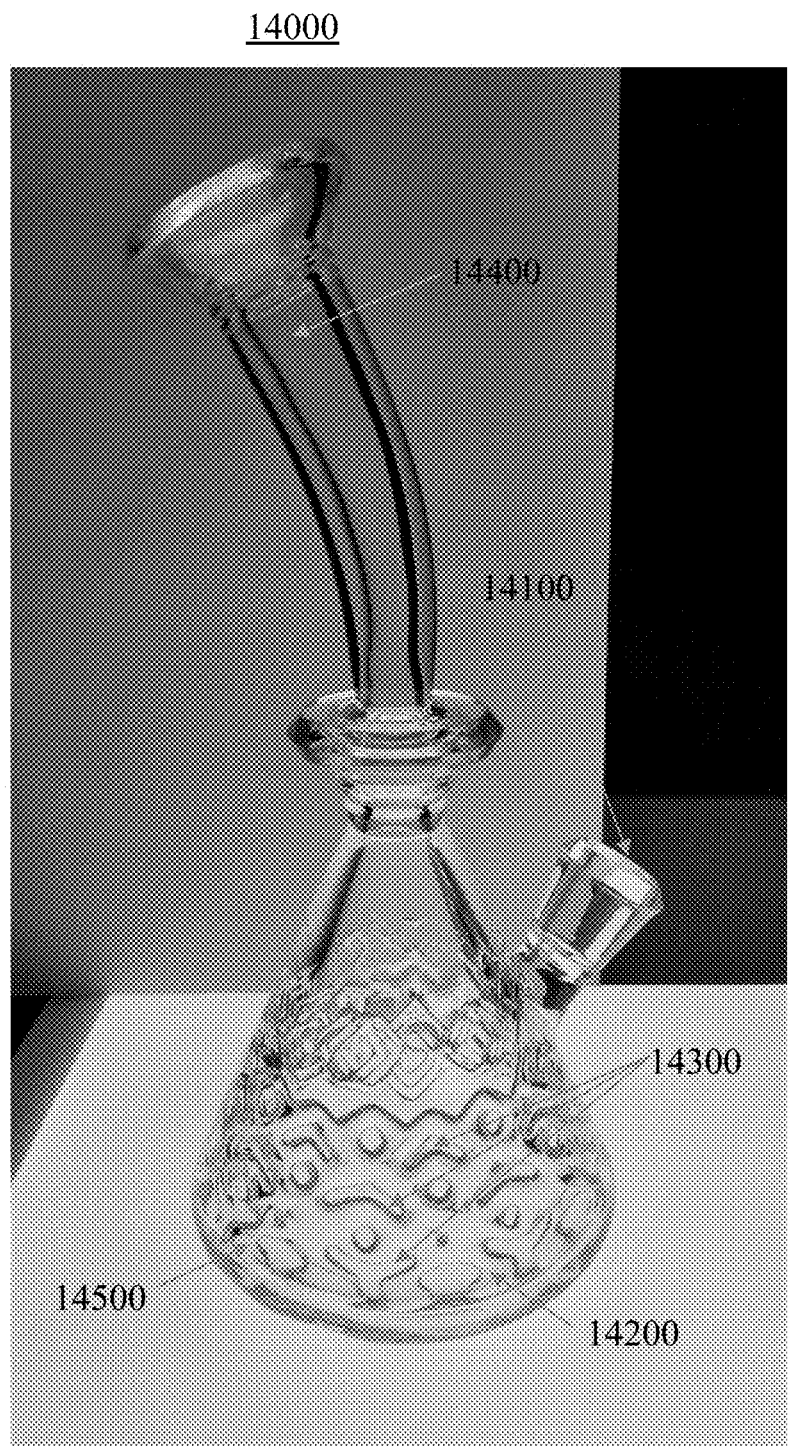

FIG. 14 is a photograph of a perspective view of an exemplary embodiment of a fluid pipe 14000, which is fabricated in accordance with one or more methods disclosed herein. A smokable material, such as tobacco and/or one or more other herbal substances, etc. is placed in a receptacle (not illustrated) coupled to an inlet fitting 14100 of fluid pipe 14000. Fluid pipe 14000 comprises a reservoir 14200, which acts to house a liquid (e.g., water). Smoke, gas, and/or vapor is circulated via passageways defined by image 14300 through image 14300 and out one or more apertures 14500 for delivery to the liquid. After passing through the liquid, filtered smoke, gas, and/or vapor passes through port 14400 for inhalation by a user. One or more parts of fluid pipe 14000 can have been shaped after encasement into desired form via a torch, a lathe, a paddle, and/or air pressure (e.g. from a beaker).

Figure 14B:
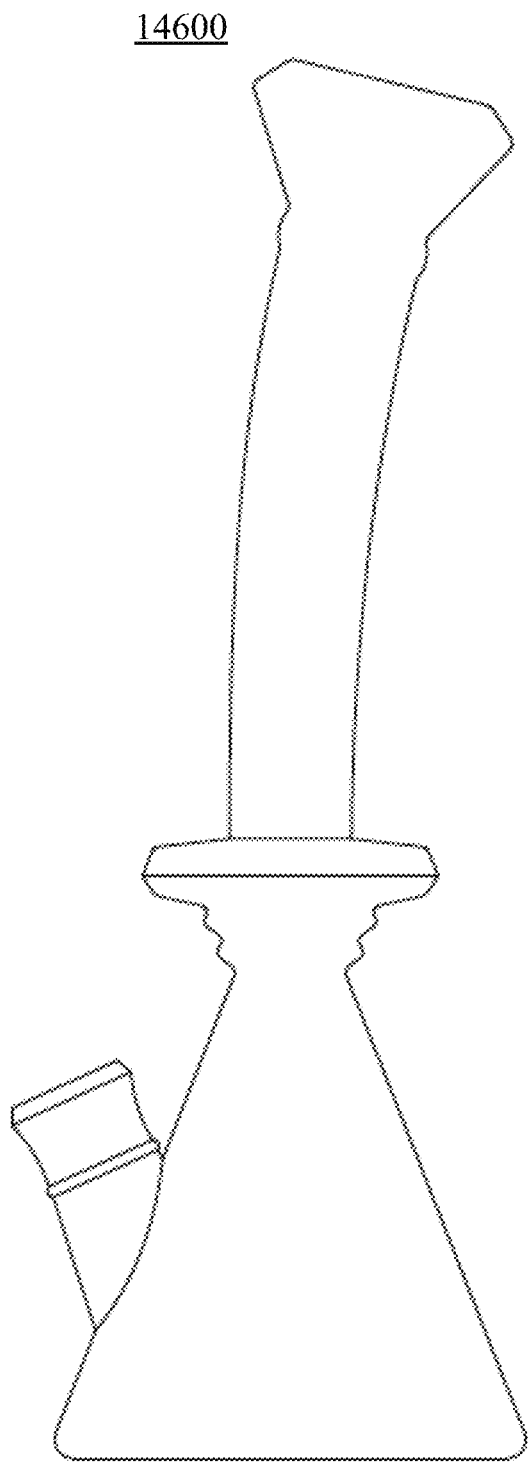
FIG. 14B is a side view of an exemplary embodiment of a fluid pipe 14600.

FIG. 14B is a side view of an exemplary embodiment of a fluid pipe 14600.

Figure 14C:
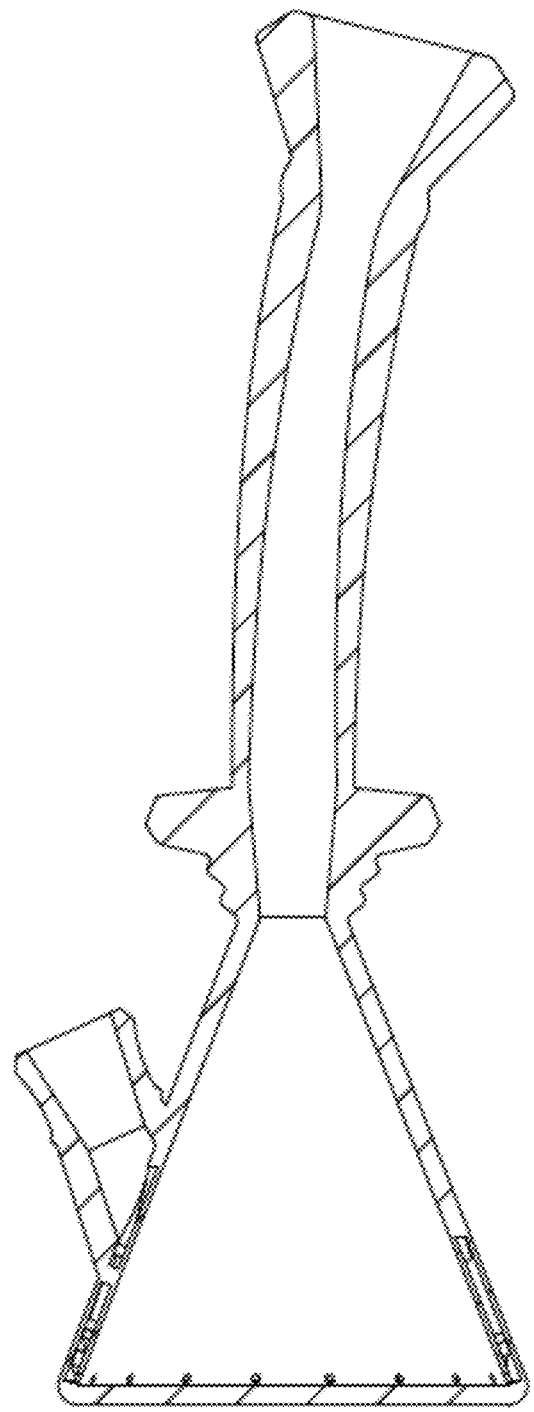
FIG. 14C is a cross-sectional side view of an exemplary embodiment of a fluid pipe 14700.

FIG. 14C is a cross-sectional side view of an exemplary embodiment of a fluid pipe 14700.

Figure 14D:
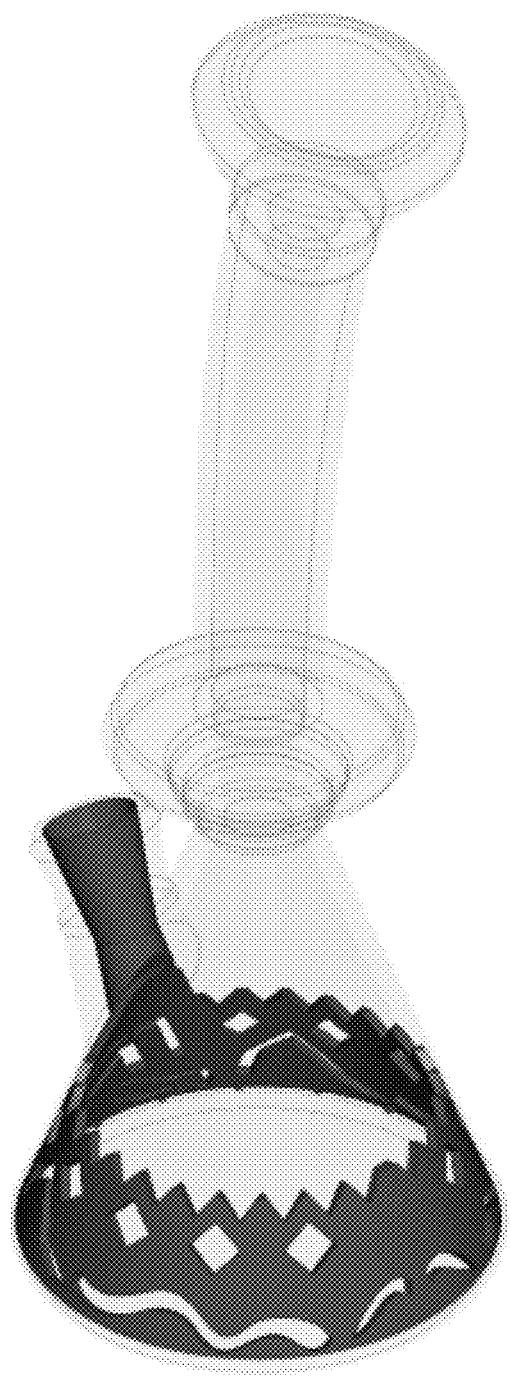

FIG. 14D is a perspective view of an exemplary embodiment of a fluid pipe 14800 showing negative relief passages through walls.

Figure 14E:
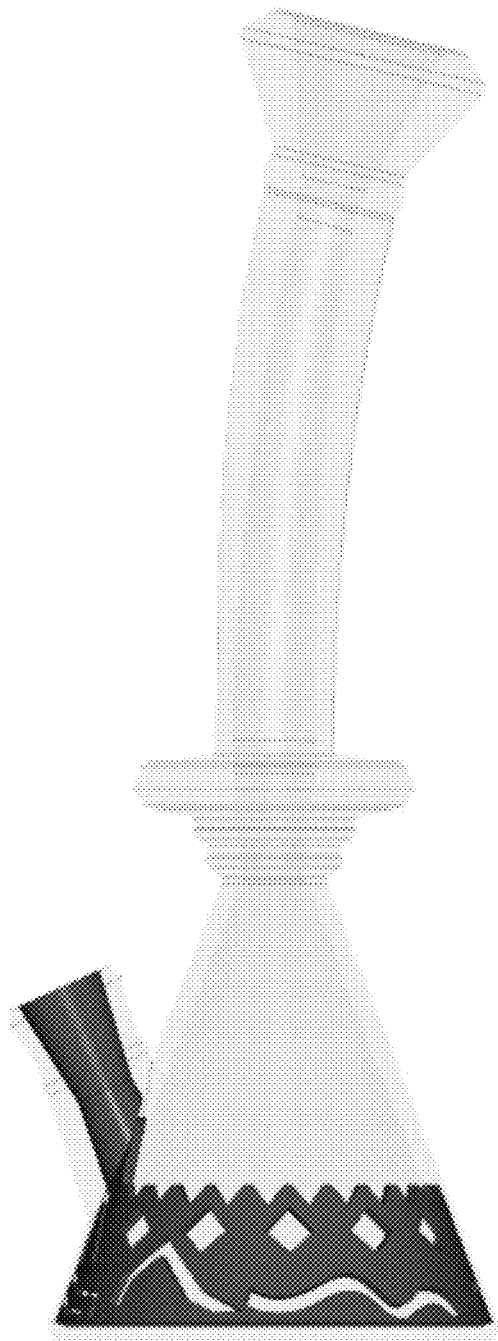

FIG. 14E is a side view of an exemplary embodiment of a fluid pipe 14900 showing negative relief passages through walls.

Figure 15:
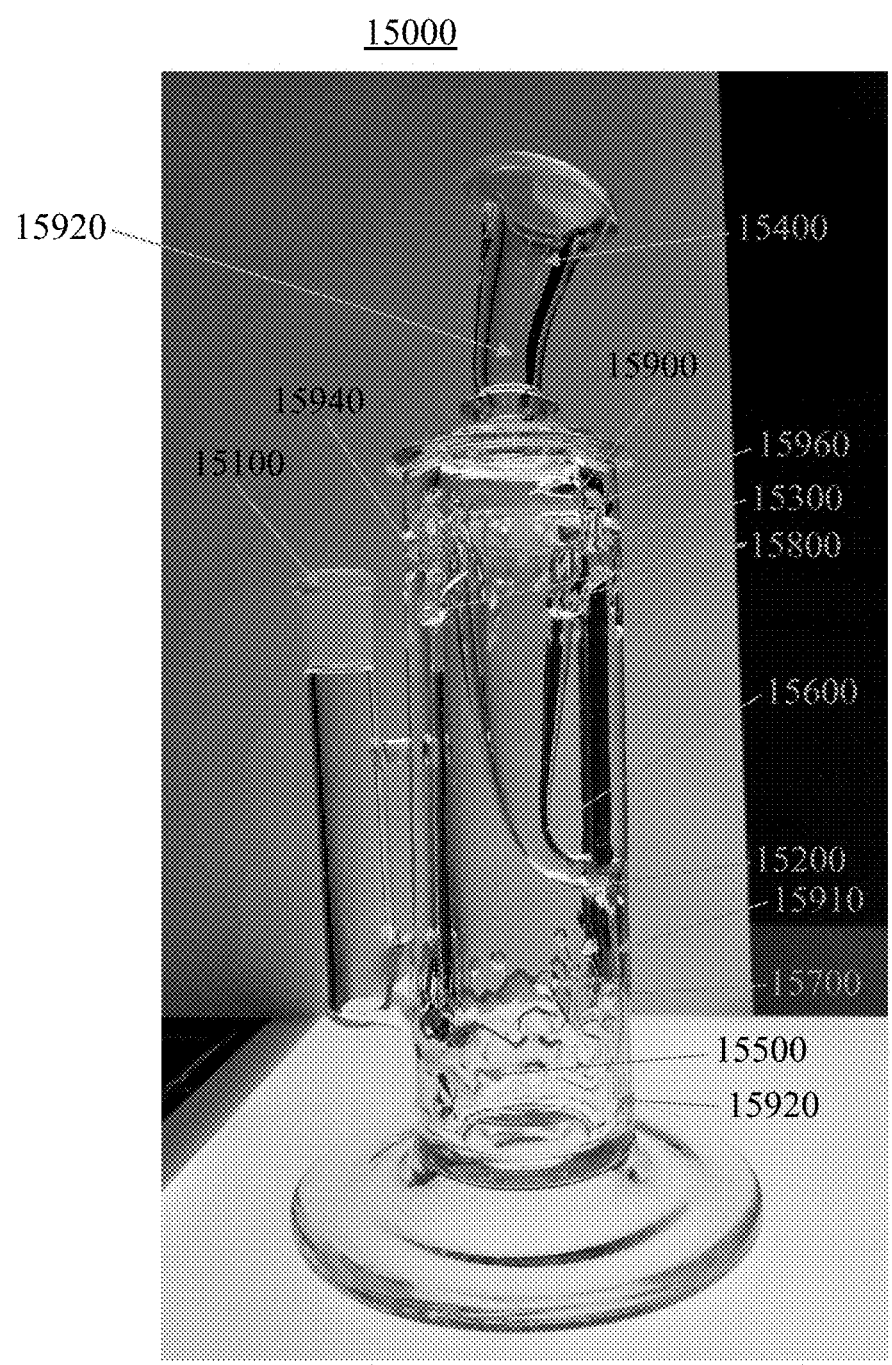

FIG. 15 is a photograph of a perspective view of an exemplary embodiment of a fluid pipe 15000, which is fabricated in accordance with one or more methods disclosed herein. A smokable material, such as tobacco, and/or one or more other herbal substances, etc. is placed in a receptacle (not illustrated) coupled to a smoke inlet 15100 of fluid pipe 15000. Fluid pipe 15000 comprises a reservoir 15200, which acts to house a liquid (e.g., water) that recirculates through fluid pipe 15000. Smoke, gas, and/or vapor is circulated via passageways defined by first image 15700 and out one or more lower apertures 15500 for delivery to the liquid in reservoir 15200. One or more upper entrance apertures 15800 direct water mixed with the smoke, gas, and/or vapor via a second image 15300 into a tube 15600. Fluid pipe 15000 comprises a divider 15940. Upper exit apertures 15960 cause the water to vortex in a funnel 15900, which results in separation of the smoke, gas, and/or vapor from the liquid. Separated water flows via funnel 15900 and recirculates to first reservoir 15200 via tube 15600 into cut image 15910 through aperture 15920. Filtered smoke, gas, and/or vapor passes through port 15400 and is inhaled by a user.

Figure 15B:
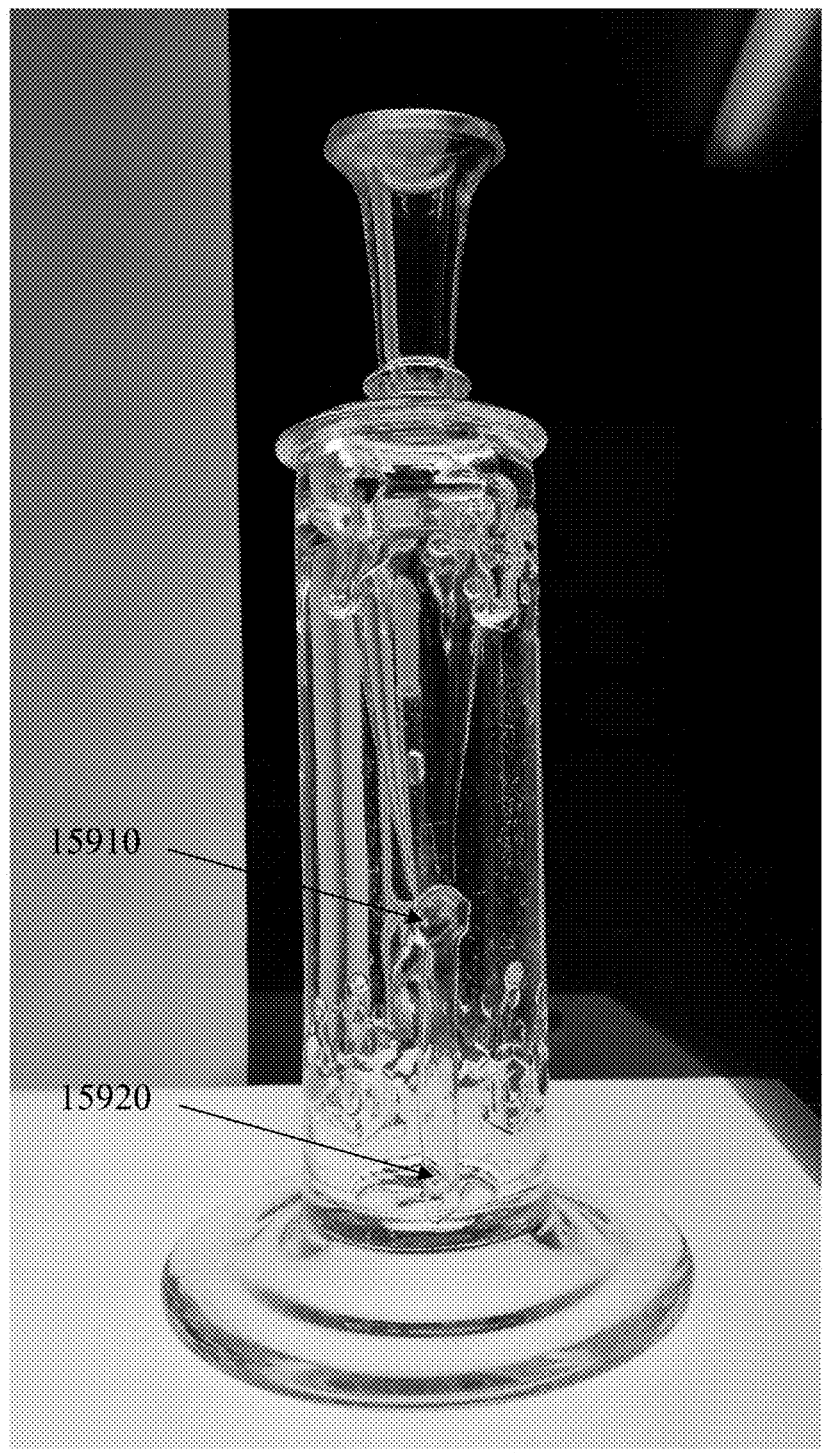
FIG. 15B is a photograph of a perspective view of exemplary fluid pipe 15000.

FIG. 15B is a photograph of a perspective view of exemplary fluid pipe 15000, which defines aperture 15920 and image 15910.

Figure 15C:
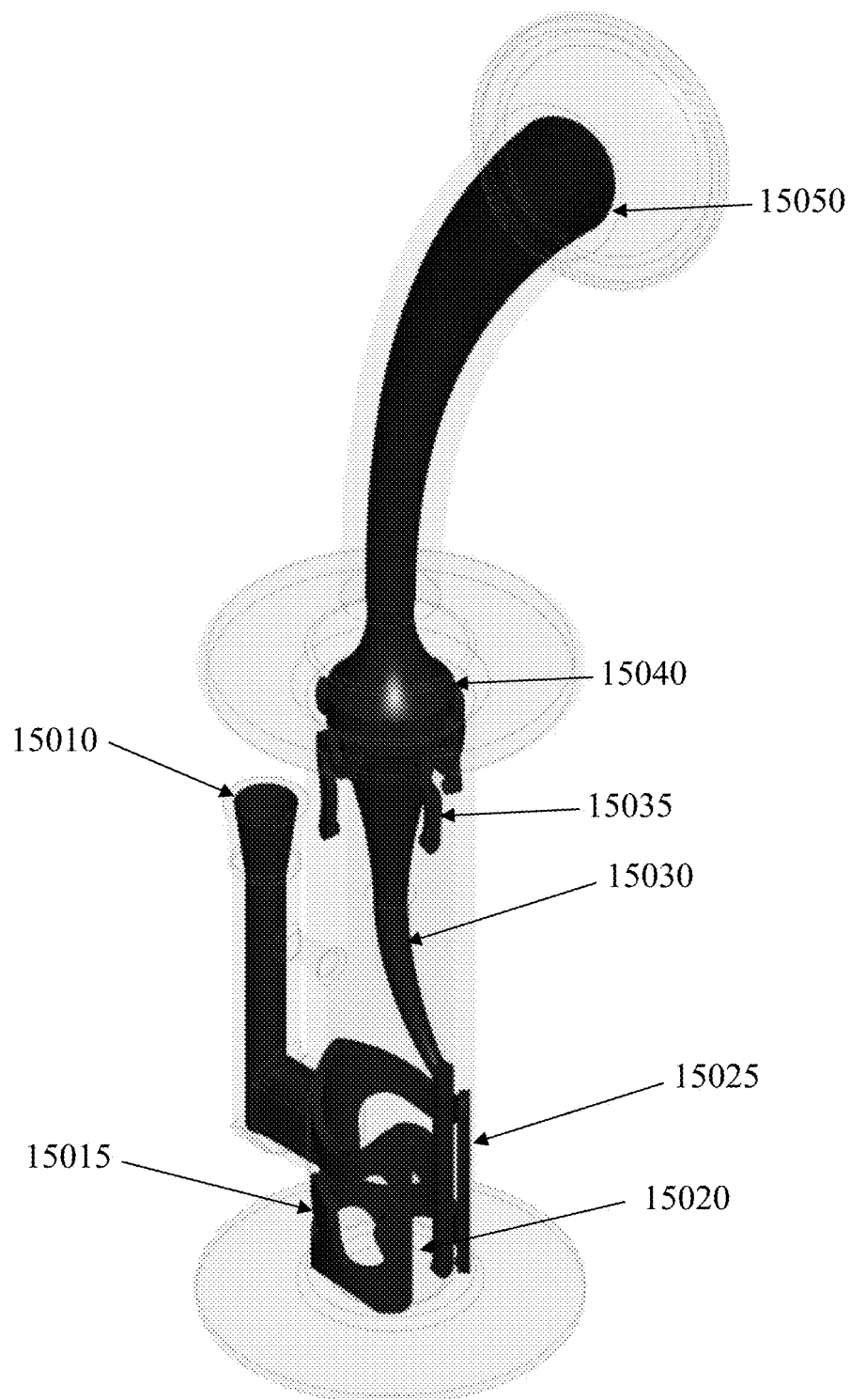

FIG. 15C is a diagram of a perspective view of exemplary fluid pipe 15001 showing negative space relief passages, which utilizes fluid recirculation. The blue colored section illustrates the pathway of smoke in fluid pipe 15001. Smoke passes from smoke inlet 15010 through a first set of negative space relief channels 15015 and into first reservoir 15020. Smoke passes through a second set of negative space relief channels 15025 to a tube section 15030, then to third set of negative space relief channels 15035 and into second reservoir 15040. Smoke then passes to outlet 15050.

Figure 15D:
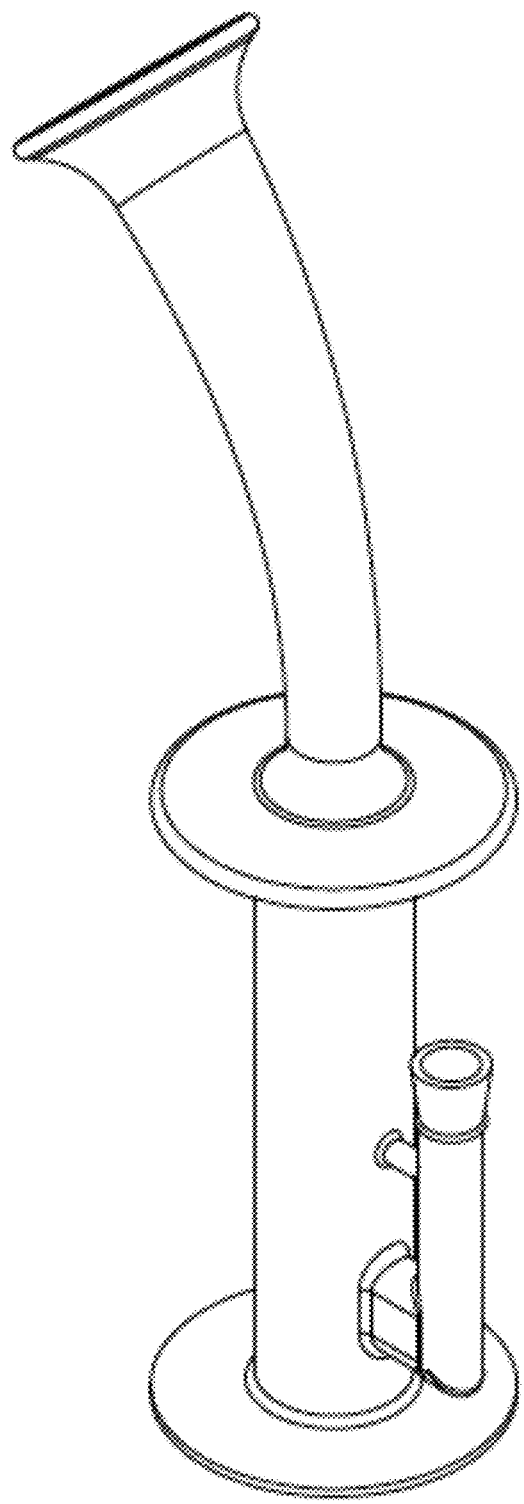
FIG. 15D is a diagram of a perspective view of exemplary fluid pipe 15001.

FIG. 15D is a diagram of exemplary fluid pipe 15001.

Figure 15E:
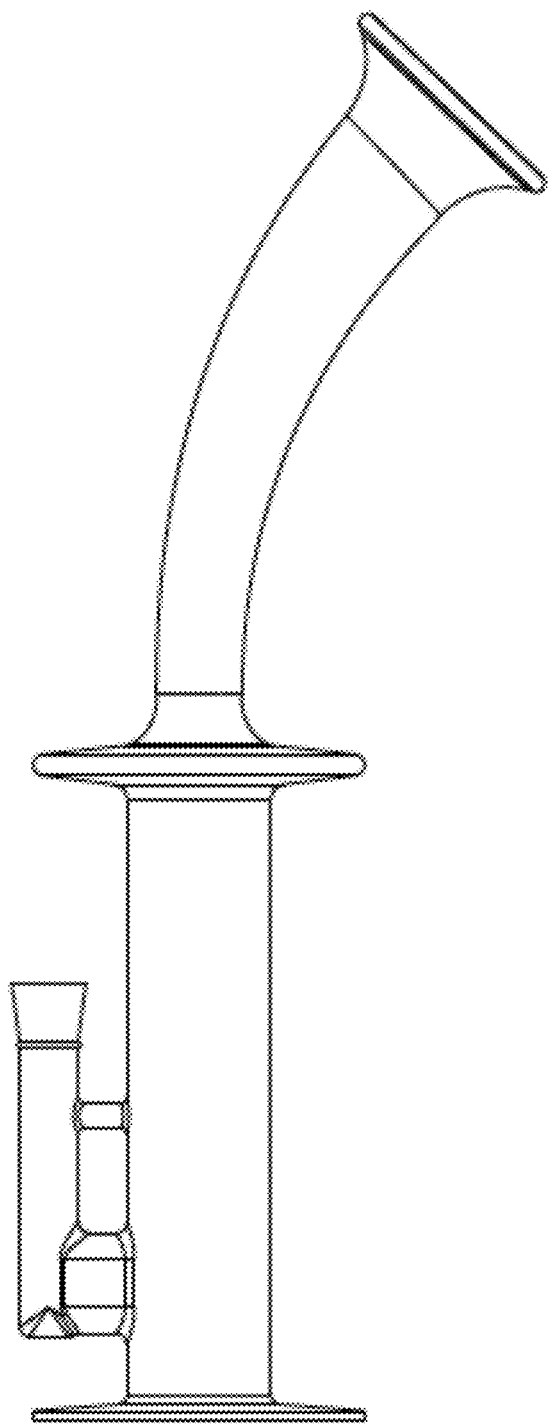
FIG. 15E is a diagram of a side view of exemplary fluid pipe 15001.

FIG. 15E is a diagram of exemplary fluid pipe 15001.

Figure 15F:
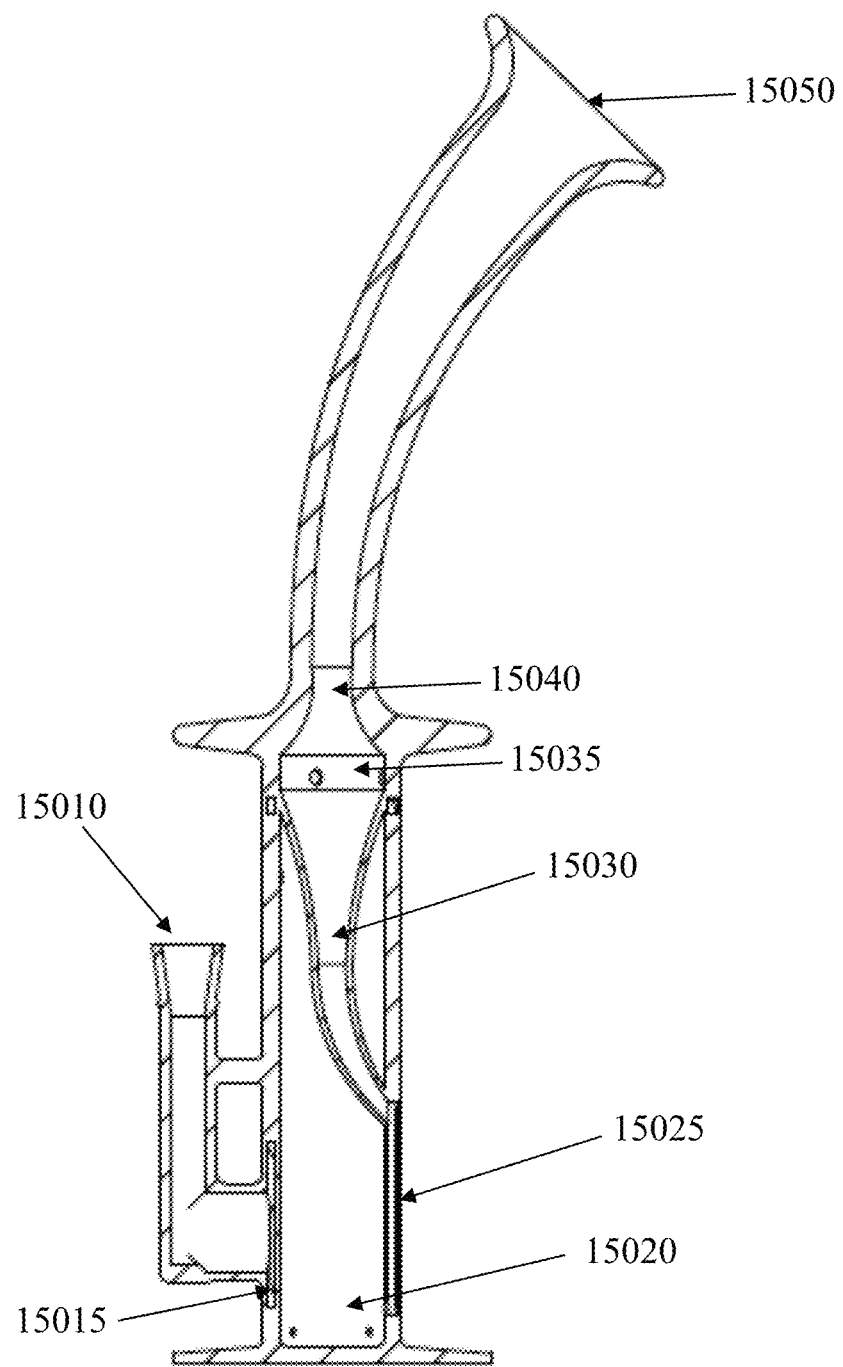
FIG. 15F is a diagram of a cross-sectional side view of exemplary fluid pipe 15001.

FIG. 15F is a diagram of exemplary fluid pipe 15001. Smoke passes from smoke inlet 15010 through a first set of negative space relief channels 15015 and into first reservoir 15020. Smoke passes through a second set of negative space relief channels 15025 to a tube section 15030, then to third set of negative space relief channels 15035 and into second reservoir 15040. Smoke then passes to outlet 15050.

Figure 15G:
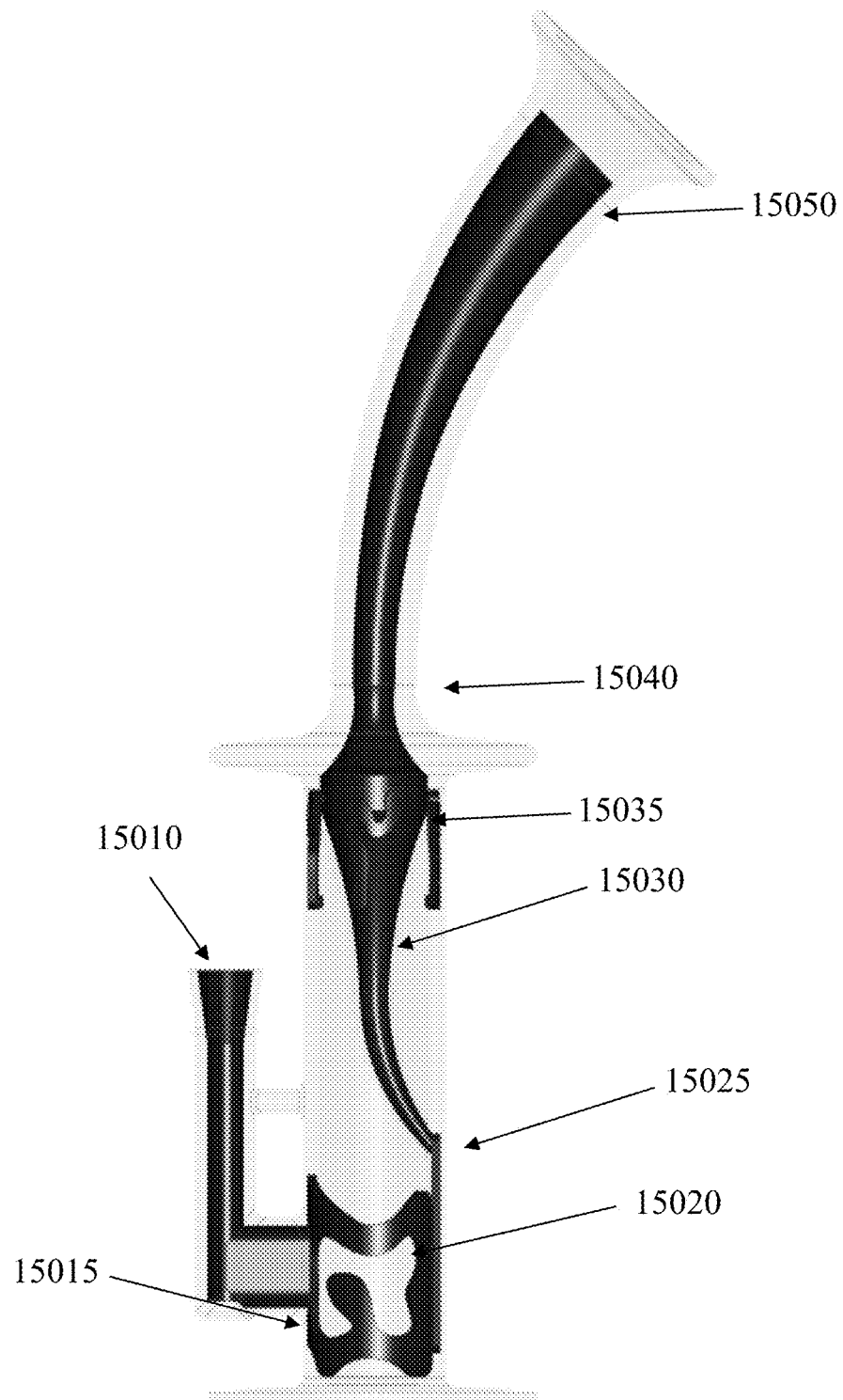

FIG. 15G is a diagram of exemplary fluid pipe 15001 showing negative space relief passages. Smoke passes from smoke inlet 15010 through a first set of negative space relief channels 15015 and into first reservoir 15020. Smoke passes through a second set of negative space relief channels 15025 to a tube section 15030, then to third set of negative space relief channels 15035 and into second reservoir 15040. Smoke then passes to outlet 15050.

Figure 16:
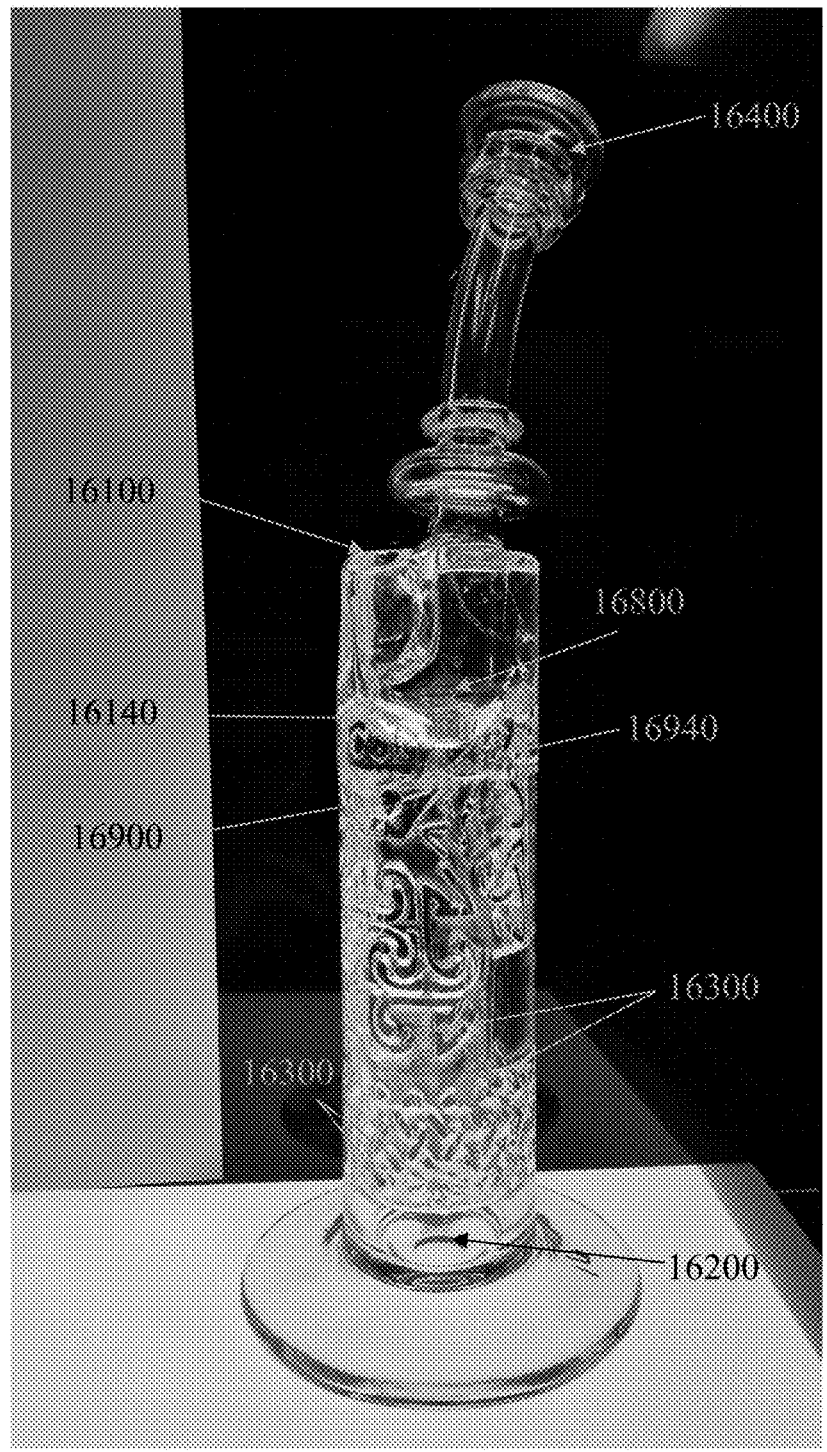

FIG. 16 is a photograph of a perspective view of an exemplary embodiment of a fluid pipe 16000, which is substantially self-contained within a single cylinder without side protrusions or tubes. A smokable material, such as tobacco, and/or one or more other herbal substances, etc. is placed in a receptacle (not illustrated) coupled to an inlet pouch 16100 of fluid pipe 16000. Smoke is conveyed to a first reservoir 16200 via a first image 16140. First reservoir 16200 acts to house a liquid (e.g., water) that recirculates through fluid pipe 16000. As a user inhales via port 16400, water mixed with the smoke, gas, and/or vapor is drawn into a second reservoir 16800 via a second image 16300 in which the fluid and gas thoroughly mix, percolating throughout second image 16300 before delivery. Second reservoir 16800 is separated from first reservoir 16120 by a divider 16940. The smoke, gas, and/or vapor is separated from the water in second reservoir 16800 with the smoke drawn to the user through port 16400. When the user ceases to draw through port 16400, the water flows via gravity back to first reservoir 16200 via an aperture 16900 and second image 16300.

Figure 16B:
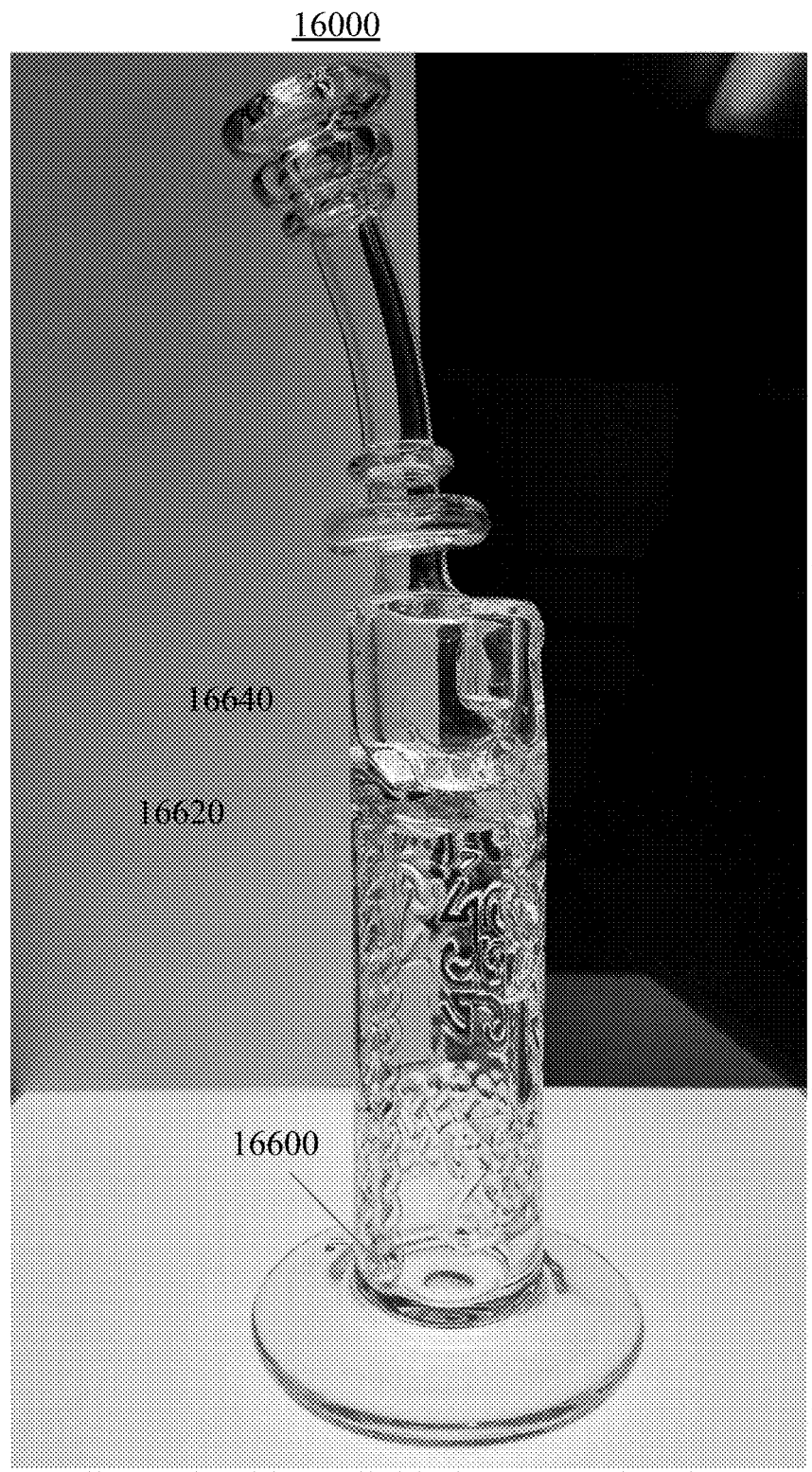

FIG. 16B is a photograph of a perspective view of exemplary fluid pipe 16000, which illustrates an aperture for water return 16600, an aperture into wall for drain 16620, and a channel through membrane 16640 via an aperture (not illustrated) located near a top membrane center.

Figure 17:
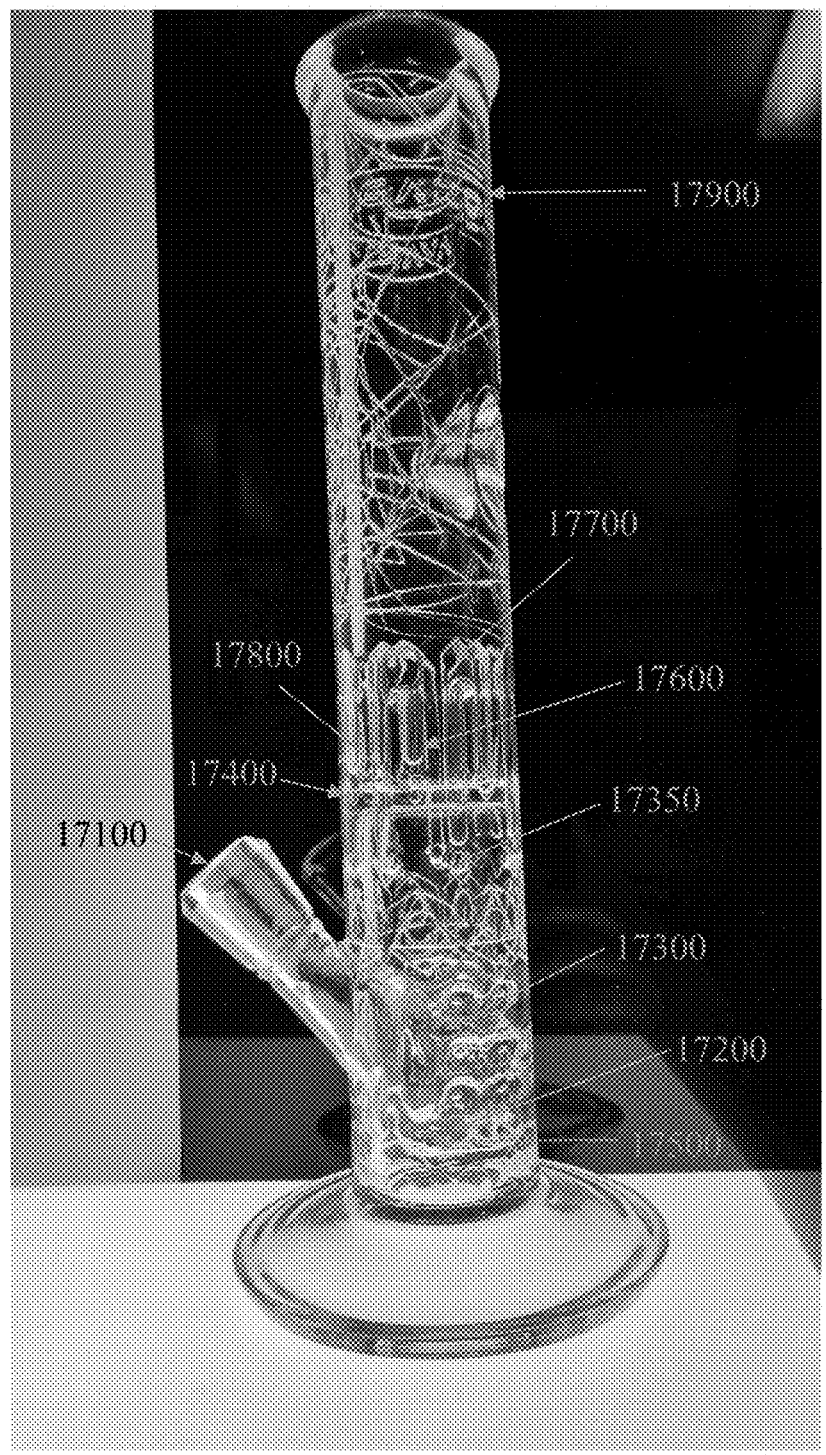

FIG. 17 is a photograph of a perspective view of an exemplary embodiment of a fluid pipe 17000, which is substantially self-contained within a single cylinder without side protrusions or tubes. A smokable material, such as tobacco, and/or one or more other herbal substances, etc. is placed in a receptacle (not illustrated) coupled to an inlet fitting 17100 of fluid pipe 17000. Smoke is conveyed to a first reservoir 17200 via a first image 17300 and inlet apertures 17500. First reservoir 17200 acts to house a liquid (e.g., water). As a user inhales via a port 17900, the smoke, gas, and/or vapor is drawn into a second reservoir 17600 via through second image inlet apertures 17350 to a second image 17700. Second reservoir 17600 is separated from first reservoir 17200 by a divider 17400. The smoke, gas, and/or vapor passes up through a portion of second image 17700 and back down below a surface of the liquid held by second reservoir 17600 and into the fluid via second image exit apertures 17800. Thereby the smoke, gas, and/or vapor percolates through the liquid in second reservoir 17600. The smoke, gas, and/or vapor is then drawn out of fluid pipe 17000 by the user via port 17900.

Figure 17B:
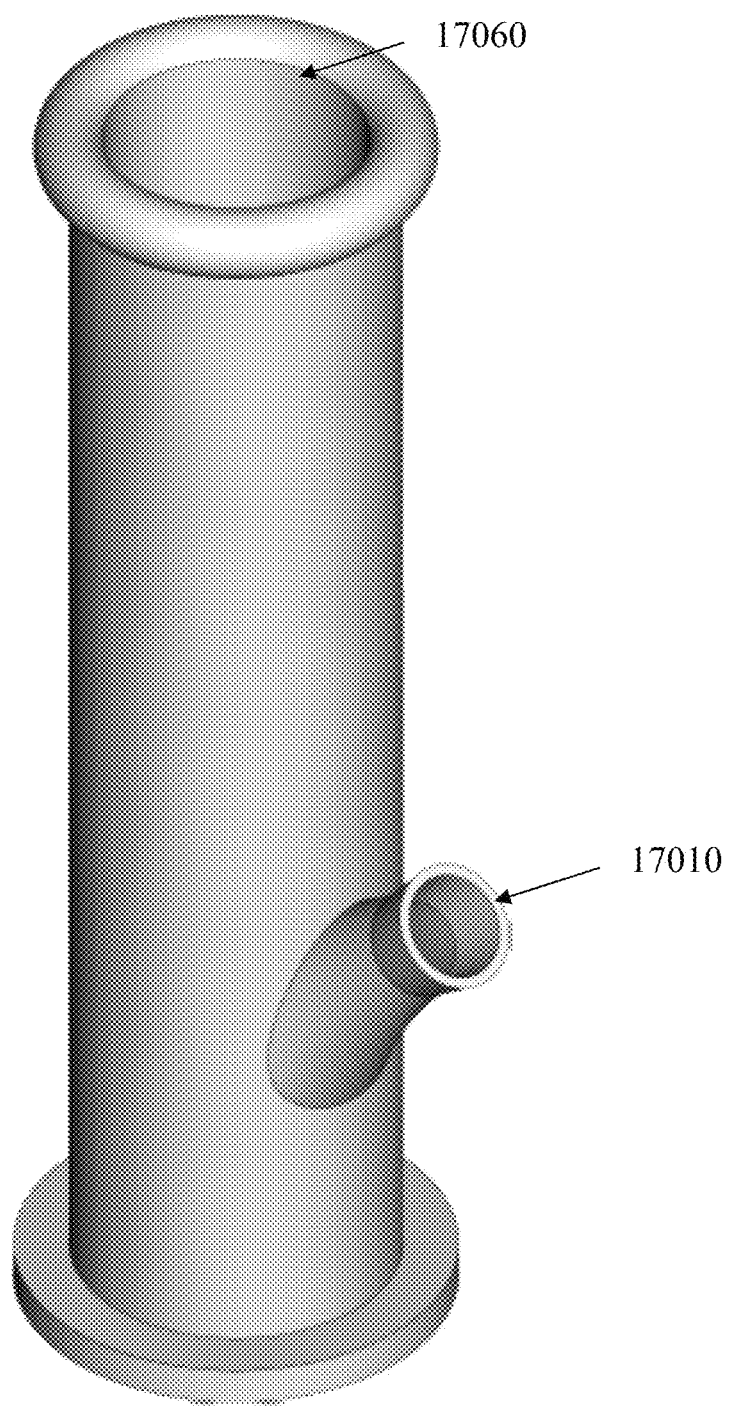

FIG. 17B is a diagram of a perspective view of an exemplary embodiment of a fluid pipe 17001, which comprises a smoke inlet 17010 and a smoke outlet 17060.

Figure 17C:
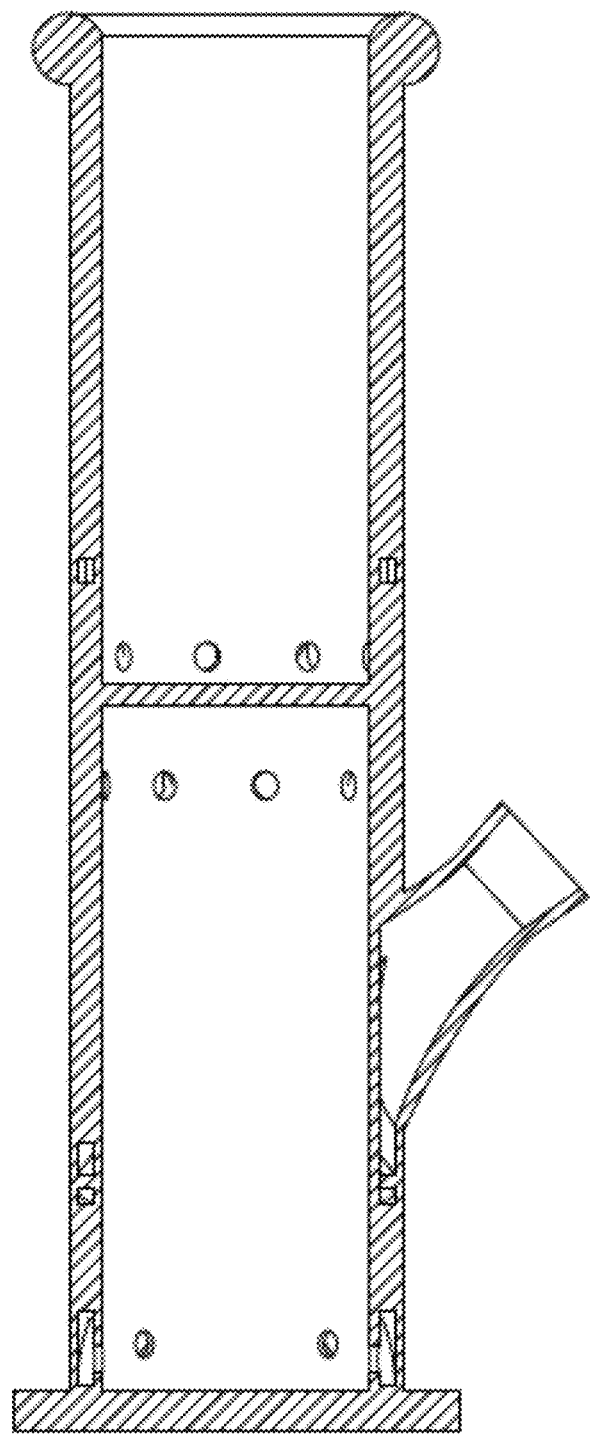
FIG. 17C is a diagram of a cross-sectional side view of fluid pipe 17001.

FIG. 17C is a diagram of a cross-sectional side view of fluid pipe 17001.

Figure 17D:
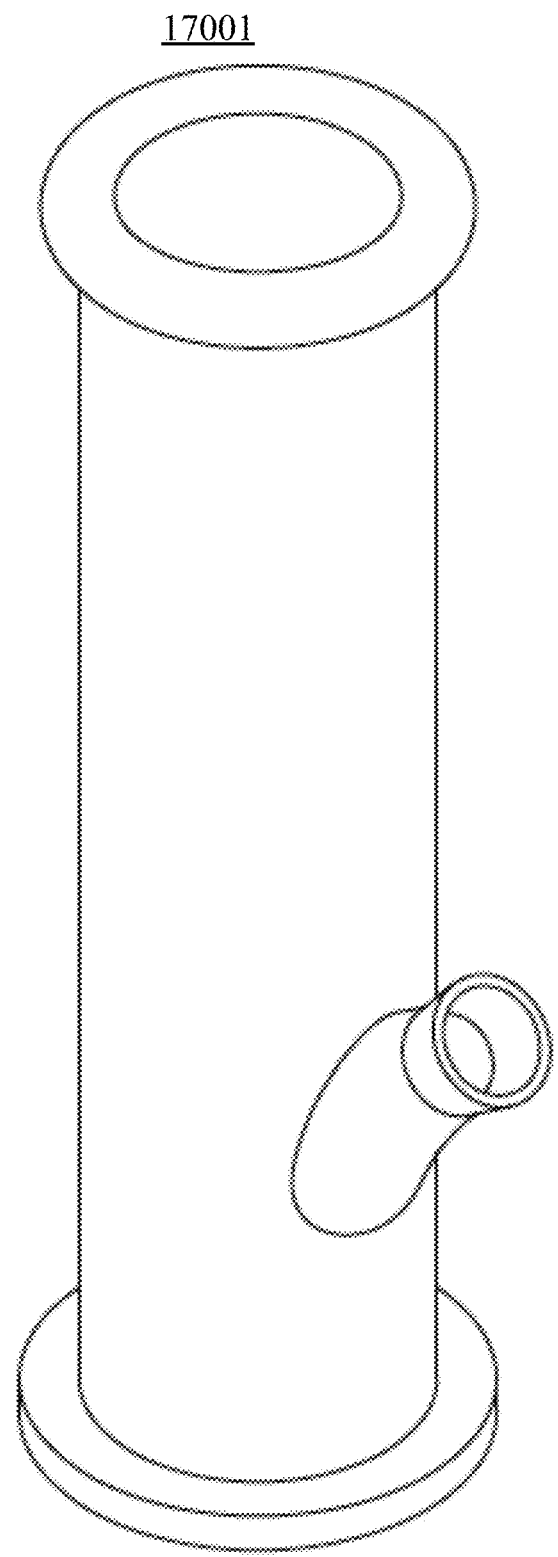
FIG. 17D is a perspective view of fluid pipe 17001.

FIG. 17D is a perspective view of fluid pipe 17001.

Figure 17E:
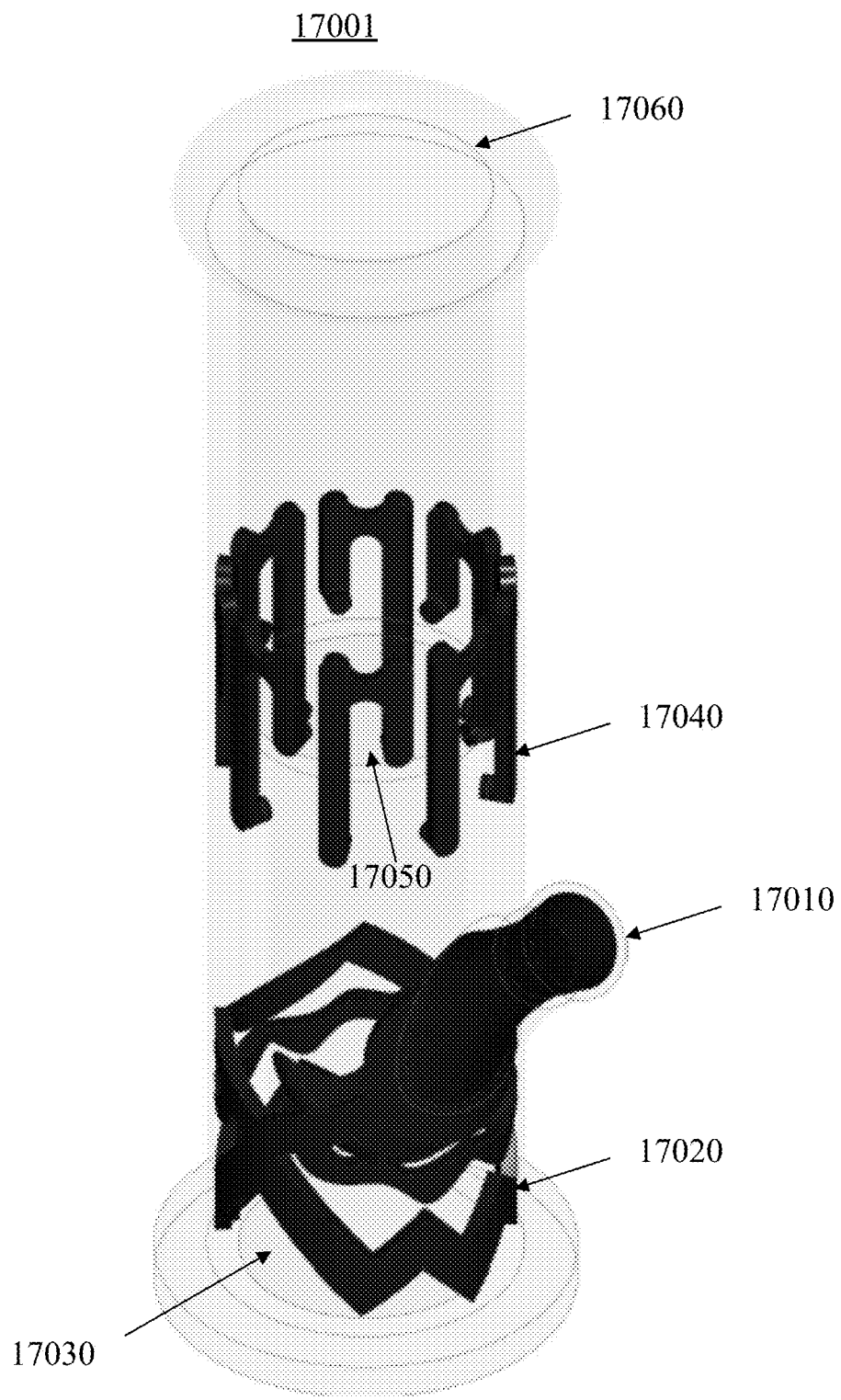

FIG. 17E is a diagram of a semi-transparent perspective view of fluid pipe 100000, which illustrates a passage of smoke through fluid pipe 17001. Smoke passes from smoke inlet 17010 through a first set of negative space relief channels 17020 and into first reservoir 17030. Smoke passes through a second set of negative space relief channels 17040 and into second reservoir 17050. Smoke then passes to outlet 17060.

Figure 18:
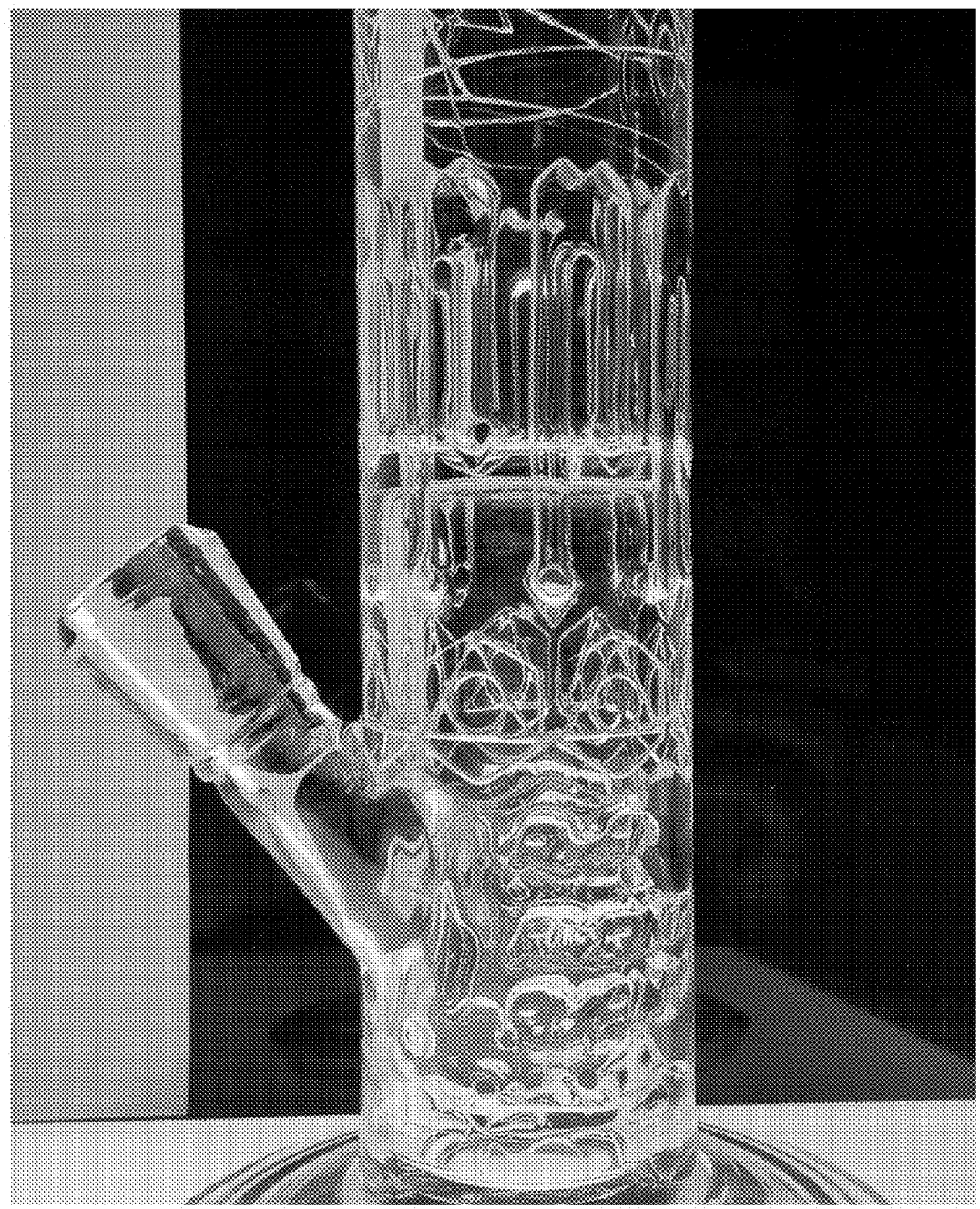

FIG. 18 is a photograph of a perspective view of an exemplary embodiment of a fluid pipe 18000, which is substantially self-contained within a single cylinder without side protrusions or tubes.

Figure 19:
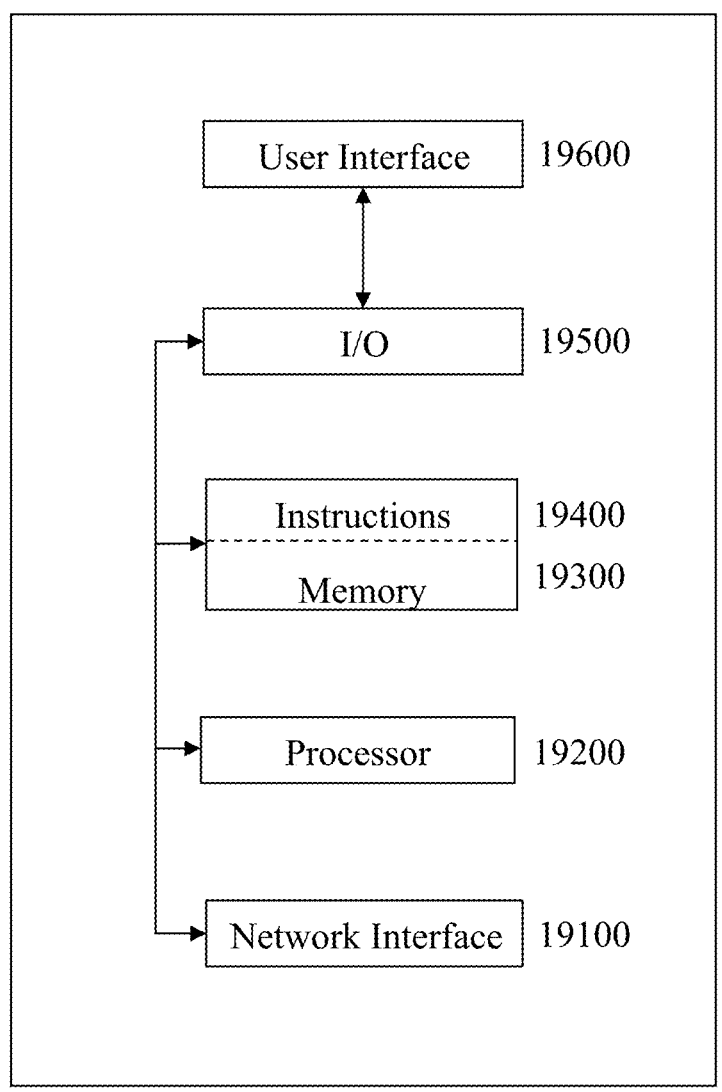
FIG. 19 is a block diagram of an exemplary embodiment of an information device 19000.

FIG. 19 is a block diagram of an exemplary embodiment of an information device 19000, which in certain operative embodiments can comprise, for example, information device 1000 of FIG. 1. Information device 19000 can comprise any of numerous circuits and/or components, such as for example, one or more network interfaces 19100, one or more processors 19200, one or more memories 19300 containing instructions 19400, one or more input/output (I/O) devices 19500, and/or one or more user interfaces 19600 coupled to I/O device 19500, etc.

In certain exemplary embodiments, via one or more user interfaces 19600, such as a graphical user interface, a user can view a rendering of information related to fabricating vessels such as fluid pipes.

Figure 20:
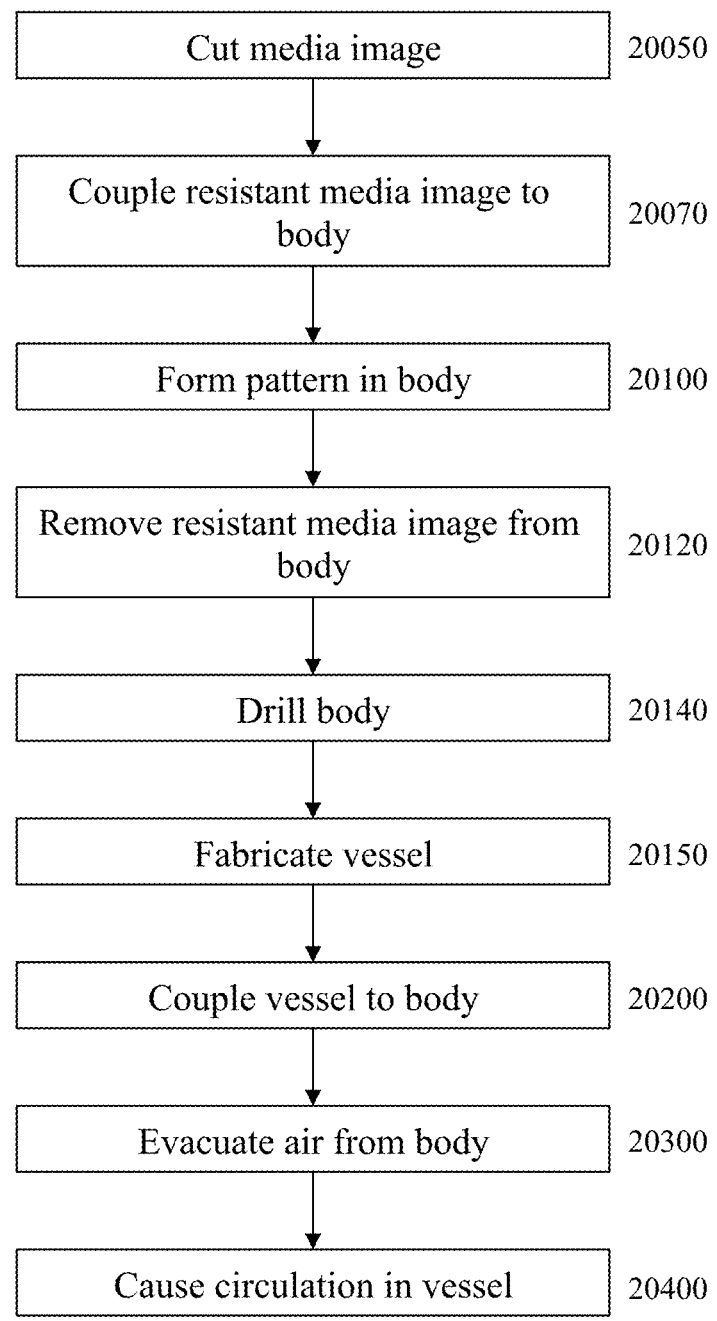
FIG. 20 is a flowchart of an exemplary embodiment of a method 20000.

FIG. 20 is a flowchart of an exemplary embodiment of a method 20000. At activity 20050, certain exemplary embodiments can comprise cutting a resistant media image from a vectorized digital image, wherein the image is formed utilizing the resistant media image.

At activity 20070, a resistant media image can be coupled to an inner body. In certain exemplary embodiments, the resistant media image can be coupled to the inner body via an adhesive. In certain exemplary embodiments, the resistant media image can be used to cut the image into the inner body.

In certain exemplary embodiments, the pattern can be formed via etching the inner body with the negative resistant media image coupled thereto to cut the image into the inner body.

At activity 20100, a pattern, such as an image, one or more engineered pathways, and/or other negative space relief, can be formed into an inner body in some manner. In certain exemplary embodiments, an image or specific volume negative space relief can be carved. The inner body can comprise glass, metal, plastic, wood, silicon, and/or any other material known and unknown, etc. For metal embodiments, an image and/or specific volume negative space relief can be defined via a vectorized digital image. The vectorized digital image can be used to create a mask and/or a pattern for the image and/or specific volume negative space relief. The image or specific volume negative space relief can be formed via welding, extruding, injection molding, compression molding, 3D printing, laser etching, water etching, and/or abrasive blasting utilizing an abrasive resistant mask.

For plastic embodiments, the image and/or specific volume negative space relief can be defined via a vectorized digital image. The vectorized digital image can be used to create a mask and/or a pattern for the image and/or specific volume negative space relief. The image or specific volume negative space relief can be formed via cutting, melting, extruding, injection molding, compression molding, 3D printing, and/or abrasive blasting utilizing an abrasive resistant mask.

For wood embodiments, the image and/or specific volume negative space relief can be defined via a vectorized digital image. The vectorized digital image can be used to create a mask and/or a pattern for the image and/or specific volume negative space relief. The image or specific volume negative space relief can be formed via carving, burning, pressing, gluing, tongue in groove, laser etching, water etching, and/or abrasive blasting.

For silicon embodiments, the image and/or specific volume negative space relief can be defined via a vectorized digital image. The vectorized digital image can be used to create a mask and/or a pattern for the image and/or specific volume negative space relief. The image or specific volume negative space relief can be formed via molding, injection molding, compression molding, 3D printing, bonding, laser etching, water etching, and/or extrusion.

For certain exemplary embodiments, the image or specific volume negative space relief can be defined via use of a mask produced via one of 3D printing, molding, injection molding, compression molding, bonding, laser etching, water etching, abrasive blasting, sandblasting, and/or resisted vinyl removal, etc.

In certain exemplary embodiments, the pattern can be formed via sandblasting the inner body with the negative resistant media image coupled thereto to cut the image into the inner body.

At activity 20120, the negative resistant media image can be removed after the image is cut into the inner body.

At activity 20140, at least one aperture can be drilled in the body. Other embodiments can lack apertures.

At activity 20150, a vessel can be fabricated. The vessel can be fabricated via placing the outer shell around the inner body and/or fusing the outer shell to the inner body. The vessel can comprise a plurality of layers. The vessel can comprise an outer shell and the inner body. The inner body defining an image and/or any specific volume negative space relief. The image and/or specific volume negative space relief is constructed for delivering, draining, filtering, cooling heating, condensing, conducting, trapping, holding, or recirculating a gas, fluid, solid, plasma, and/or electrical energy, etc. The outer shell can be substantially airtight. The vessel can be constructed to separate the gas, fluid, solid, plasma, and/or electrical energy, etc. into separate chambers defined by the vessel.

The inner body defines at least one aperture and/or tube. The gas, fluid, solid, plasma, and/or electrical energy are substantially retained by the outer shell. When a gas or fluid is propelled from a reservoir defined by the outer shell, the gas, fluid, solid, plasma, and/or electrical energy, etc. flows through the at least one aperture and is circulated or recirculated to the reservoir. The gas or fluid, flows through the at least one aperture and can do at least one of: recirculate to a chamber defined by the vessel; and/or flows to a chamber defined by the vessel. The vessel is constructed to combine or recombine, or trap to cause reactions or functions, portions the gas or fluid via separate chambers defined by the vessel. In certain exemplary embodiments, plasma or electricity can flow from chamber to chamber via images and apertures, but the plasma or electricity are substantially trapped within a defined area. In certain exemplary embodiments, solids can be used to conduct electricity. Certain exemplary embodiments can substantially trap a solid that can be moved throughout an image and defined chambers (e.g., an opal sphere).

The vessel can be constructed to do at least one of heating, condensing, conducting, and/or trapping, etc. of a portion of the gas, fluid, solid, plasma, and/or electrical energy, etc.

In certain exemplary embodiments, the vessel can be fabricated via one or more of:
  turning the inner body and the outer shell on a lathe;
  heating the inner body and the outer shell;

shaping the outer shell to conform to the inner body via a graphite paddle;

removing air from the outer shell; and/or fusing the outer shell to the inner body via heat, etc. leaving behind desired imagery.

At activity 20200, a vessel can be coupled to the body. At activity 20300, air can be evacuated from the body.

At activity 20400, certain exemplary embodiments can cause circulation to take place in a vessel.

Applications for the vessel can comprise fluid pipes, hydroponics, distillation, and/or artistic expression, etc.

Figure 21:
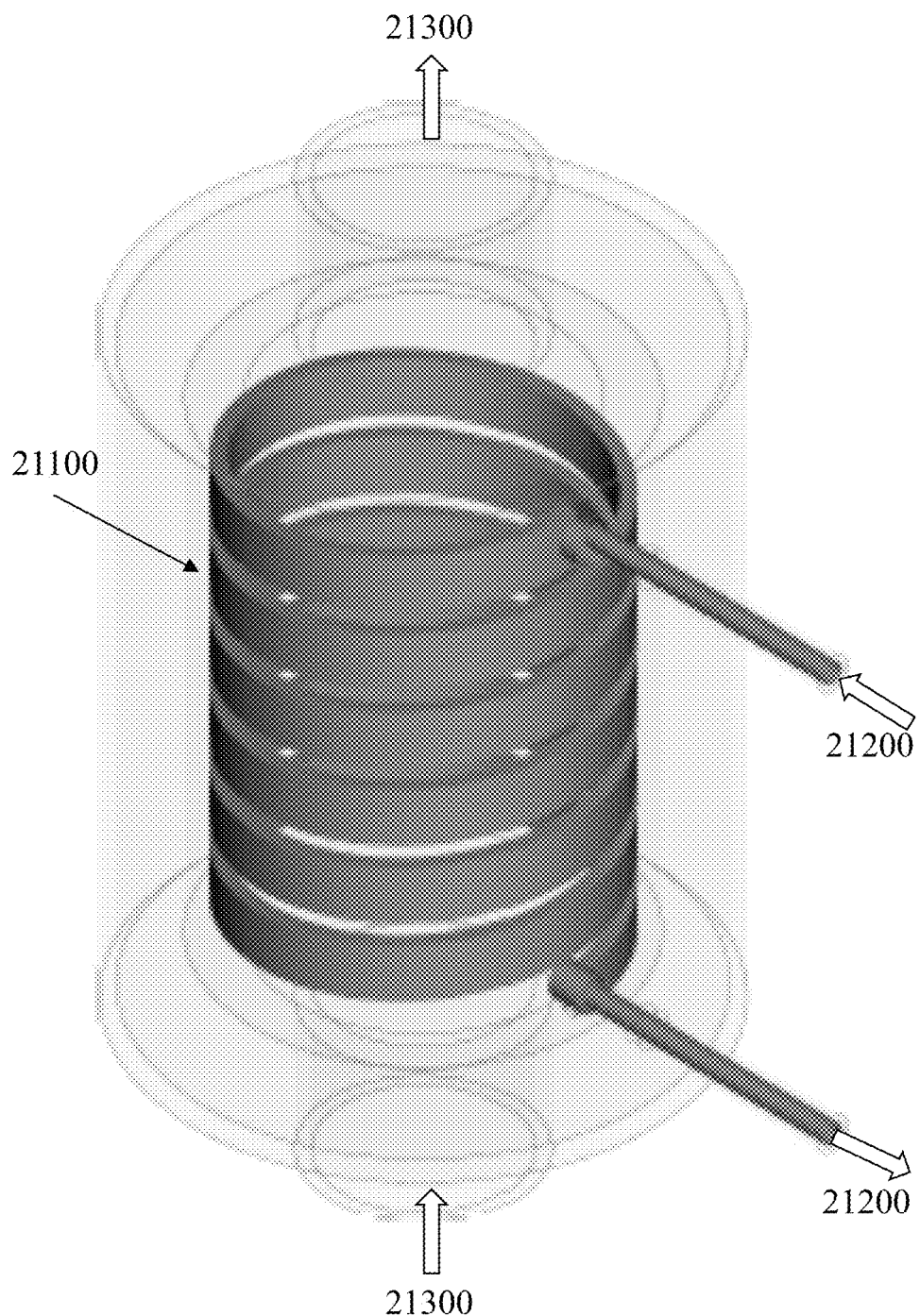

FIG. 21 is a diagram of an exemplary embodiment of a cooling distiller 21000, which can be made according to one or more methods disclosed herein. Cooling distiller 21000 is constructed to operate via circulation of a coolant and a liquid to be cooled. The liquid to be cooled circulates in tubes 21100 of cooling distiller 21000. The coolant circulates through cooling distiller 21000 such that heat is exchanged from tubes 21100 of cooling distiller 21000 and heat energy is removed from the liquid to be cooled such that a temperature of the liquid to be cooled is reduced from passing through tubes 21100. Tubes 21100 can be formed via defining specific volume negative space relief from one or more of the methods disclosed herein. Specific volume negative space relief that forms tubes 21100 can be in an inner shell or an outer shell of cooling distiller 21000.

Liquid to be cooled 21200 enters cooling distiller 21000 at a higher temperature and exits at a lower temperature. Coolant 21300 enters cooling distiller 21000 at a lower temperature and exits at a higher temperature due to heat exchange with liquid to be cooled 21200. In cooling distiller 21000, a first liquid circulates to provide cooling to a second liquid that is isolated from the first liquid. The cooling distiller comprises two concentric cylinders that have been made according to methods disclosed herein. The two concentric cylinders define one or more sets of channels that provide a path for one of the first liquid or the second liquid. Coolant flows around, as well as through, the inner cylinder. The cylinders can be made of any material such as glass, clear plastic, or any other plastic or polymer. Certain exemplary embodiments can be made utilizing a computer numerical control ("CNC") machine, which is the automation of machine tools by means of computers executing pre-programmed sequences of machine control commands. For example, certain exemplary embodiments can be made utilizing a small 3 or 4 axis CNC machine, computer numerical control, machining center with tool changer.

Cooling distiller 21000 can be made via a CNC machine, which can accurately control wall thickness and relief space volumes.

Figure 22:
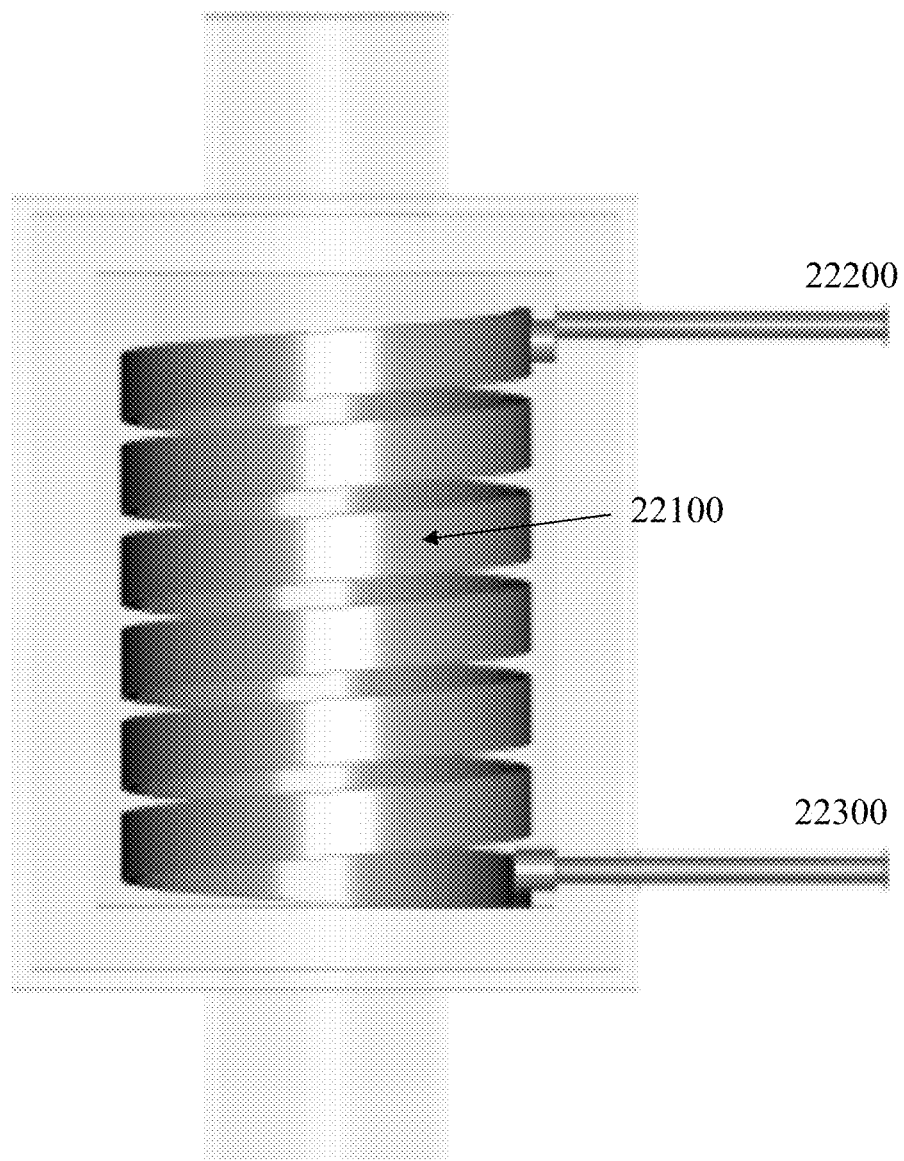

FIG. 22 is a side view of an exemplary embodiment of an inner cooling unit 22000 of a cooling distiller (e.g., cooling distiller 21000 of FIG. 21). Inner cooling unit 22000 comprises tubes 22100. Liquid to be cooled enters inner cooling unit 22000 at an inlet 22200 at a higher temperature and exits outlet 22300 at a lower temperature.

Figure 22B:
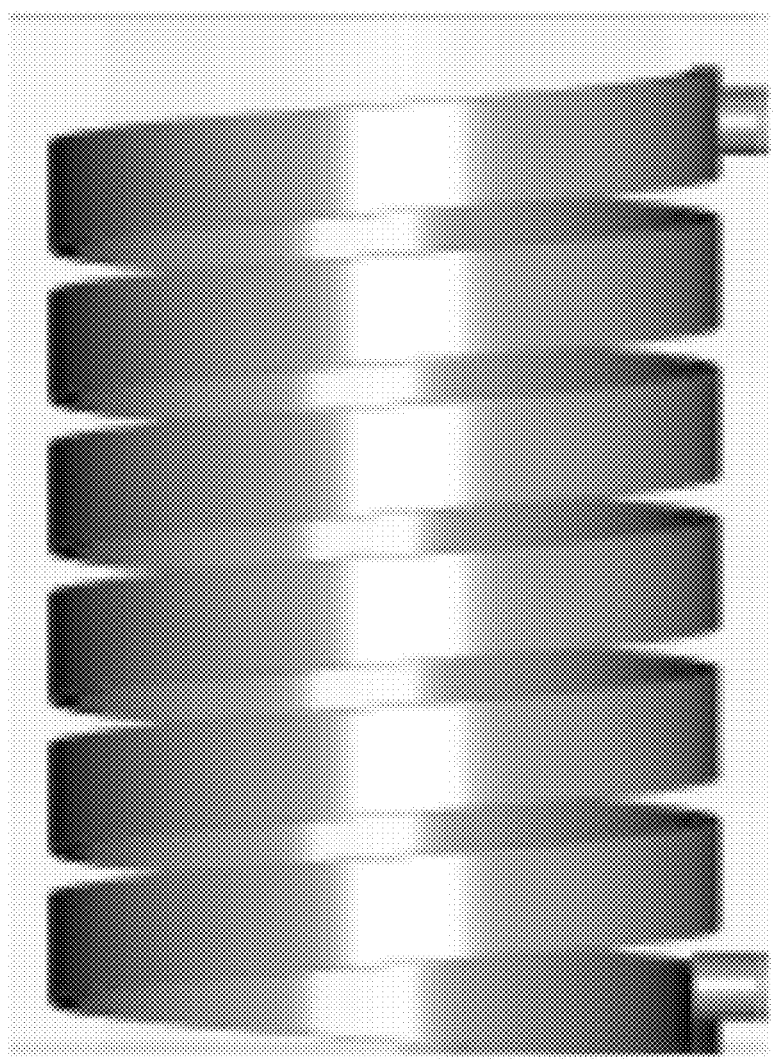

FIG. 22B is a side view of an exemplary embodiment of an inner cooling unit of a cooling distiller 22500.

Figure 23:
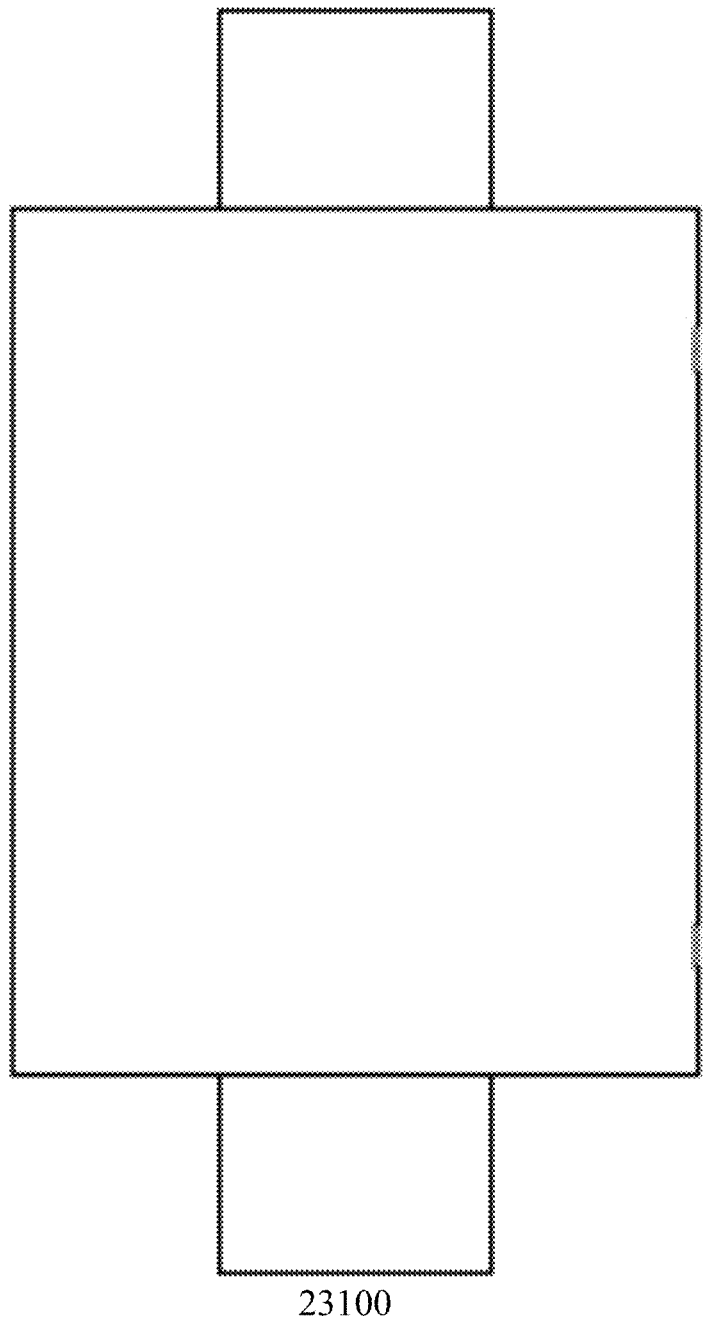
FIG. 23 is a side view of an exemplary embodiment of an outer coolant jacket of a cooling distiller 23000.

FIG. 23 is a side view of an exemplary embodiment of an outer coolant jacket of a cooling distiller 23000. Cooling distiller 23000 comprises a coolant inlet 23100 and a coolant outlet 23200.

Figure 24:
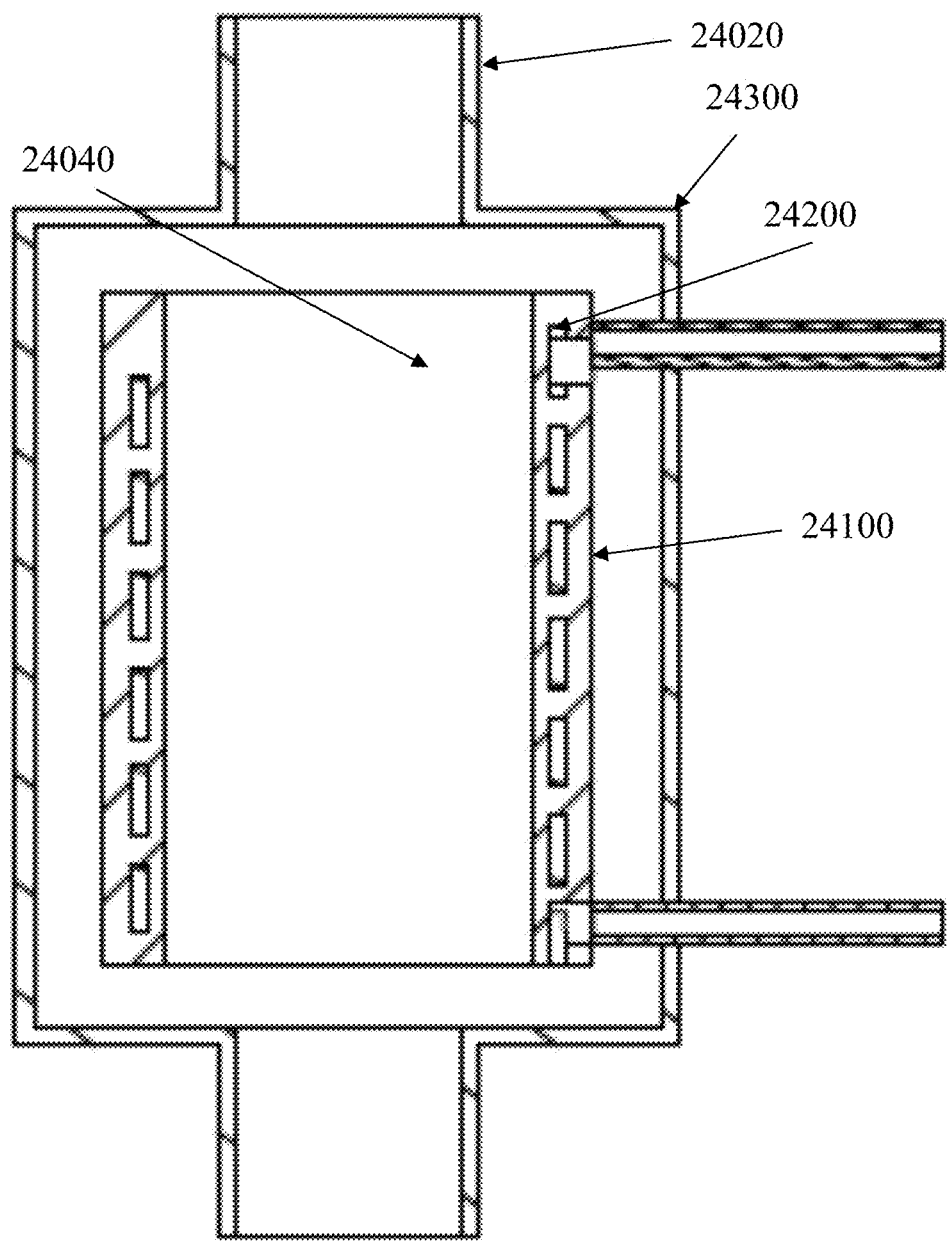
FIG. 24 is a cross-sectional view of an exemplary embodiment of a cooling distiller 24000.

FIG. 24 is a cross-sectional view of an exemplary embodiment of a cooling distiller 24000. Coolant passing through cooling distiller 24000 passes through outer passage 24020 and inner passage 24040 thereby improving heat transfer kinetics from tubes 24100 of inner cooling unit 24200. Outer passage 24020 is defined by outer coolant jacket 24300 and inner cooling unit 24200.

Figure 25:
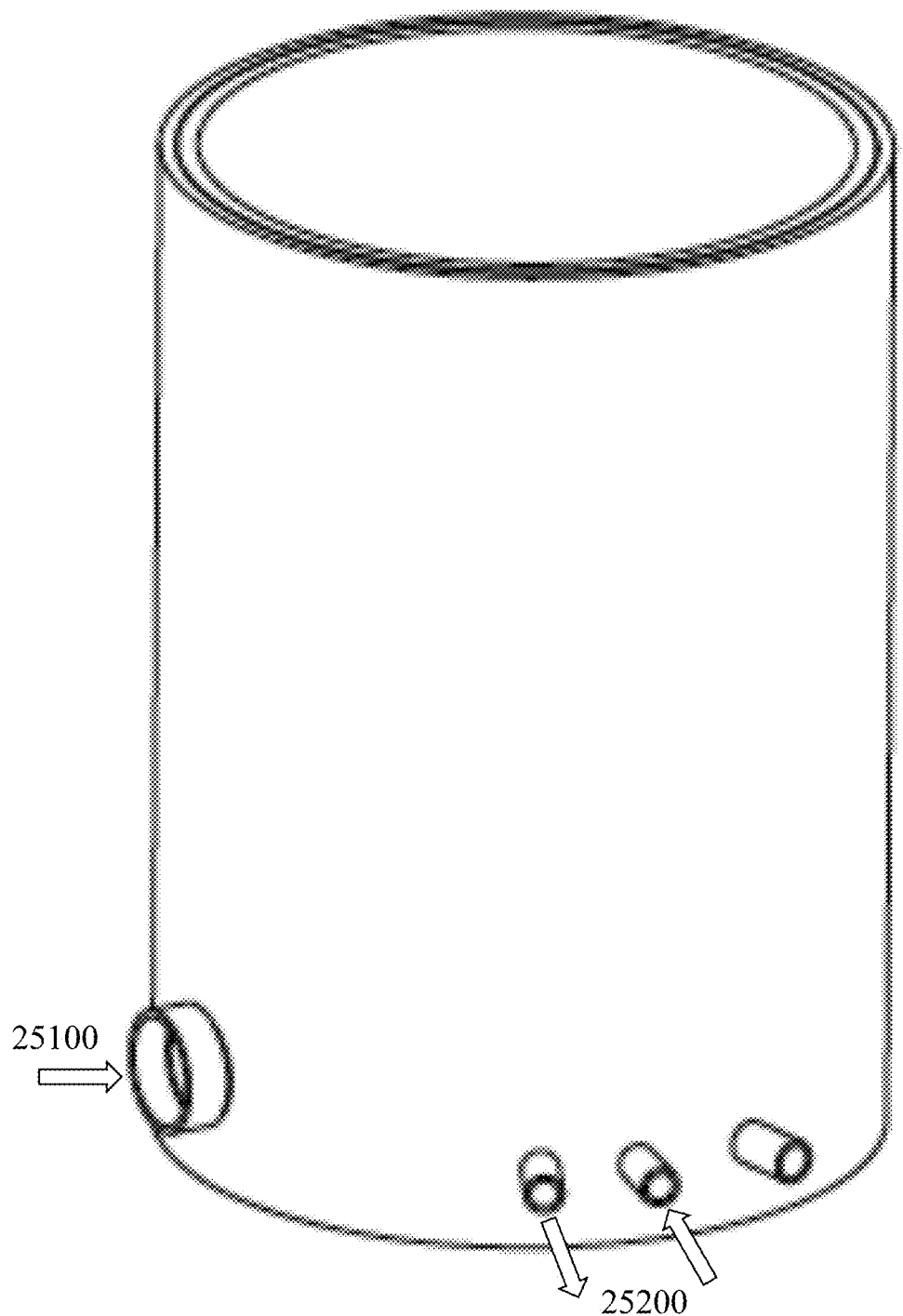
FIG. 25 is a a perspective view of an exemplary embodiment of a fill and drain bucket/deepwater culture under-current bucket 25000.

FIG. 25 is a perspective view of an exemplary embodiment of a fill and drain bucket/deepwater culture under-current bucket 25000, which comprises bucket connection sites 25100 and coolant entry/exit ports 25200. Fill and drain bucket/deepwater culture under-current bucket 25000 is constructed for agricultural applications where nutrients can be added to a liquid via mixing a liquid with a nutrient rich liquid or gas. Channels defined in the walls of fill and drain bucket/deepwater culture under-current bucket 25000 can be utilized to route the nutrient rich liquid or gas for mixing. Fill and drain bucket/deepwater culture under-current bucket 25000 can comprise an aerator plate that provides for distribution of nutrient rich liquid or gas in fill and drain bucket/deepwater culture under-current bucket 25000.

Figure 26:
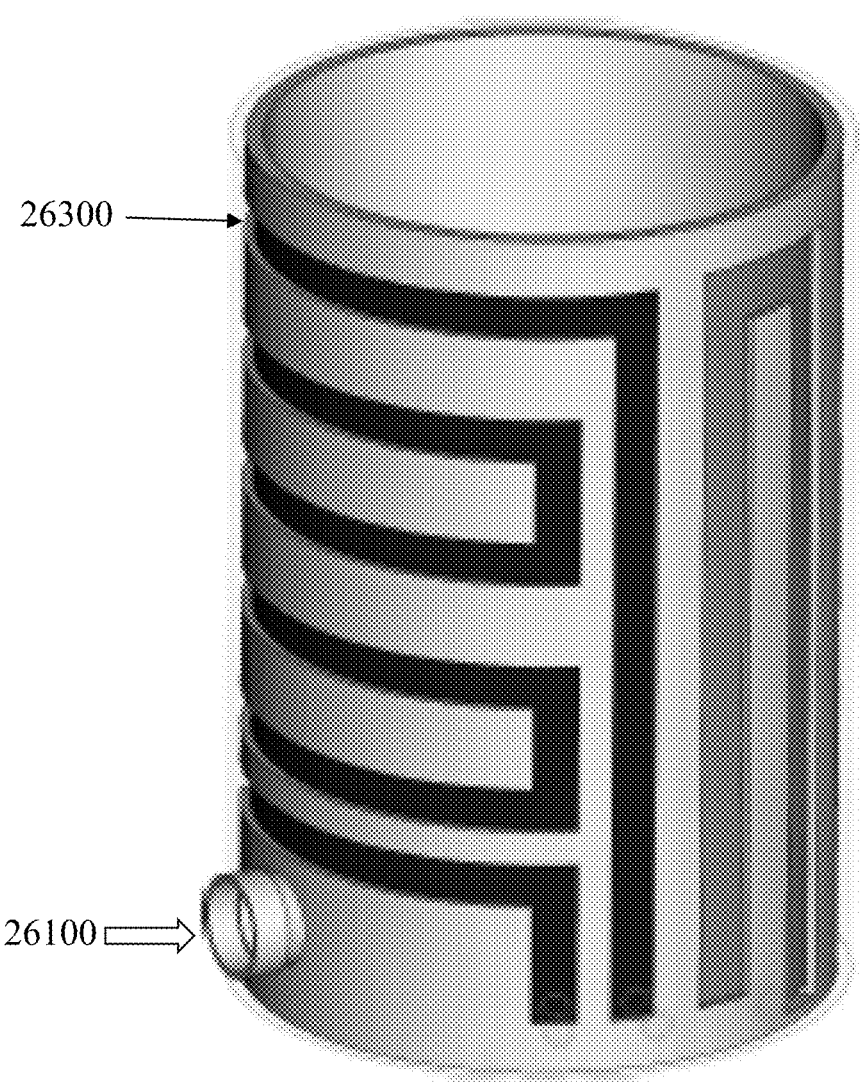

FIG. 26 is a perspective cutaway view of an exemplary embodiment of a fill and drain bucket/deepwater culture under-current bucket 26000 without an outer sleeve, which comprises bucket connection sites 26100 and defines channels 26300. In certain exemplary embodiments, fill and drain bucket/deepwater culture under-current bucket 26000 can be utilized to cool fluids transferred thereto. Coolant flows through channels 26300, which are defined via negative space relief defined by fill and drain bucket/deepwater culture under-current bucket 26000.

Figure 27:
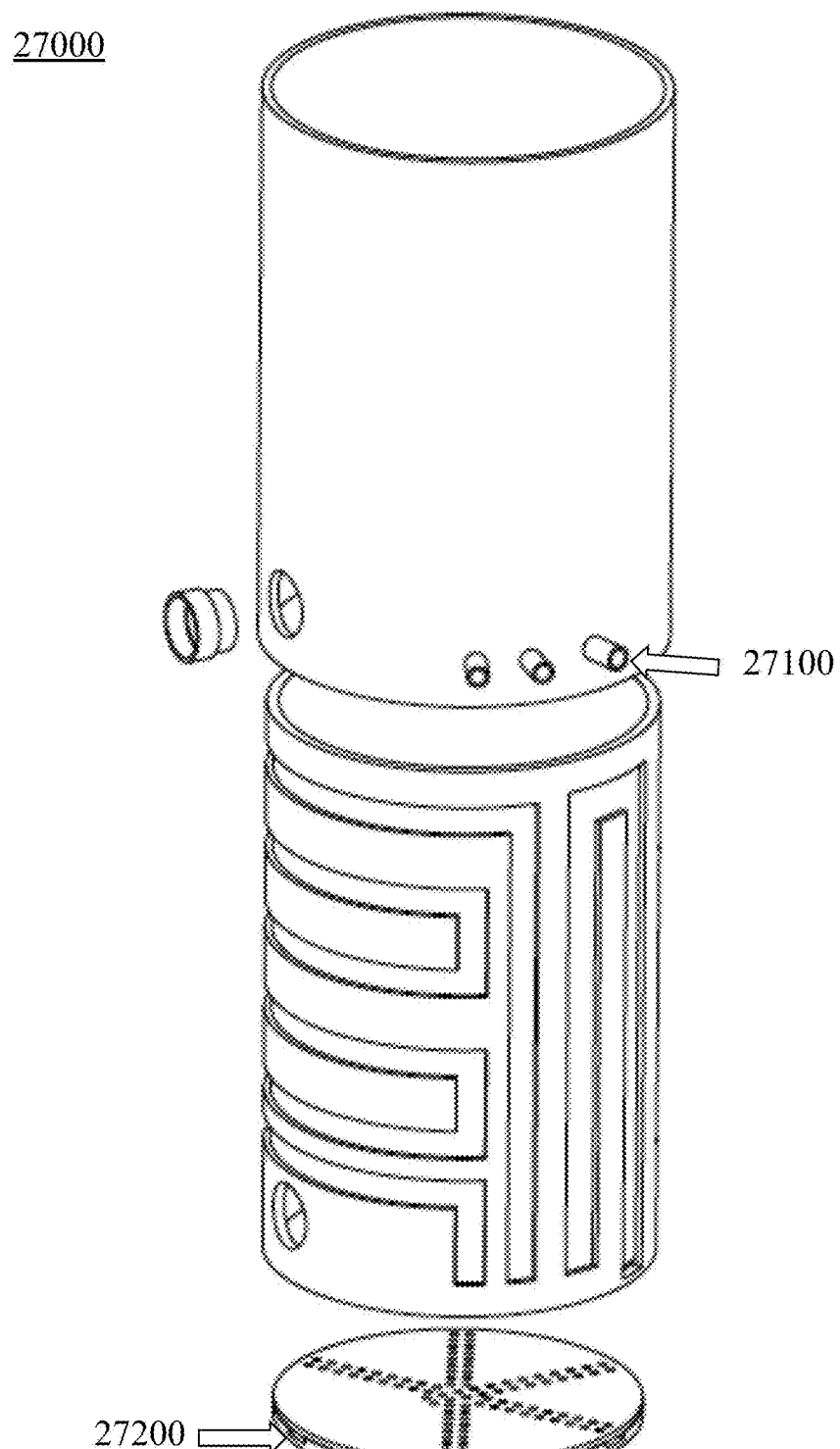
FIG. 27 is a perspective view of an exemplary embodiment of an exploded view of a fill and drain bucket/deepwater culture under-current bucket 27000.

FIG. 27 is a perspective view of an exemplary embodiment of an exploded view of a fill and drain bucket/deepwater culture under-current bucket 27000. Fill and drain bucket/deepwater culture under-current bucket 27000 defines an air inlet 27100 and an entry point to an aerator plate 27200.

Figure 28:
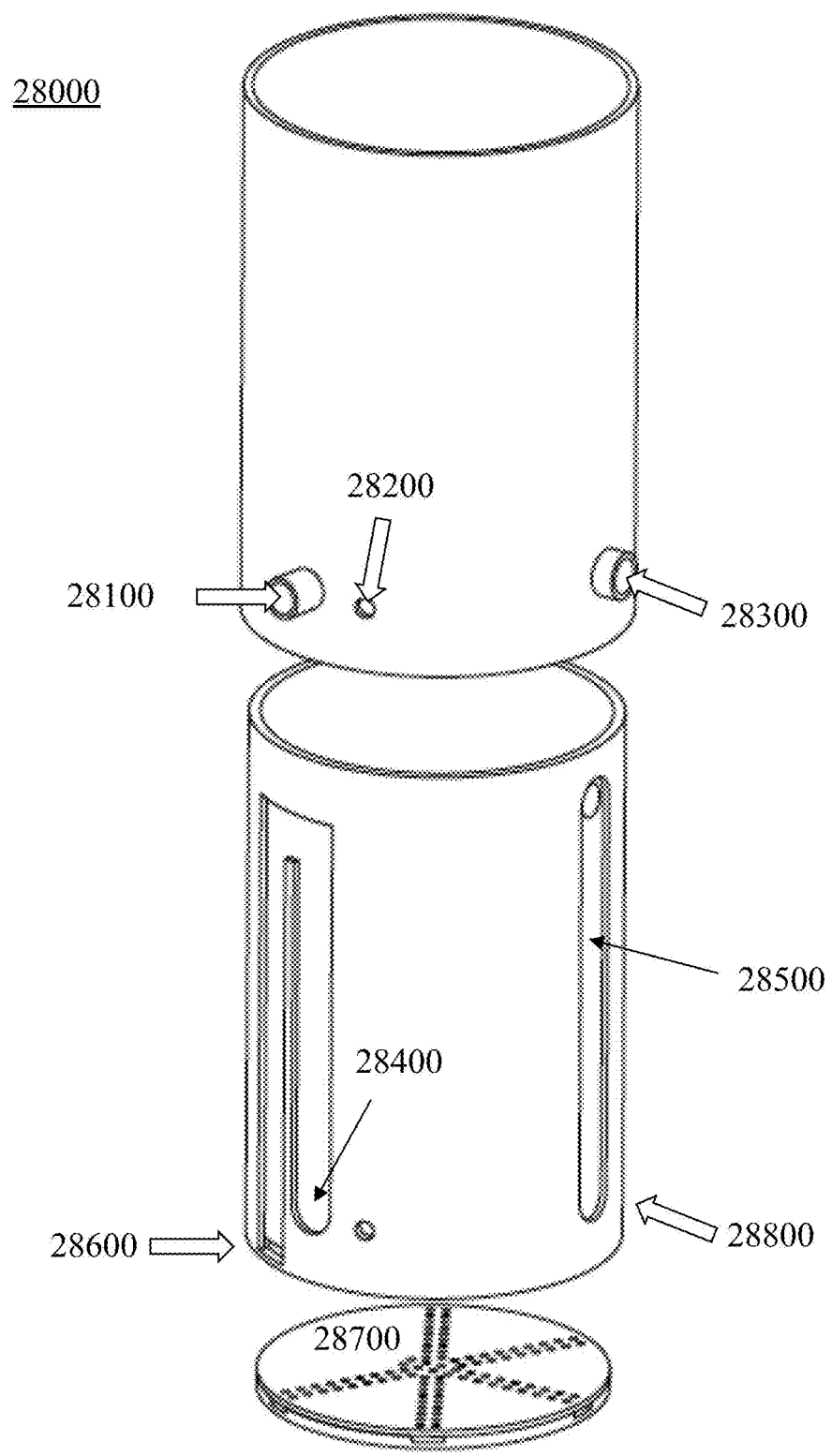
FIG. 28 is a perspective view of an exemplary embodiment of an exploded view of a fill and drain bucket 28000.

FIG. 28 is a perspective view of an exemplary embodiment of an exploded view of a fill and drain bucket 28000. Fill and drain bucket 28000 comprises an air inlet 28100, a drain hole 28200, and a water inlet 28300. Air inlet 28100 can be utilized to aerate substances in fill and drain bucket 28000, such as via an aerator plate (see, e.g., aerator plate 29300 of FIG. 29) comprised by fill and drain bucket 28000. Air path specific volume negative space relief 28400 and water path specific volume negative space relief 28500 are defined by fill and drain bucket 28000. Fill and drain bucket 28000 comprises an air path 28600 to aerator plate 28700, and a water path aperture 28800.

Figure 29:
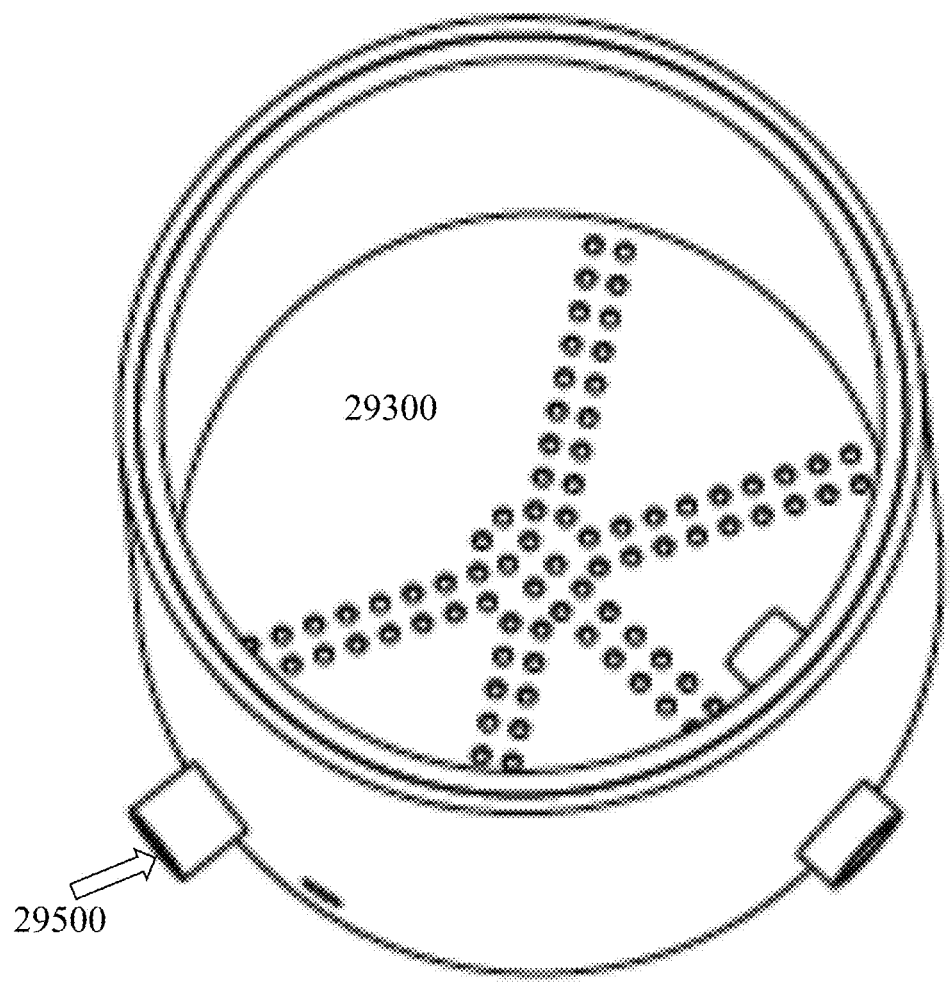
FIG. 29 is a perspective view of an exemplary embodiment of a fill and drain bucket 29000.

FIG. 29 is a perspective view of an exemplary embodiment of a fill and drain bucket 29000. Fill and drain bucket 29000 comprises an aerator plate 29300 and a drain hole 29500. Fill and drain bucket 29000 can be utilized in applications where fluid aeration is desired.

Figure 30:
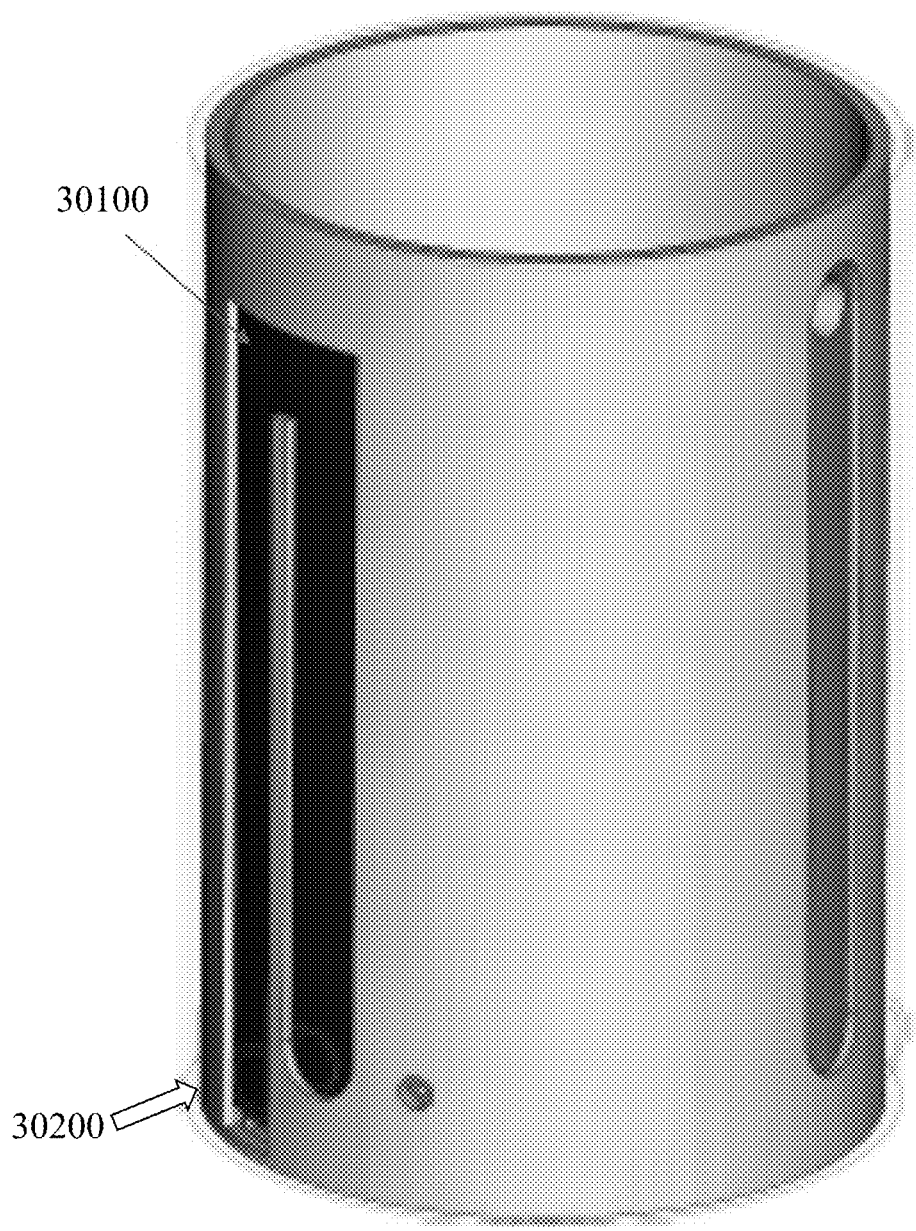

FIG. 30 is a perspective cutaway view of an exemplary embodiment of a fill and drain bucket 30000 without an outer sleeve. Water path specific volume negative space relief 30100 is defined by fill and drain bucket 30000. Fill and drain bucket 30000 provides an air path to an aerator plate 30200.

Figure 30B:
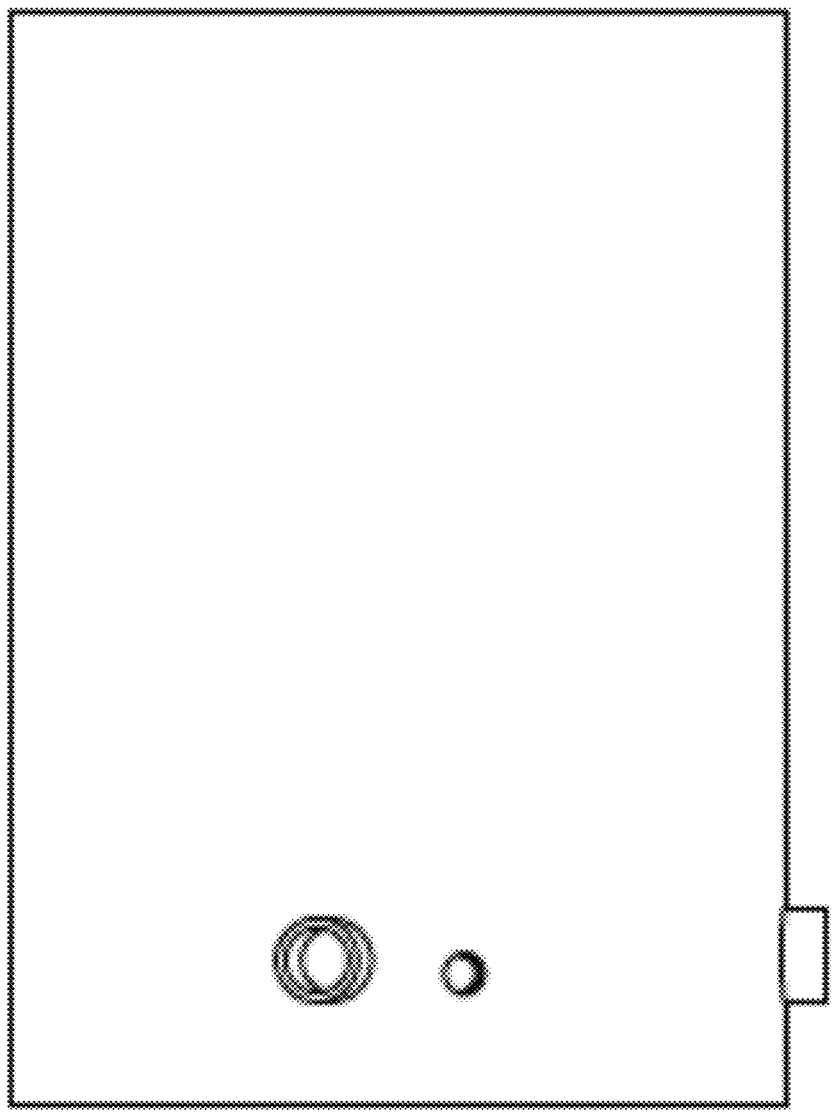
FIG. 30B is a side view of an exemplary embodiment of a fill and drain bucket 30500.

FIG. 30B is a side view of an exemplary embodiment of a fill and drain bucket 30500.

Figure 31:
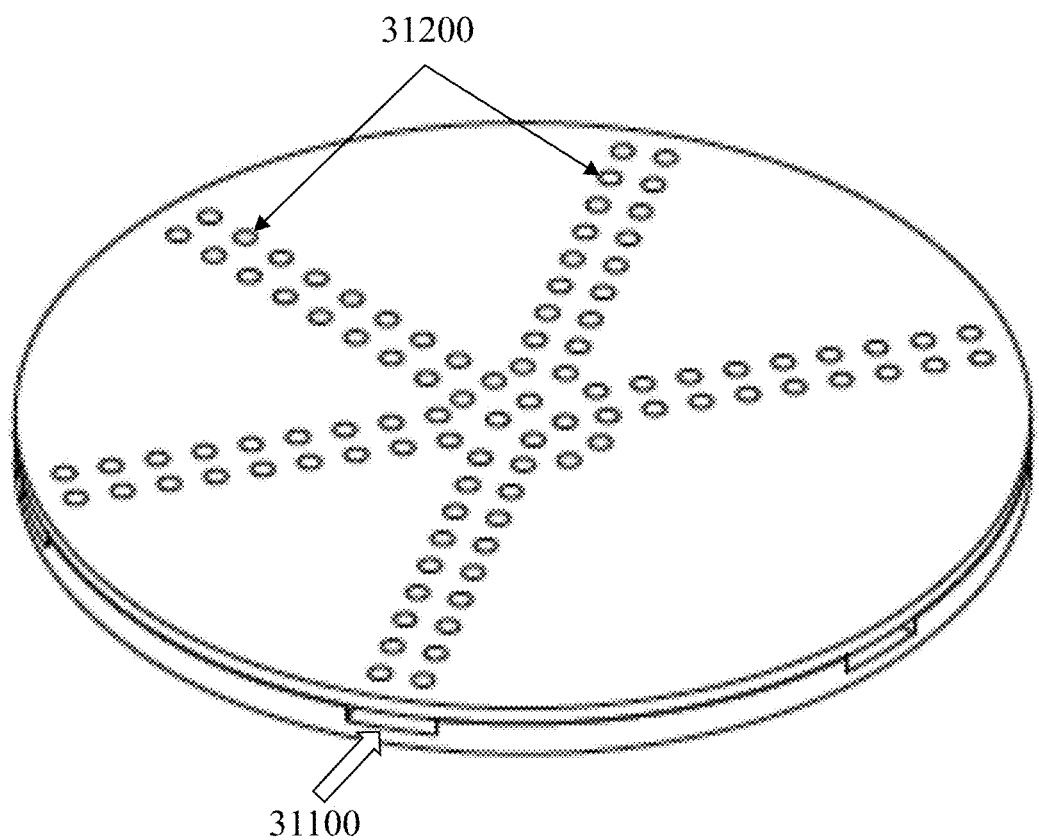
FIG. 31 is a perspective view of an exemplary embodiment of aerator plate wireframe 31000.

FIG. 31 is a perspective view of an exemplary embodiment of aerator plate wireframe 31000. Aerator plates are used in the illustrated embodiments of FIG. 25-FIG. 30. Pressurized air is forced through an entry point 31100. Air exits through ventilation ports 31200 to aerate substances in a container that comprises an aerator plate comprising aerator plate wireframe 31000.

Figure 32:
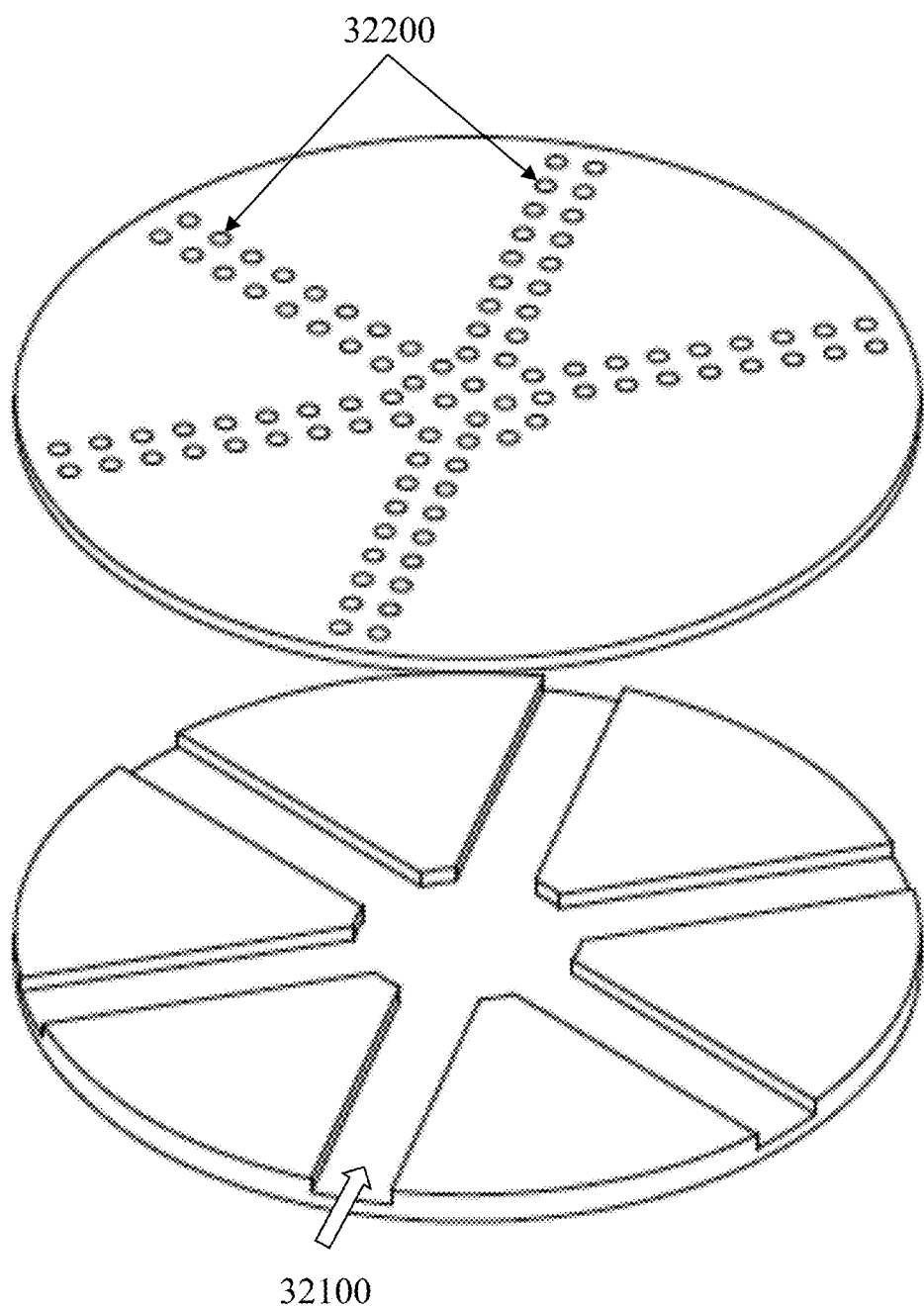
FIG. 32 is a diagram showing an exploded view of an exemplary embodiment of aerator plate 32000.

FIG. 32 is a diagram showing an exploded view of an exemplary embodiment of aerator plate 32000. Aerator plates are used in the illustrated embodiments of FIG. 25-FIG. 30. Pressurized air is forced through an entry point 32100. Air exits through ventilation ports 32200.

Figure 33:
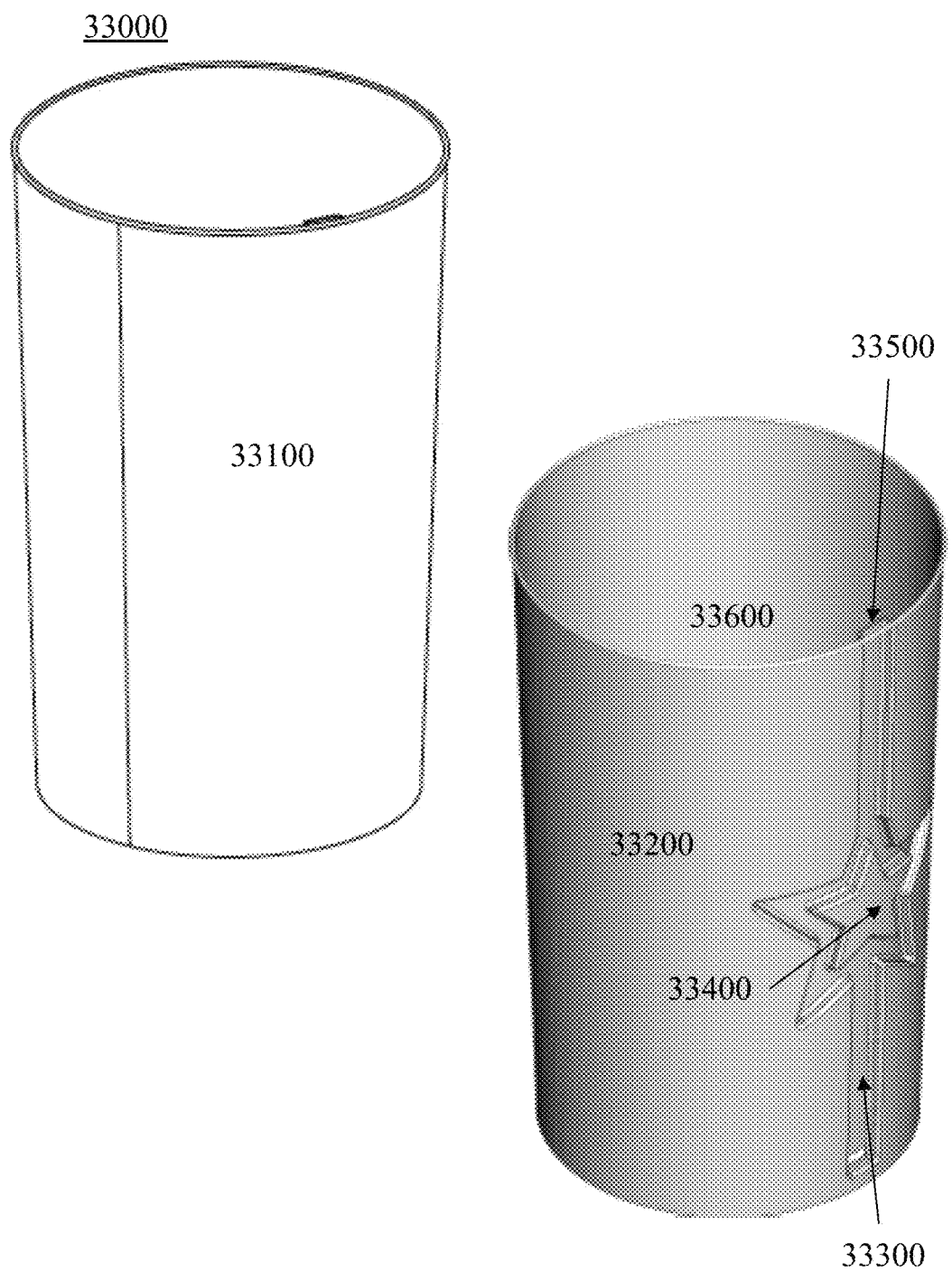

FIG. 33 is a perspective view of an exemplary embodiment of cup 33000. Paper cup 33000 comprises a sleeve 33100 and an insert 33200. Insert 33200 defines a specific volume negative space relief 33300 through which fluid can be drawn by a drinking user. Certain exemplary embodiments provide imagery 33400, which can be seen through sleeve 33100 of cup 33000. Aperture port 33500 provides for liquid flow from an inner fluid chamber 33600. Aperture port 33500 is coupleable to a compatible lid. A substantially transparent sleeve 33100 allows visibility of underlying imagery 33400.

Figure 34:
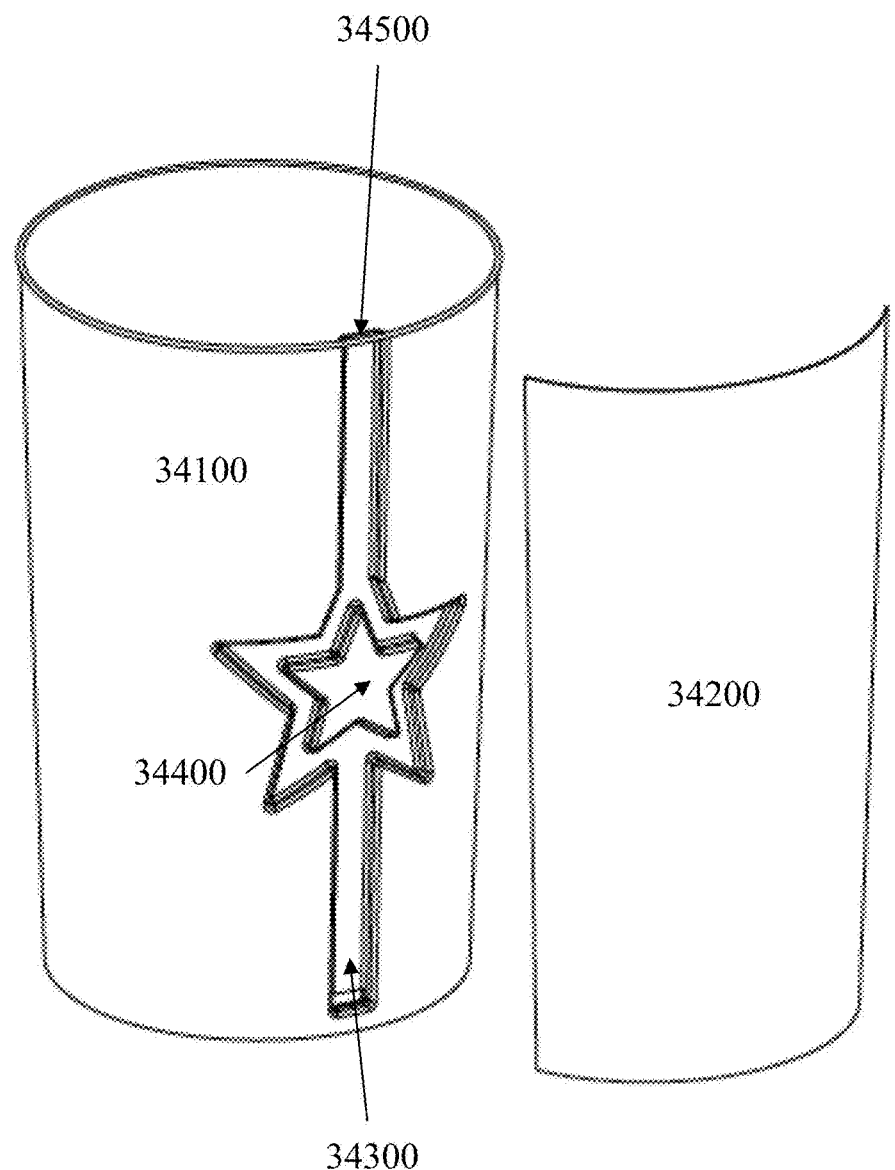
FIG. 34 is a perspective view of an exemplary embodiment of a cup design 34000.

FIG. 34 is a perspective view of an exemplary embodiment of a cup 34000, which comprises a sleeve 34200 and an insert 34100. The illustrated embodiment shows sleeve 34200 is separable from insert 34100. In other embodiments, sleeve 34200 can be fused to insert 34100 of cup 34000 during a making of cup 34000. Cup 34000 can comprise a transparent sleeve 34200. Insert 34100 defines negative relief 34300 with an image 34400, and a drinking aperture 34500.

Figure 35:
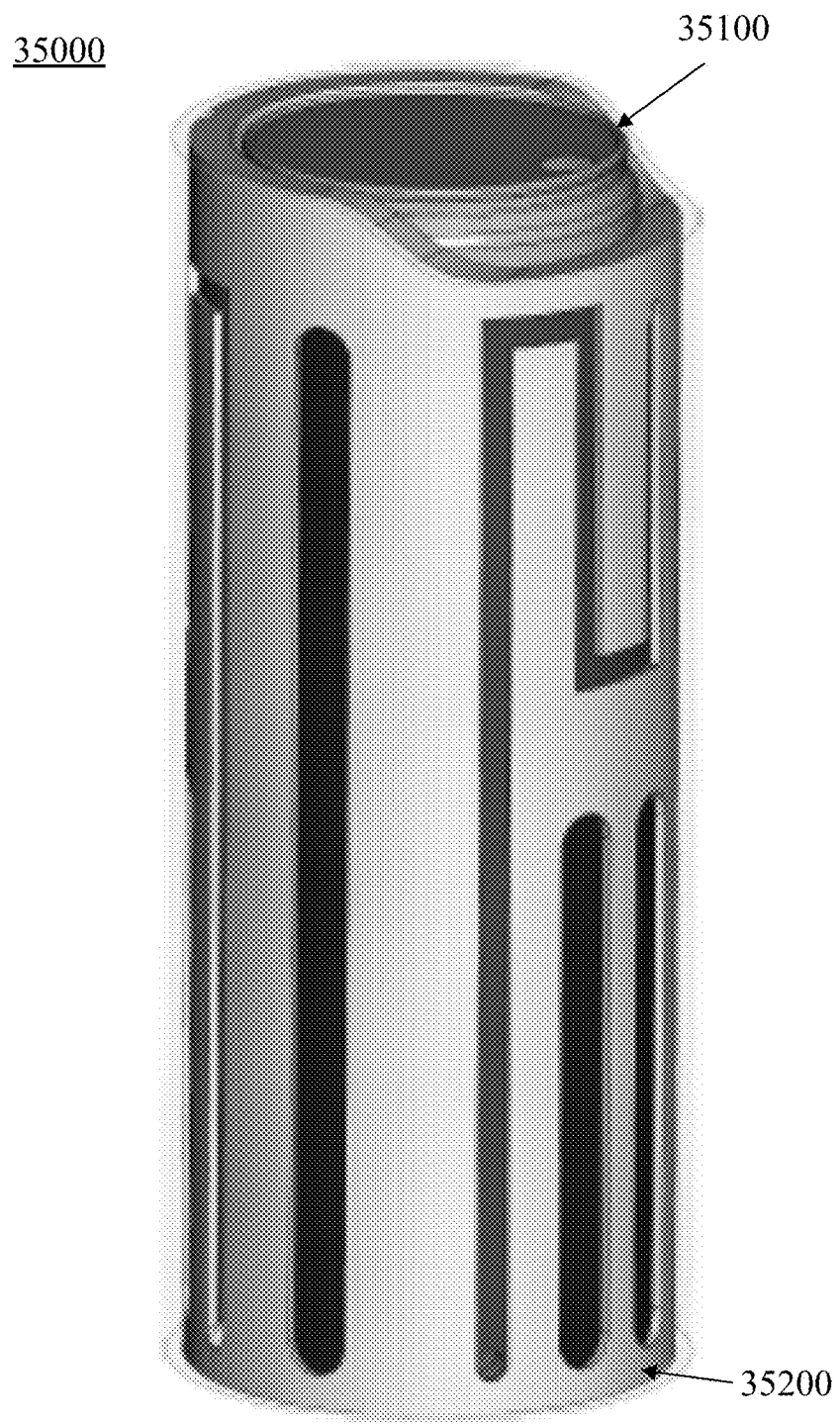

FIG. 35 is a cutaway view of an exemplary embodiment of a system 35000, which comprises a beverage container 35100 and an insulated sleeve 35200.

Figure 36:
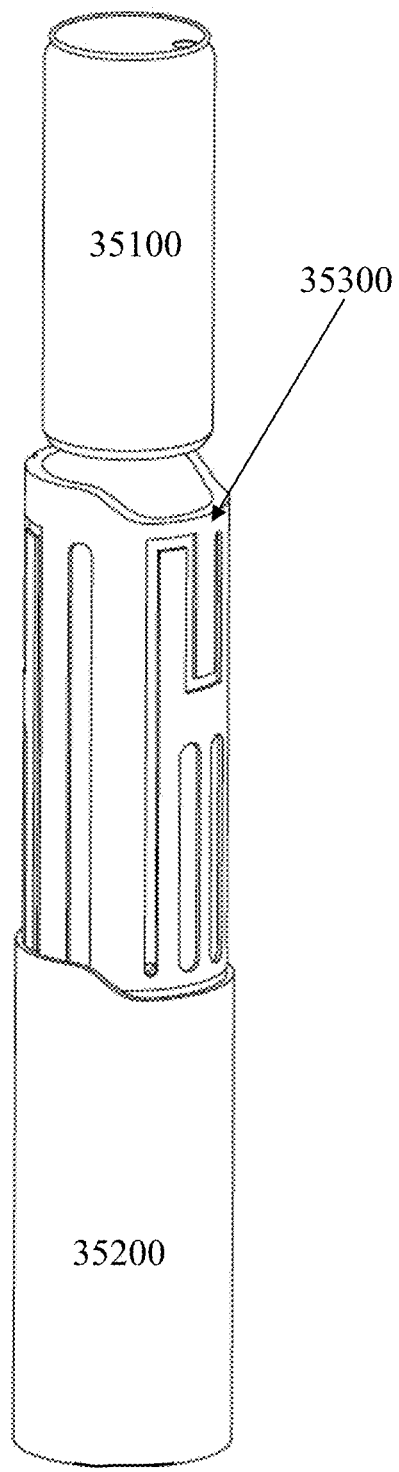
FIG. 36 is a diagram showing a exploded perspective view of exemplary system 35000.

FIG. 36 is a diagram showing an exploded perspective view of exemplary system 35000, which comprises a beverage container 35100 and an insulated sleeve 35200. Insulated sleeve 35200 defines a straw path outlet 35300.

Figure 37:
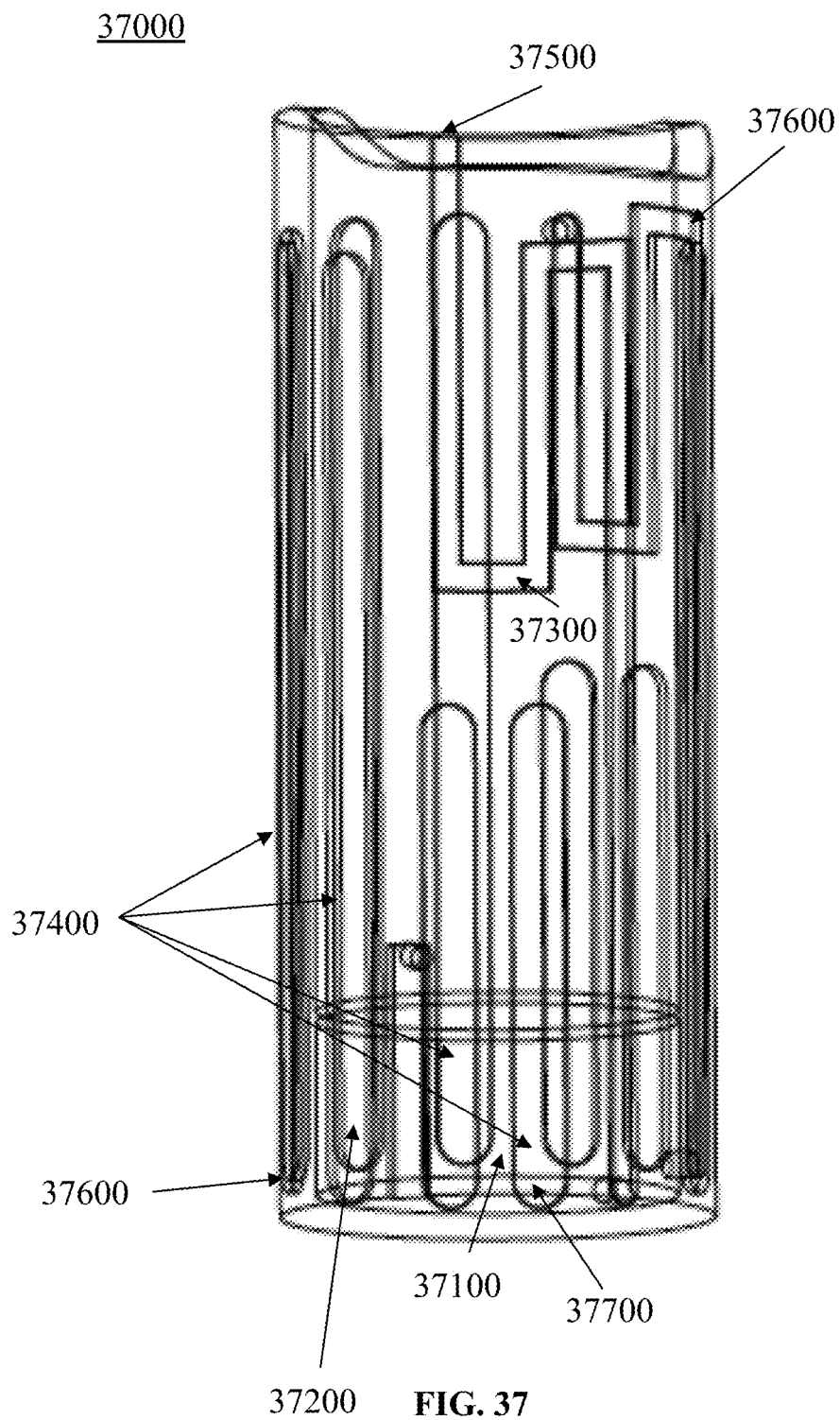
FIG. 37 is a semi-transparent side view of an exemplary embodiment of an insulated sleeve 37000.

FIG. 37 is a semi-transparent side view of an exemplary embodiment of an insulated sleeve 37000. Insulated sleeve 37000 can be utilized as insulated sleeve 35200 of FIG. 35 and FIG. 36. Inner wall 37100 defines a first air vent 37200, a second air vent 37300 for liquid pressure equalization, and a plurality of frozen gel chambers 37400. Insulated sleeve 37000 can be placed in a freezer to freeze gel comprised within the plurality of frozen gel chambers. With gel in the plurality of frozen gel chambers frozen, beverages containers placed in insulated sleeve 37000 are kept cold for an extended period of time. Insulated sleeve 37000 defines an air pressure relief 37500, a secret chamber air vent 37600, and a frozen gel chamber 37700. Certain exemplary embodiments can provide one or more apertures to draw liquid from each of an upper chamber and secret chamber.

Figure 37B:
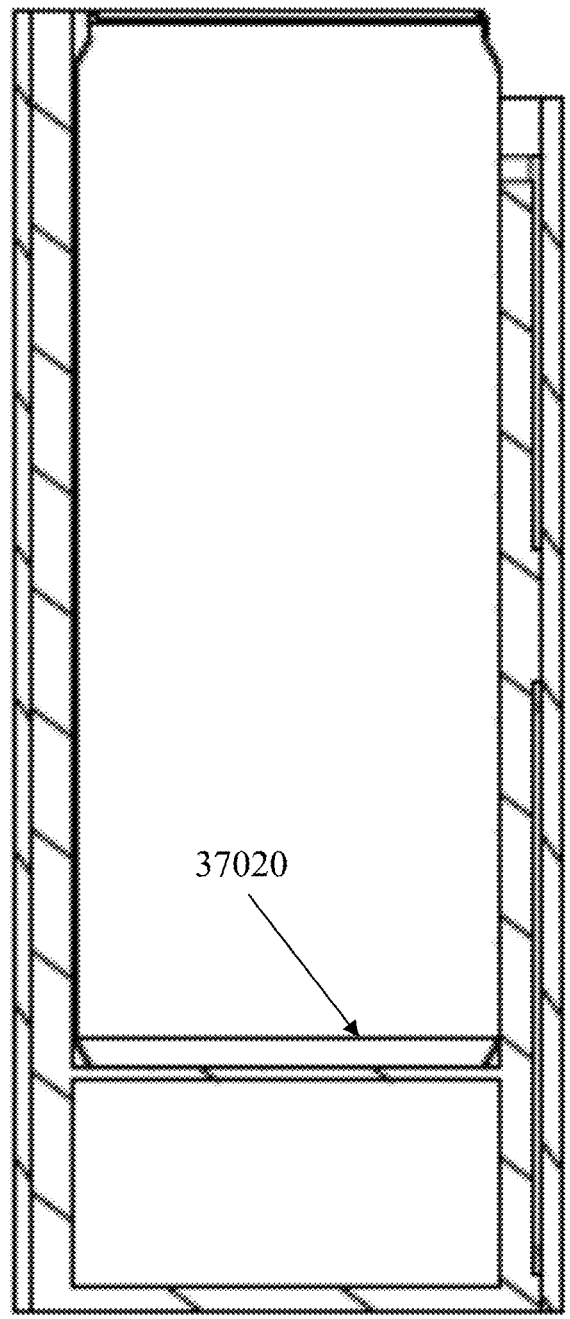
FIG. 37B is a cross-sectional side view of an exemplary embodiment of an insulated sleeve 37010.

FIG. 37B is a cross-sectional side view of an exemplary embodiment of an insulated sleeve 37010. A top divider 37020 hides a secret chamber underneath.

Figure 38:
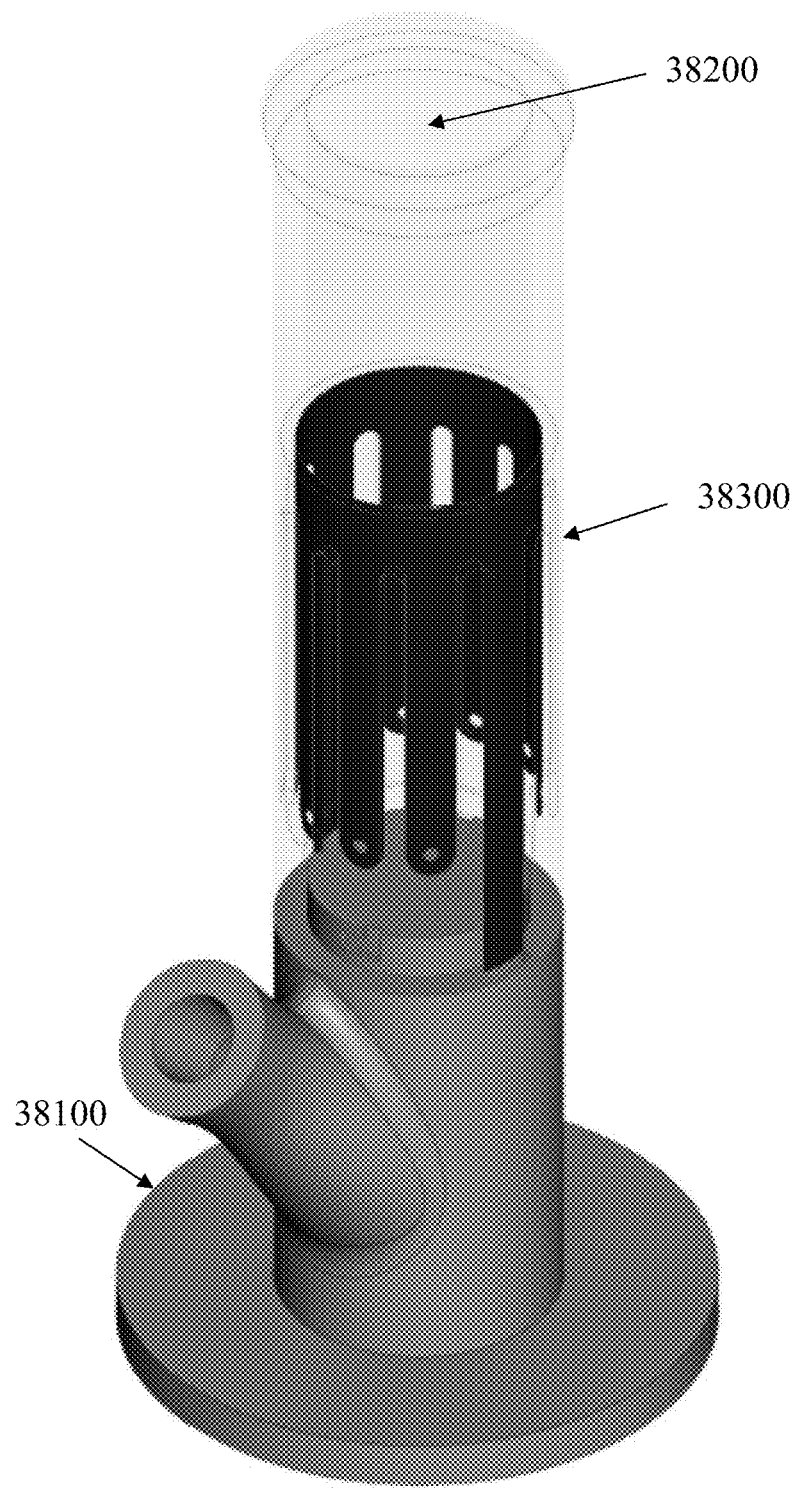

FIG. 38 is a diagram of a perspective view of an exemplary embodiment of a fluid pipe 38000 showing negative space relief passages, which fluid pipe is assembled from sections via a threaded coupling. Fluid pipe 38000 comprises a base section 38100 and an outlet section 38200. Outlet section 38200 can comprise and/or be coupled to a negative space relief section 38300.

Figure 39:
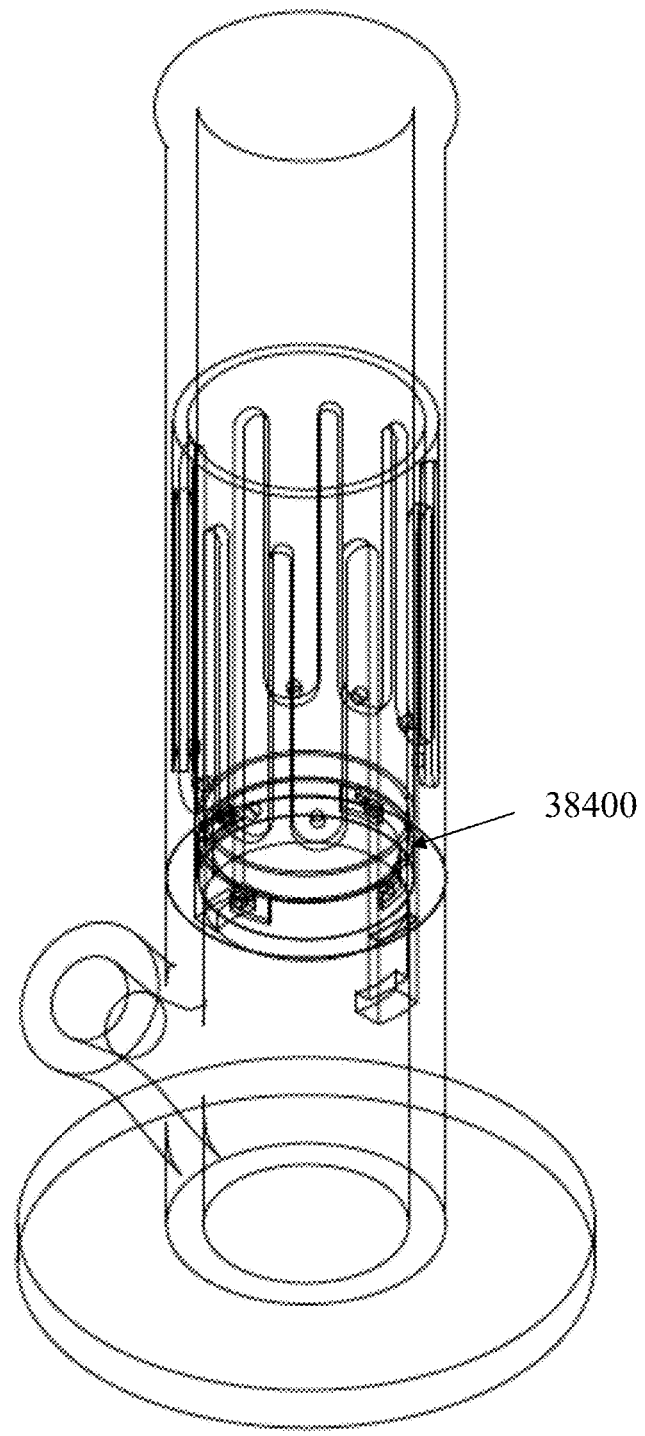
FIG. 39 is a diagram of a semi-transparent perspective view of fluid pipe 38000.

FIG. 39 is a diagram of a semi-transparent perspective view of fluid pipe 38000, which illustrates a threaded coupling 38400 that is used to assemble sections of fluid pipe 38000.

Figure 40:
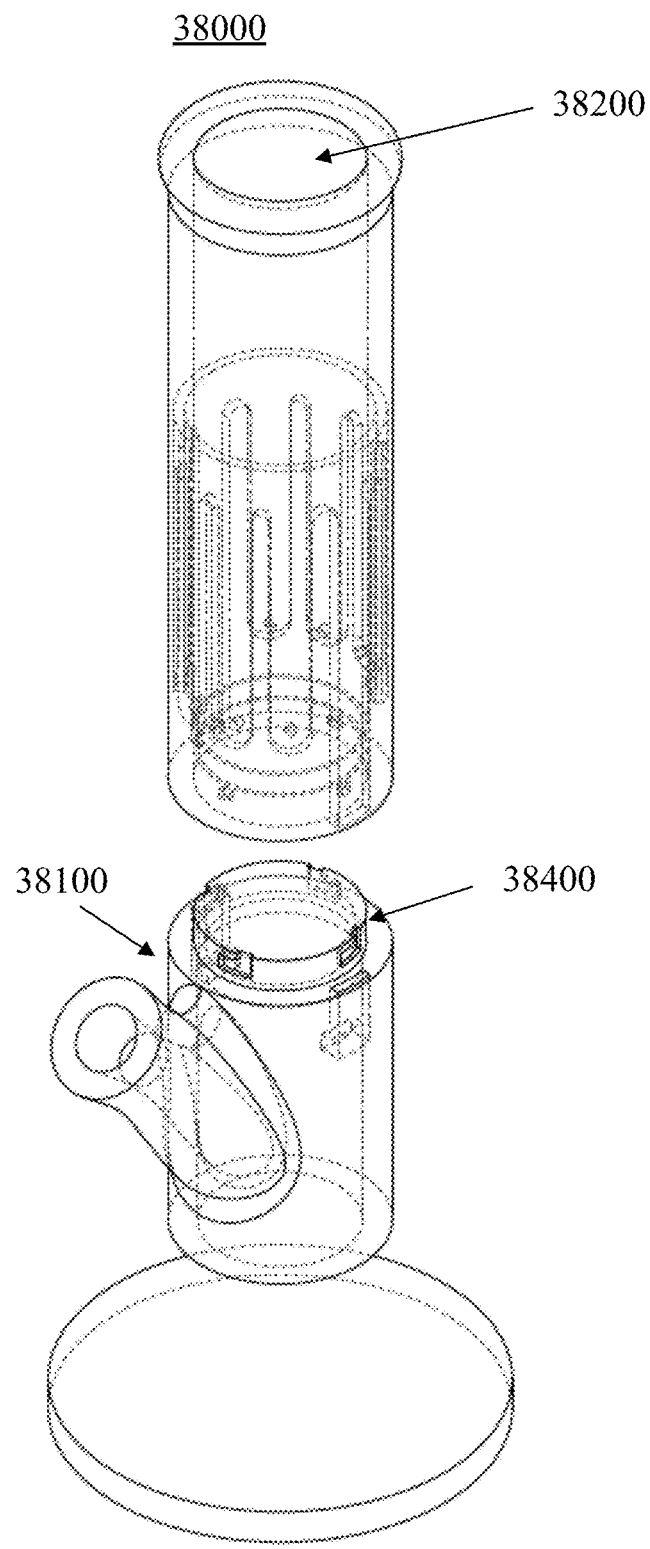
FIG. 40 is a semi-transparent exploded diagram of a side view of fluid pipe 38000.

FIG. 40 is a semi-transparent exploded diagram of a side view of fluid pipe 38000, which illustrates base section 38100 and outlet section 38200 disassembled. Threaded coupling 38400 is illustrated in separated form.

Figure 41:
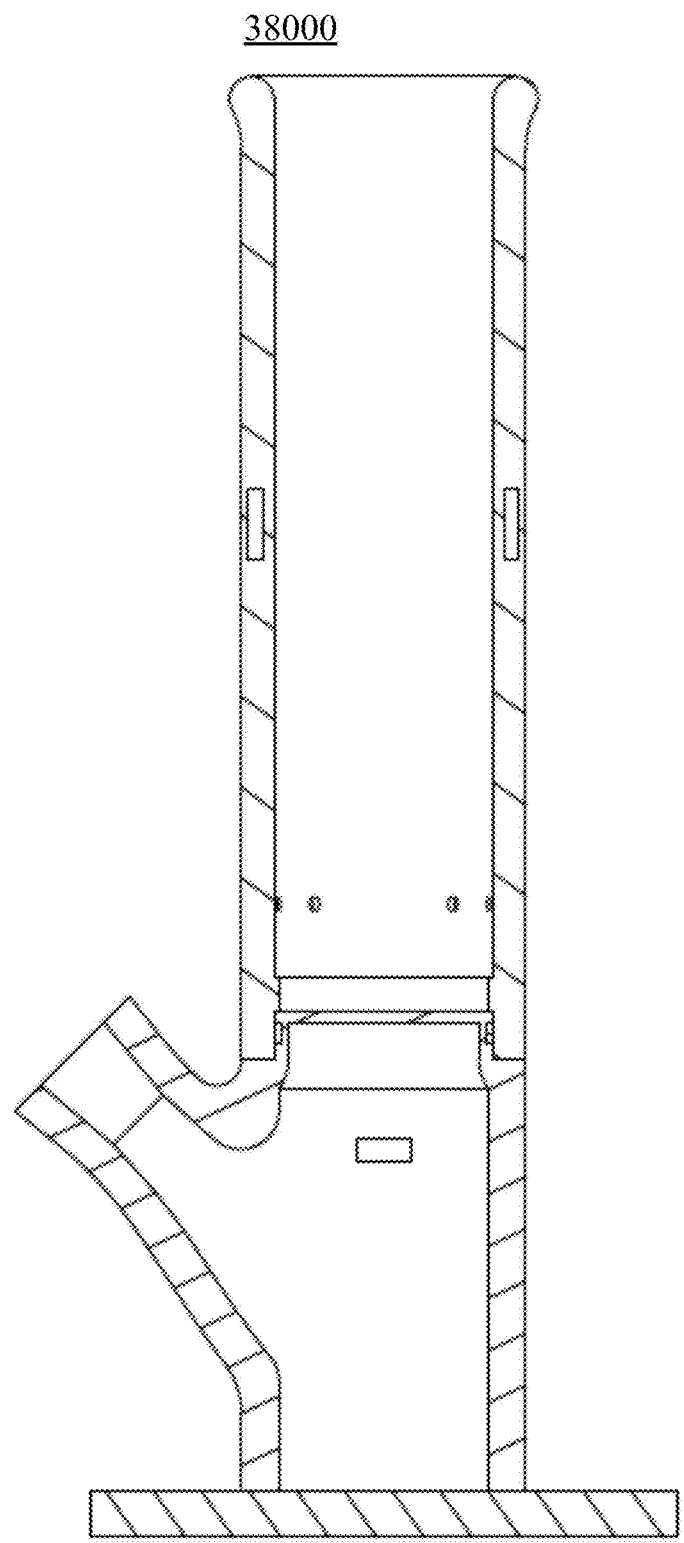
FIG. 41 is a diagram of a cross-sectional side view of fluid pipe 38000.

FIG. 41 is a diagram of a cross-sectional side view of fluid pipe 38000.

Figure 41B:
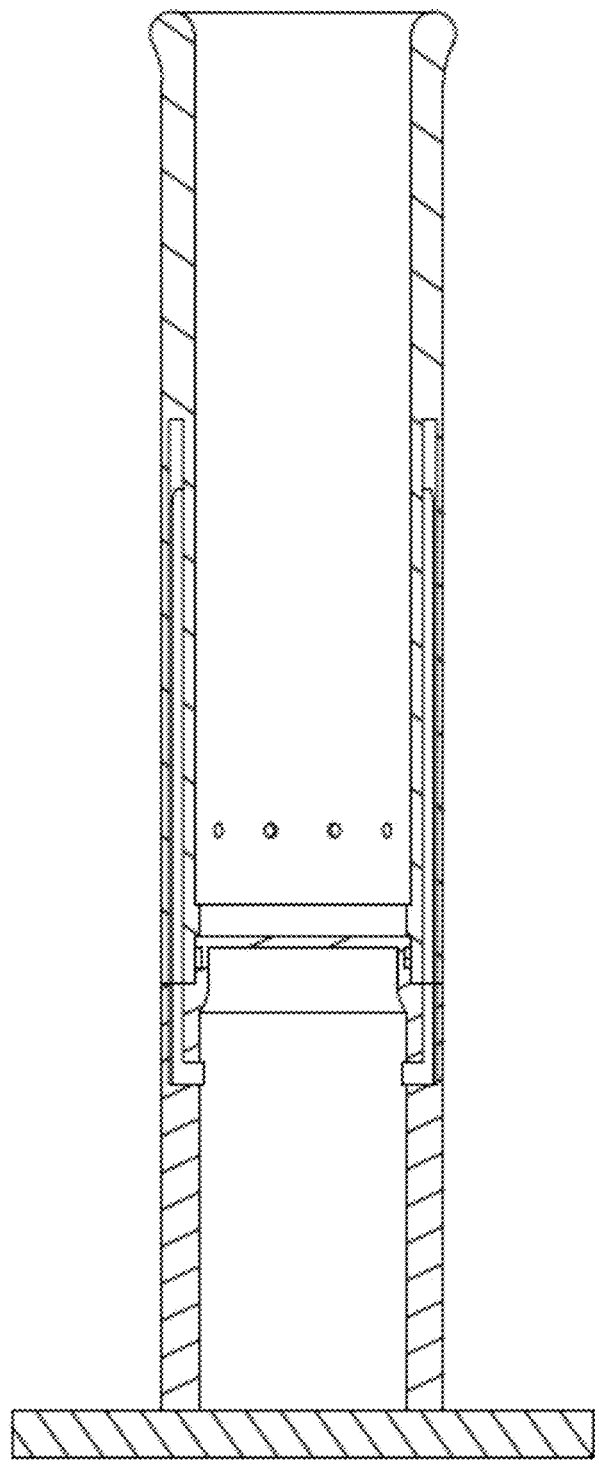
FIG. 41B is a diagram of a cross-sectional back view of fluid pipe 38000.

FIG. 41B is a diagram of a cross-sectional back view of fluid pipe 38000.

Figure 42:
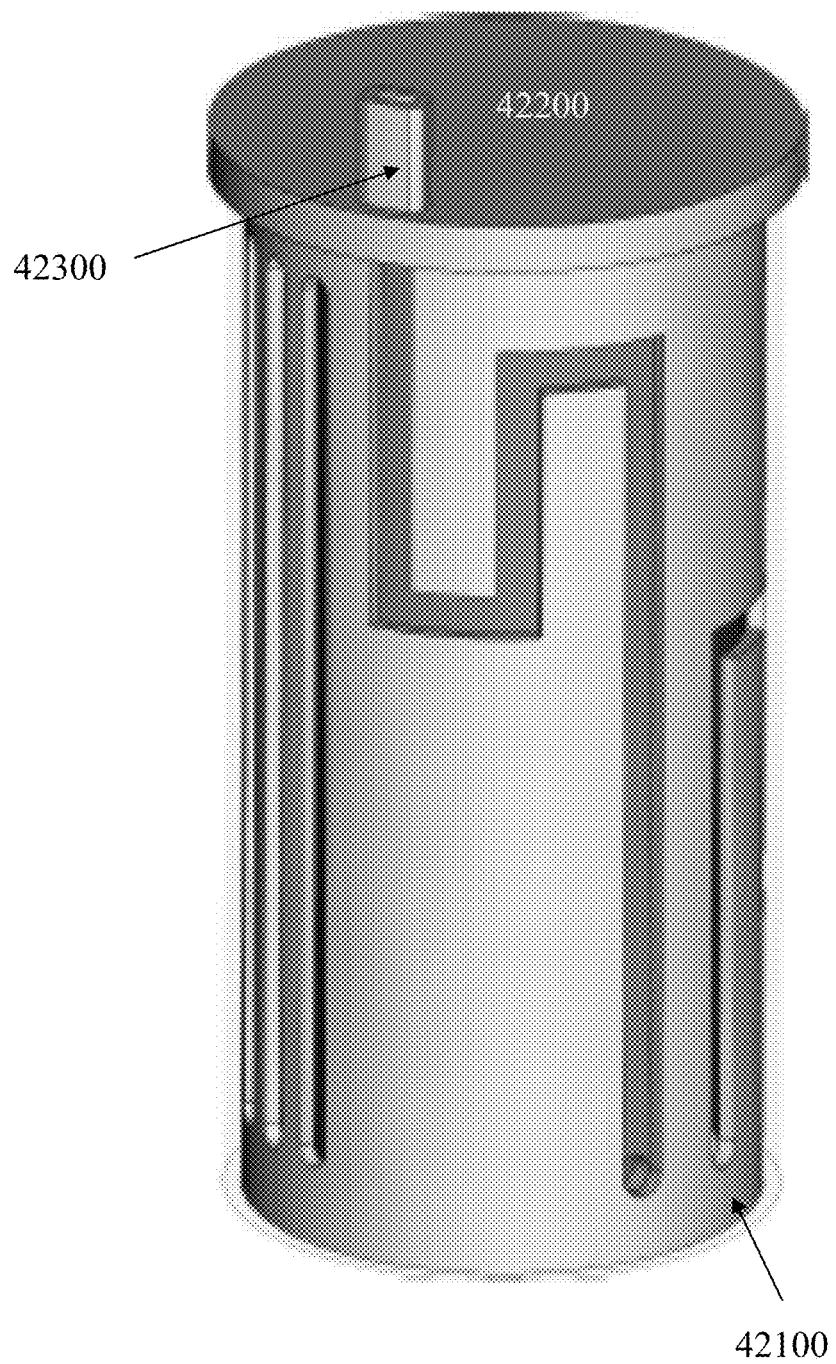

FIG. 42 is a diagram showing a perspective cutaway view of an exemplary embodiment of secret cup 42000, which comprises a base 42100 and a removable lid 42200. Lid 42200 comprises a straw 42300.

Figure 43:
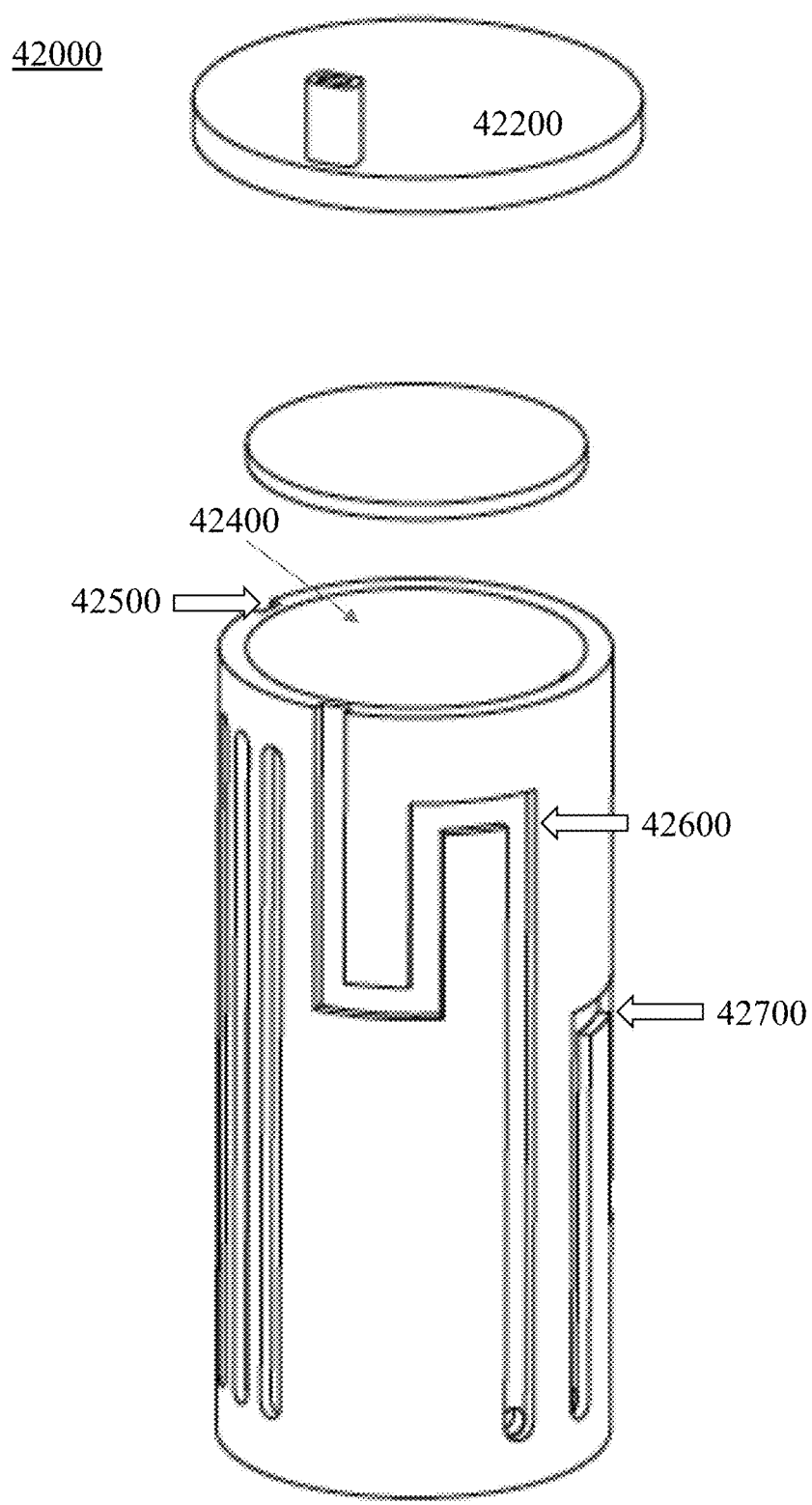
FIG. 43 is a diagram showing a perspective view of an exemplary embodiment of an exploded view of a secret cup 42000.

FIG. 43 is a diagram showing a perspective view of an exemplary embodiment of an exploded view of secret cup 42000. Lid 42200 can rotate to access a main chamber 42400. A straw path 42500 allows a user to add and/or withdraw fluid from the cup. A secret straw path 42600 allows a user to add and/or withdraw fluid from the cup. A pressure relief vent 42700 is constructed to mix a lower chamber into a main chamber of cup 42000.

Figure 44:
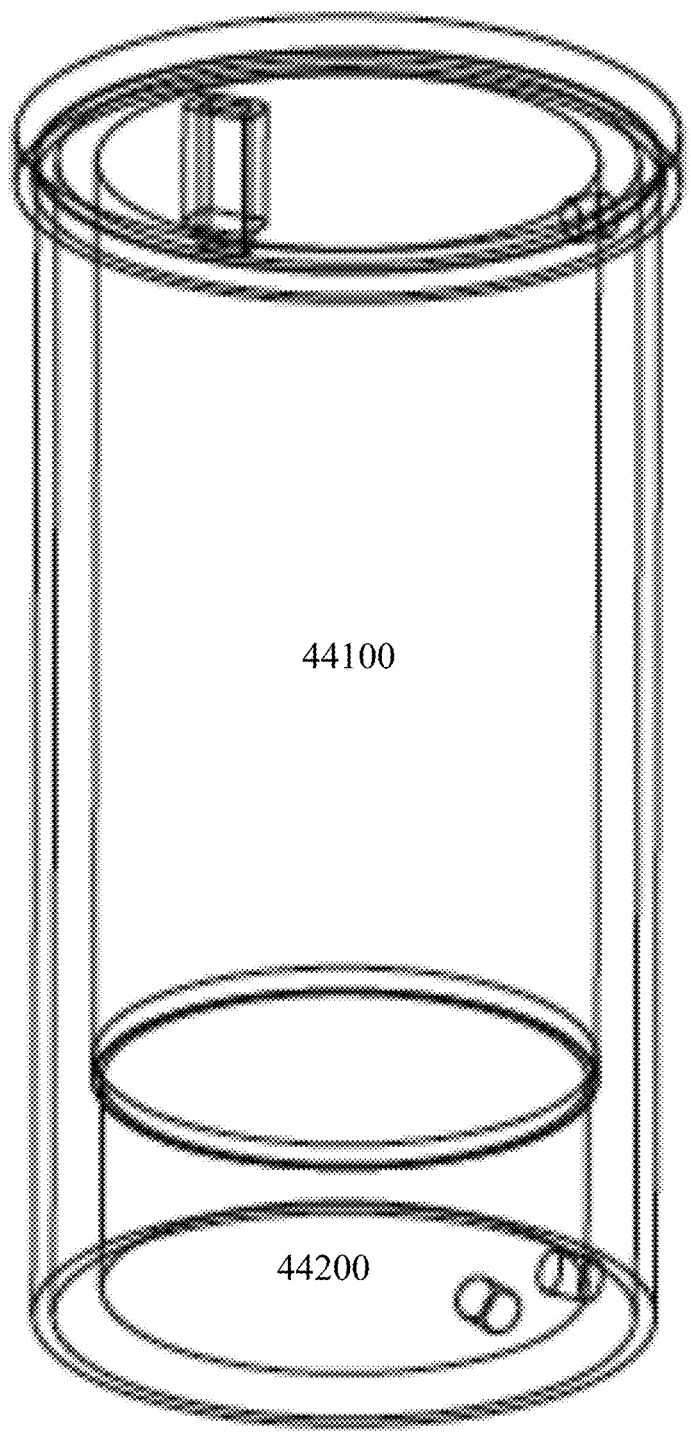
FIG. 44 is a diagram showing a perspective view of an exemplary embodiment of a transparent view of a secret cup 44000.

FIG. 44 is a diagram showing a perspective view of an exemplary embodiment of a transparent view of a secret cup 44000, which defines a main chamber 44100 and a secret chamber 44200.

Figure 45:
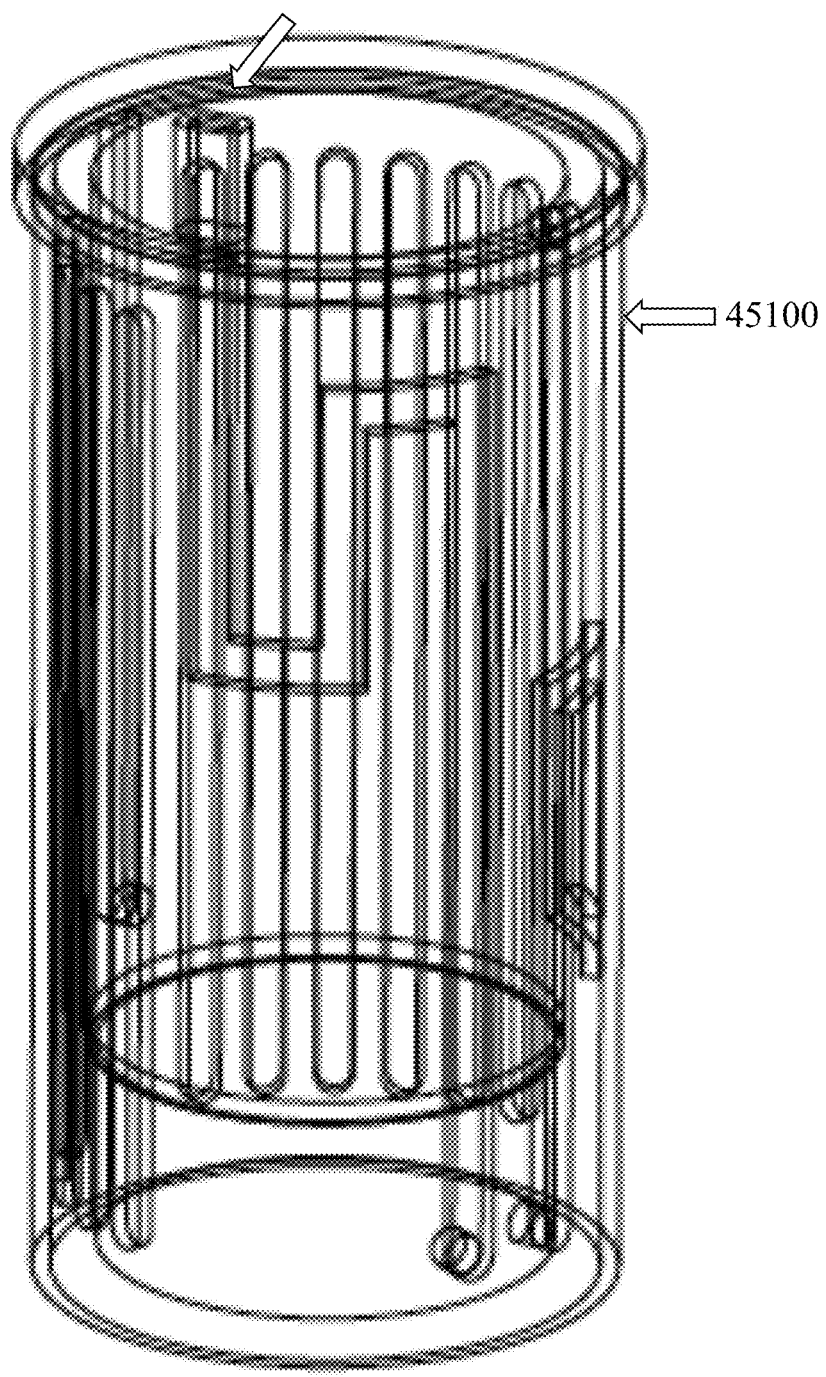
FIG. 45 is a semi-transparent perspective view of an exemplary embodiment of a secret cup 45000 without an outer sleeve.

FIG. 45 is a semi-transparent perspective view of an exemplary embodiment of a secret cup 45000 without an outer sleeve. Secret cup 45000 comprises pressure relief vent 45100 and defines a main chamber fluid path 45200.

Figure 46:
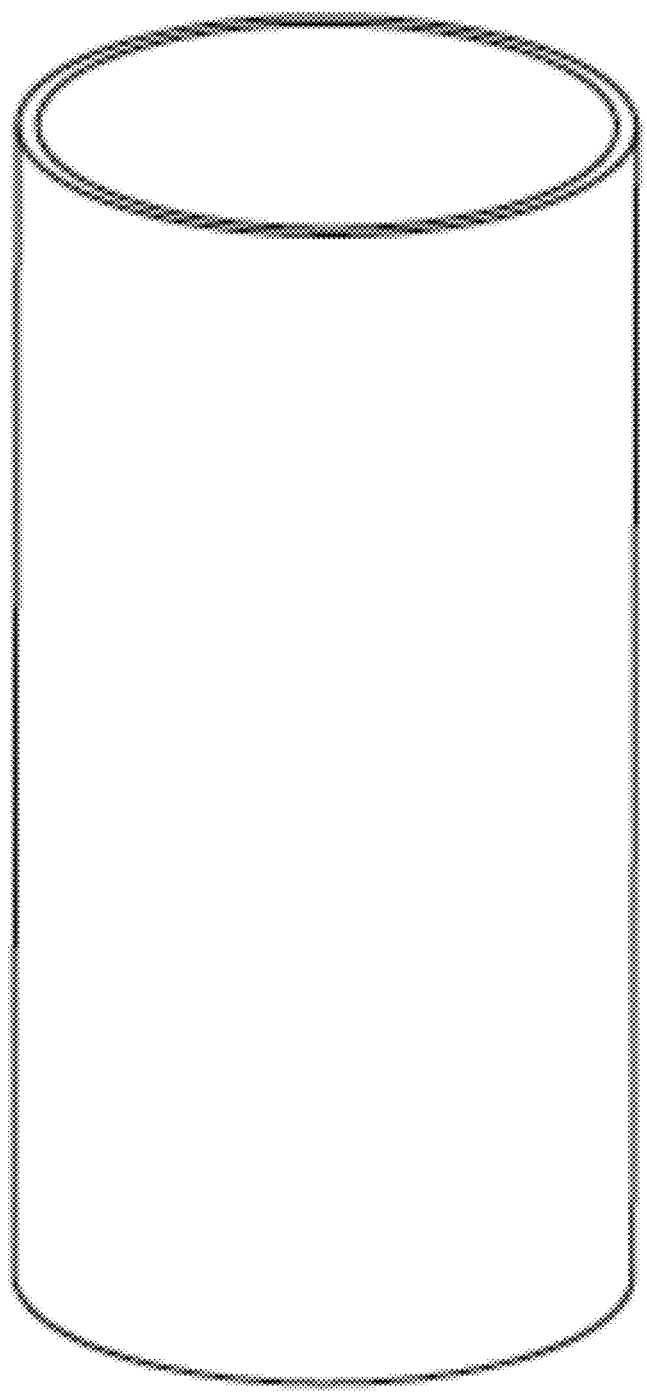
FIG. 46 is a perspective view of an exemplary embodiment of a cup outer sleeve 46000.

FIG. 46 is a perspective view of an exemplary embodiment of a cup outer sleeve 46000.

Figure 47:
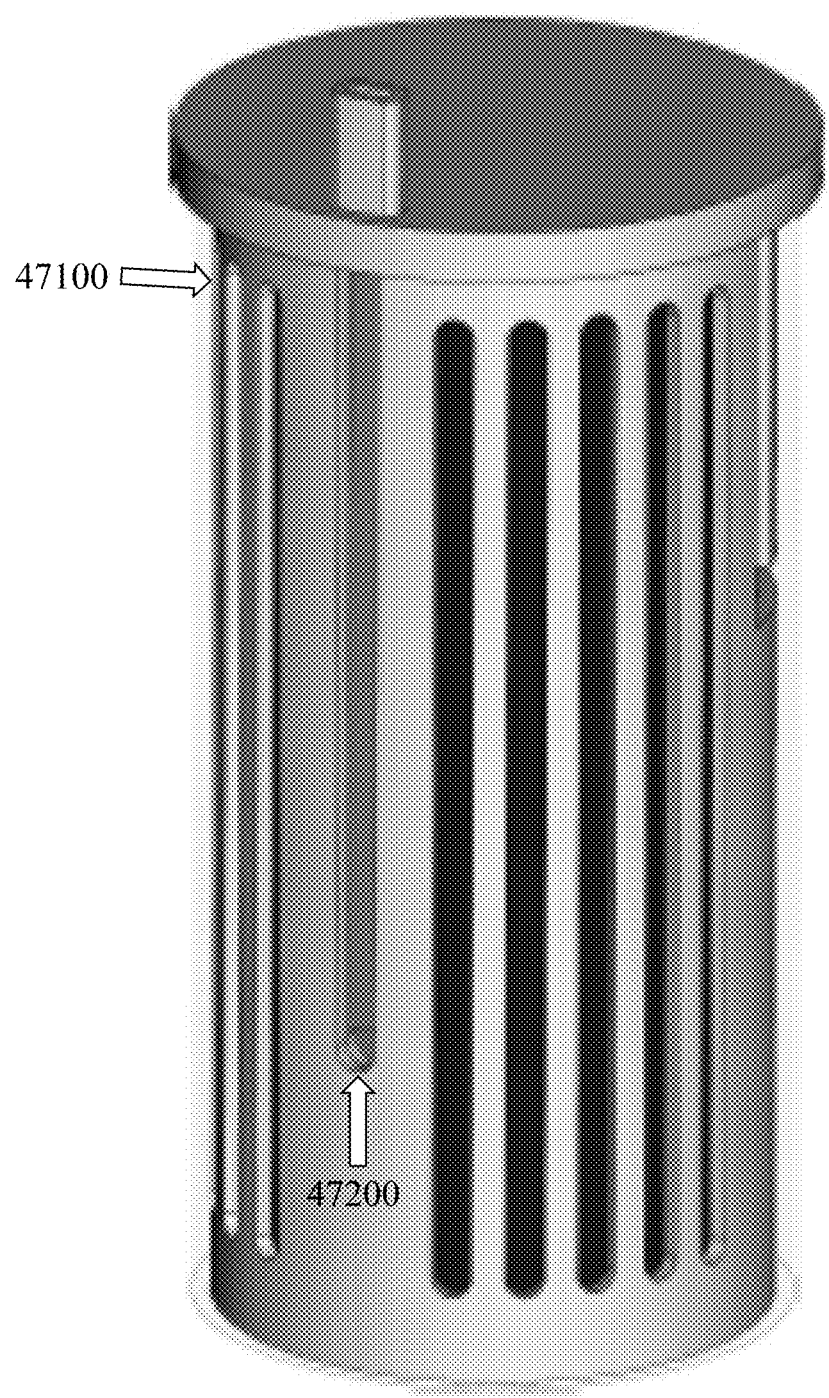

FIG. 47 is a perspective view of an exemplary embodiment of a secret cup 47000 without an outer sleeve, which defines a gel chamber 47100 and a straw for the main chamber 47200.

Figure 48:
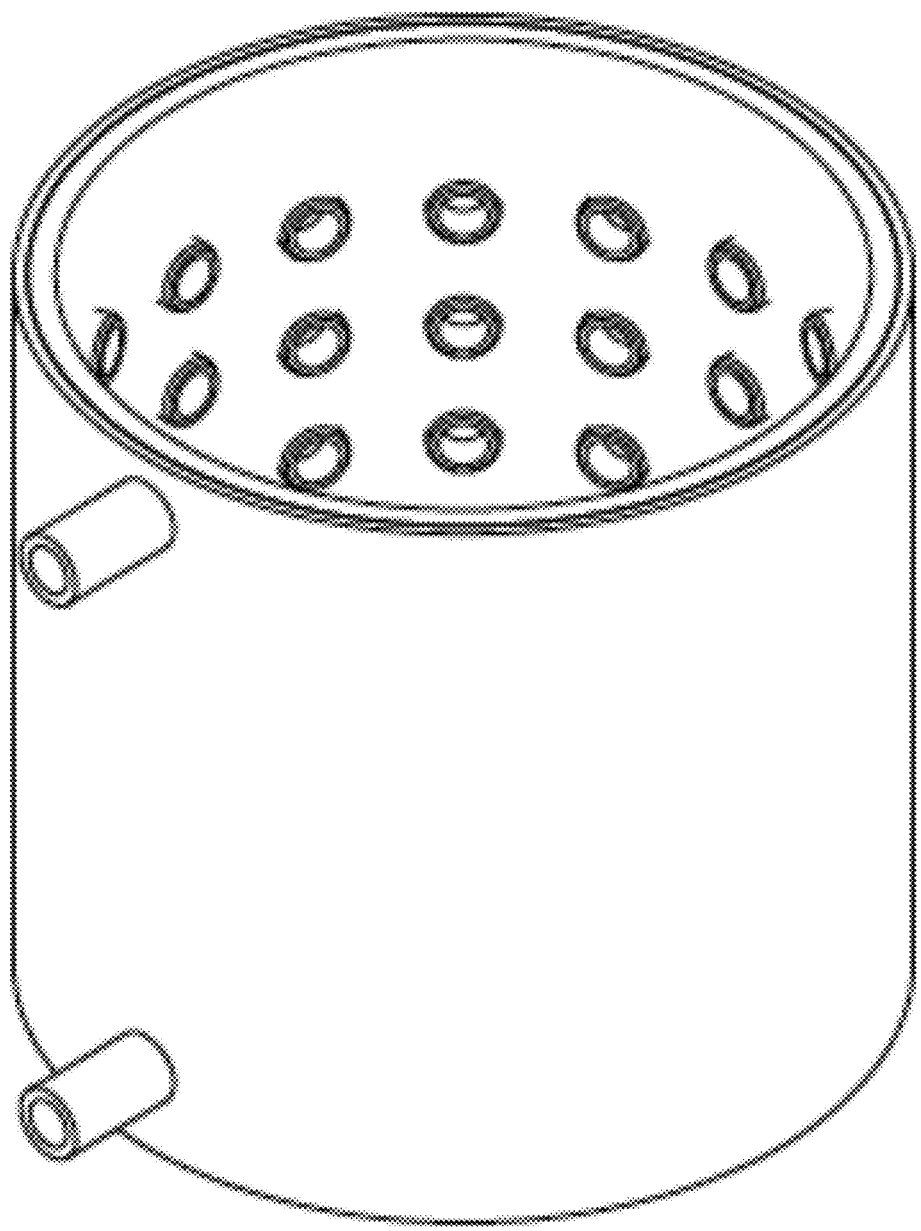
FIG. 48 is a perspective view of an exemplary embodiment of a watering, water flushing, and/or aeration bucket 48000.

FIG. 48 is a perspective view of an exemplary embodiment of a watering, water flushing, and/or aeration bucket 48000. The water flushing aeration bucket defines gas/liquid passages. Water flushing aeration bucket 48000 can be used in horticulture and is constructed for aerating liquids. Tubes can be arranged in water flushing aeration bucket 48000 to thoroughly mix gases and liquids in the vessel. Certain exemplary embodiments comprise a coupling constructed for use with a water hose and/or water pump. Gas/liquid passages are defined between inner and outer walls of water flushing aeration bucket 48000. Apertures defined in the inner wall of water flushing aeration bucket 48000 provide pathways for air delivery to a liquid held in water flushing aeration bucket 48000. Tubes can be added to an interior of water flushing aeration bucket 48000 to distribute air more evenly throughout liquid contained within water flushing aeration bucket 48000.

Figure 49:
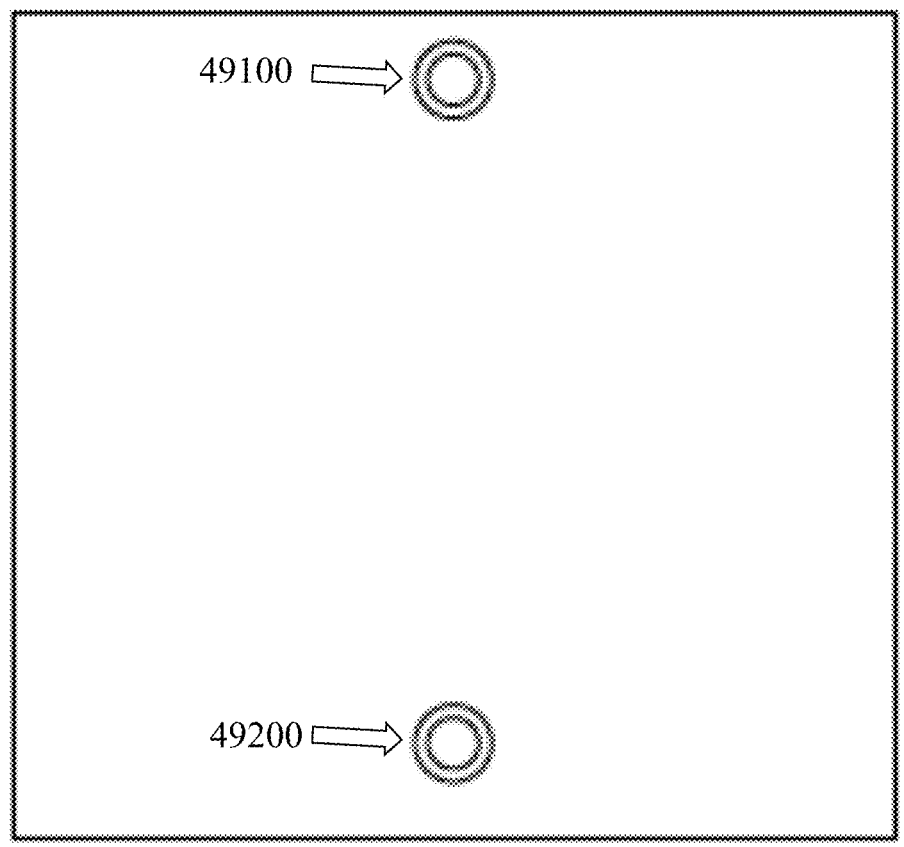
FIG. 49 is a side view of an exemplary embodiment of water flushing aeration bucket 49000.

FIG. 49 is a side view of an exemplary embodiment of water flushing aeration bucket 49000, which comprises a water inlet 49100 and an air inlet 49200.

Figure 50:
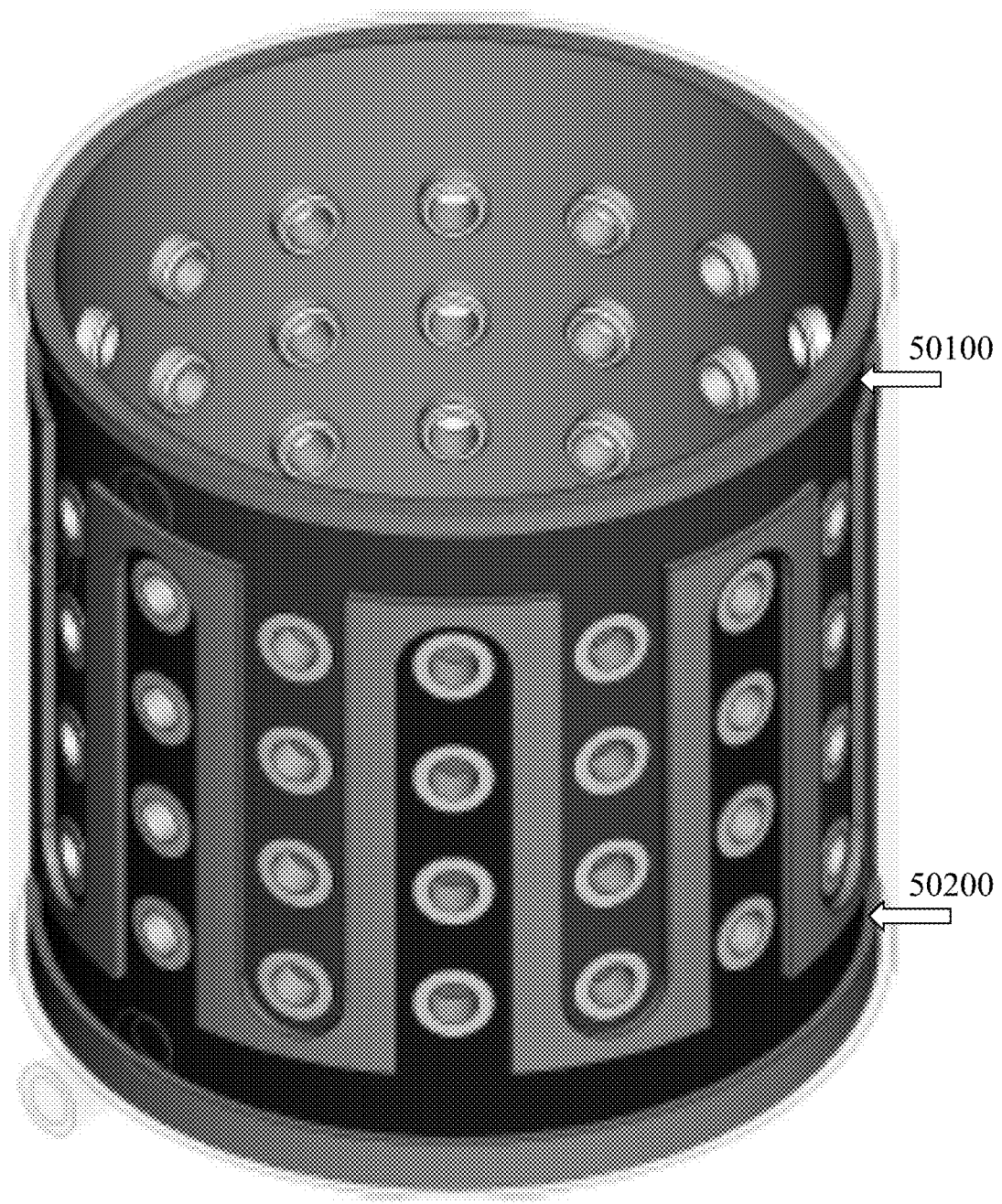

FIG. 50 is a perspective view of an exemplary embodiment of water flushing aeration bucket 50000 without an outer sleeve, which defines a water path 50100 and an air path 50200. Water path 50100 and air path 50200 are specific volume negative space relief elements created in accordance with one or more methods disclosed herein.

Figure 51:
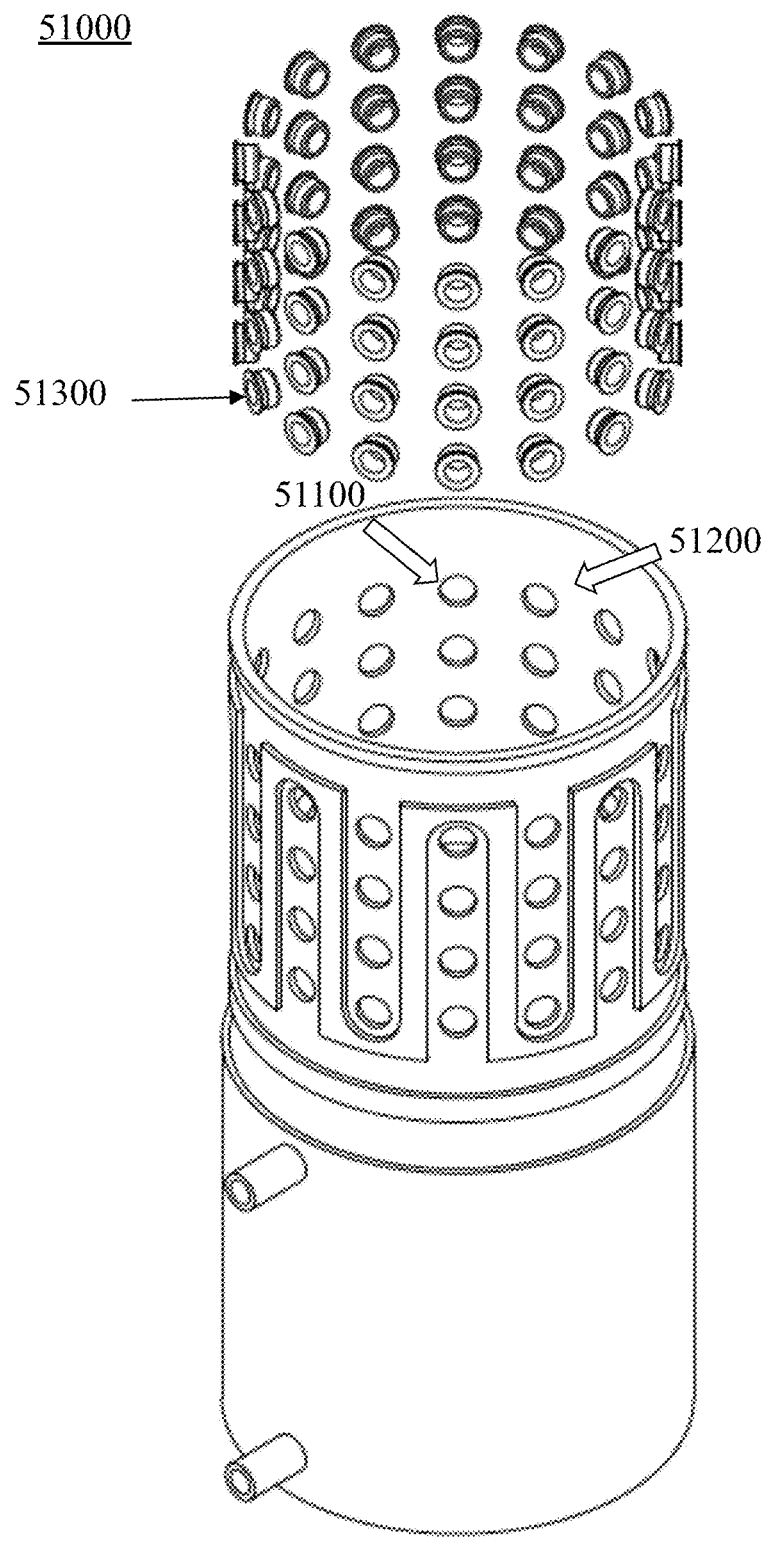
FIG. 51 is a block diagram showing an exploded perspective view of an exemplary embodiment of water flushing aeration bucket 51000.

FIG. 51 is a block diagram showing an exploded perspective view of an exemplary embodiment of water flushing aeration bucket 51000, which comprises air outlets 51100, water outlets 51200, and elastomer inserts 51300. Elastomer inserts 51300 can be added after production and are constructed for air and watertight hose connections.

Figure 52:
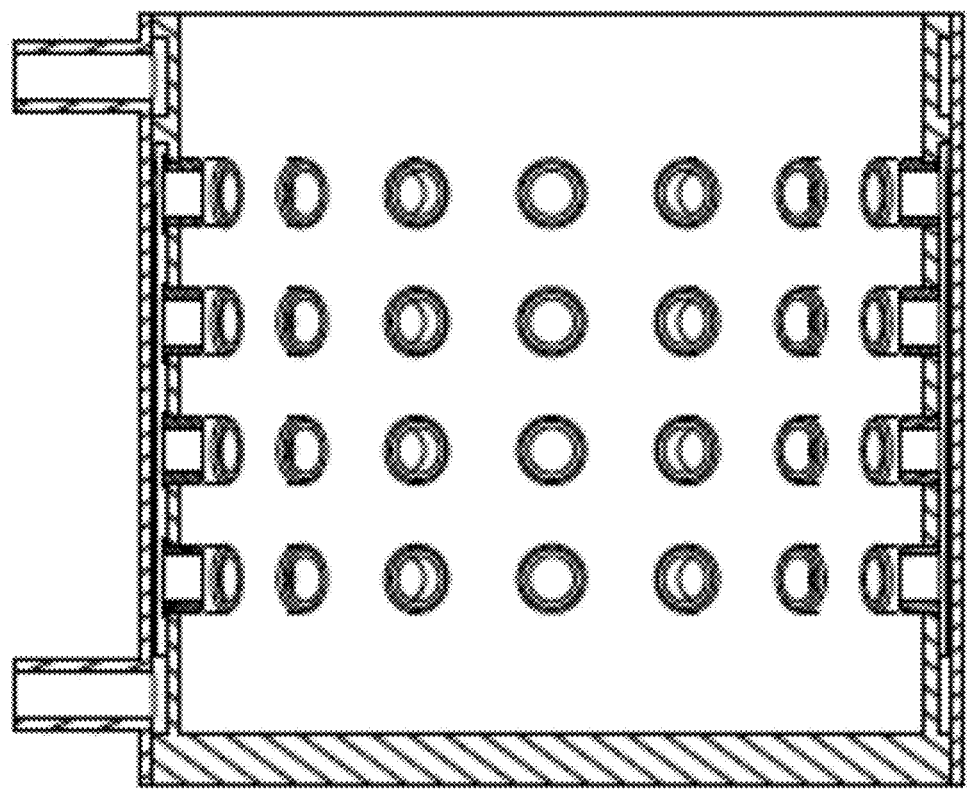
FIG. 52 is a cross-sectional side view of an exemplary embodiment of water flushing aeration bucket 52000.

FIG. 52 is a cross-sectional side view of an exemplary embodiment of water flushing aeration bucket 52000, which comprises both air and water ports.

Figure 52B:
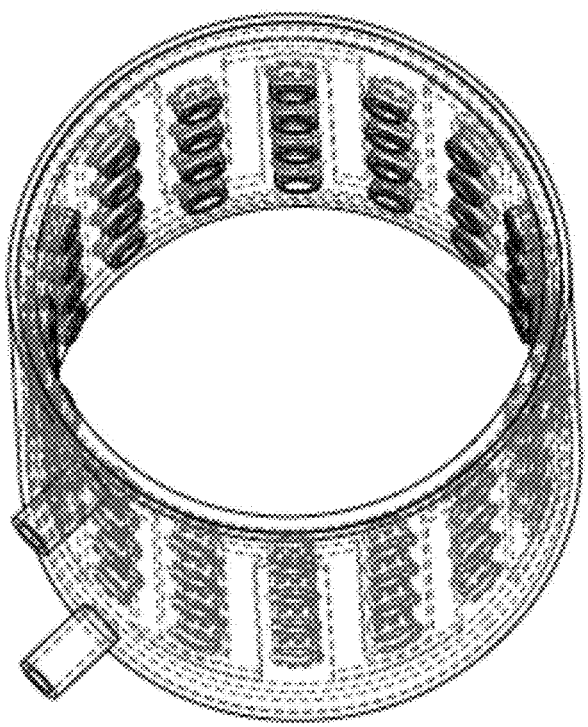
FIG. 52B is a semi-transparent perspective view of an exemplary embodiment of water flushing aeration bucket 52300.

FIG. 52B is a semi-transparent perspective view of an exemplary embodiment of water flushing aeration bucket 52300.

Figure 53:
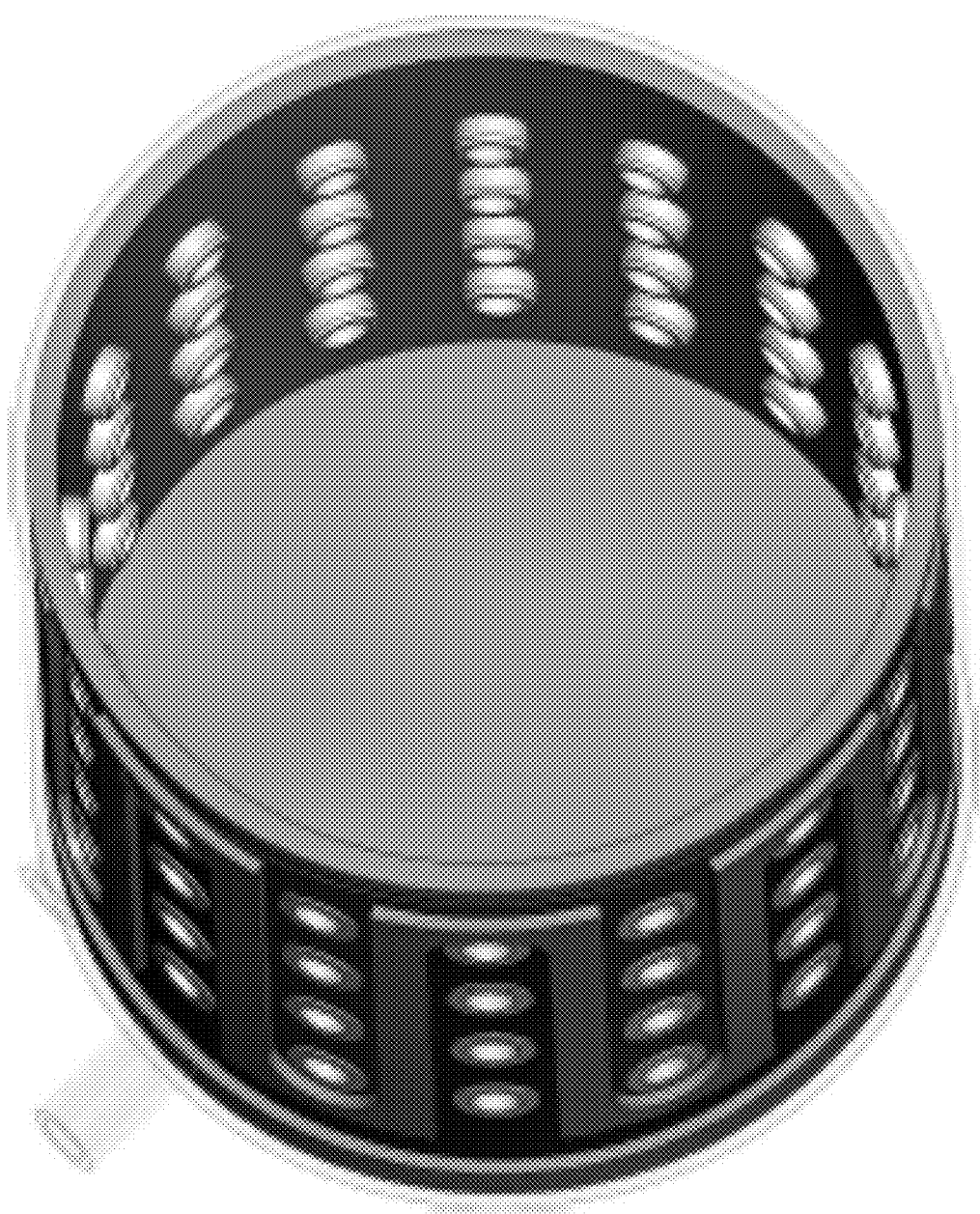

FIG. 53 is a perspective view of an exemplary embodiment of water flushing aeration bucket 52600 without an outer sleeve.

Figure 54:
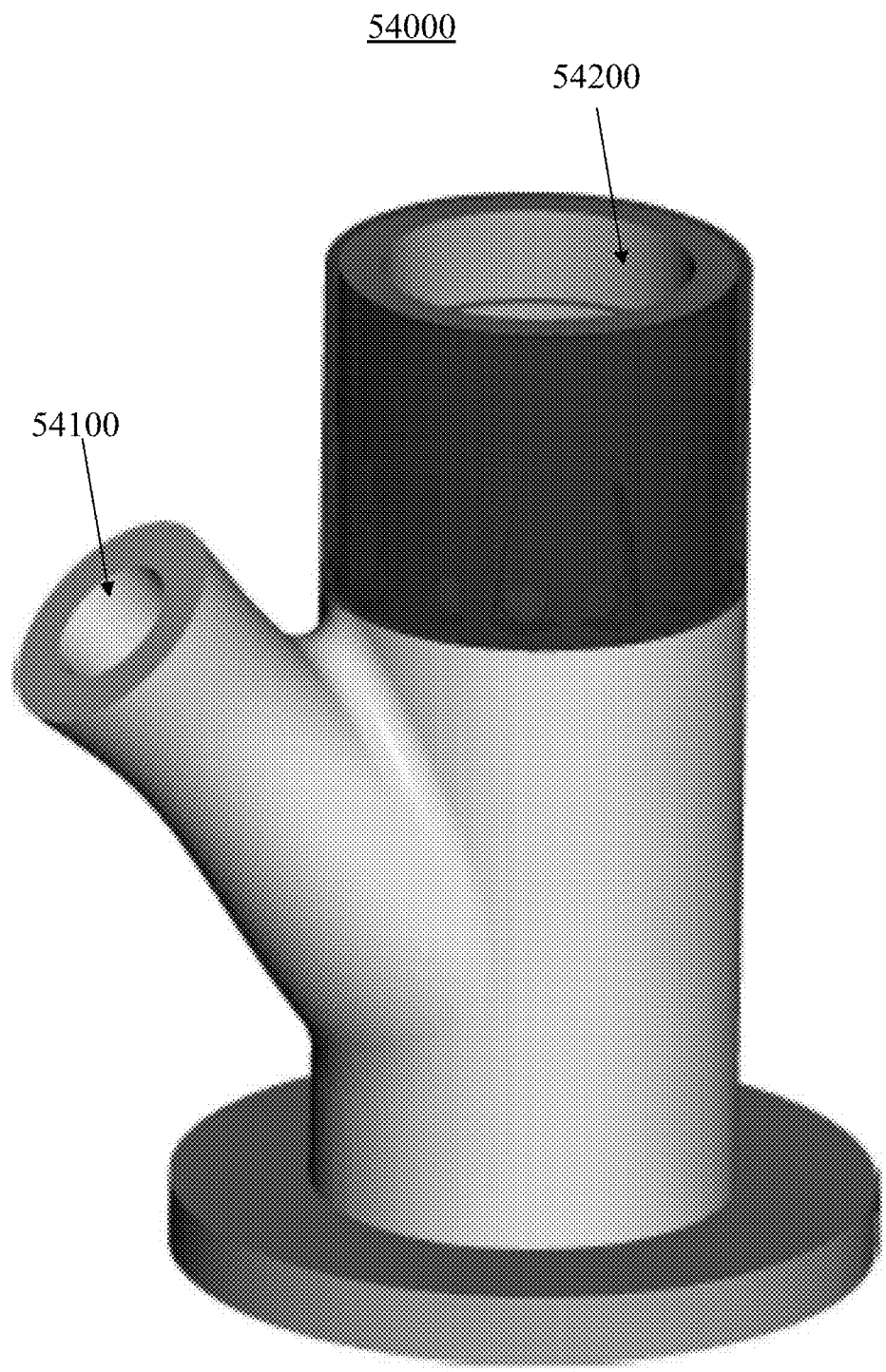

FIG. 54 is a diagram of a perspective view of an exemplary embodiment of a fluid pipe 54000, which comprises a smoke inlet 54100 and a filtered smoke outlet 54200.

Figure 55:
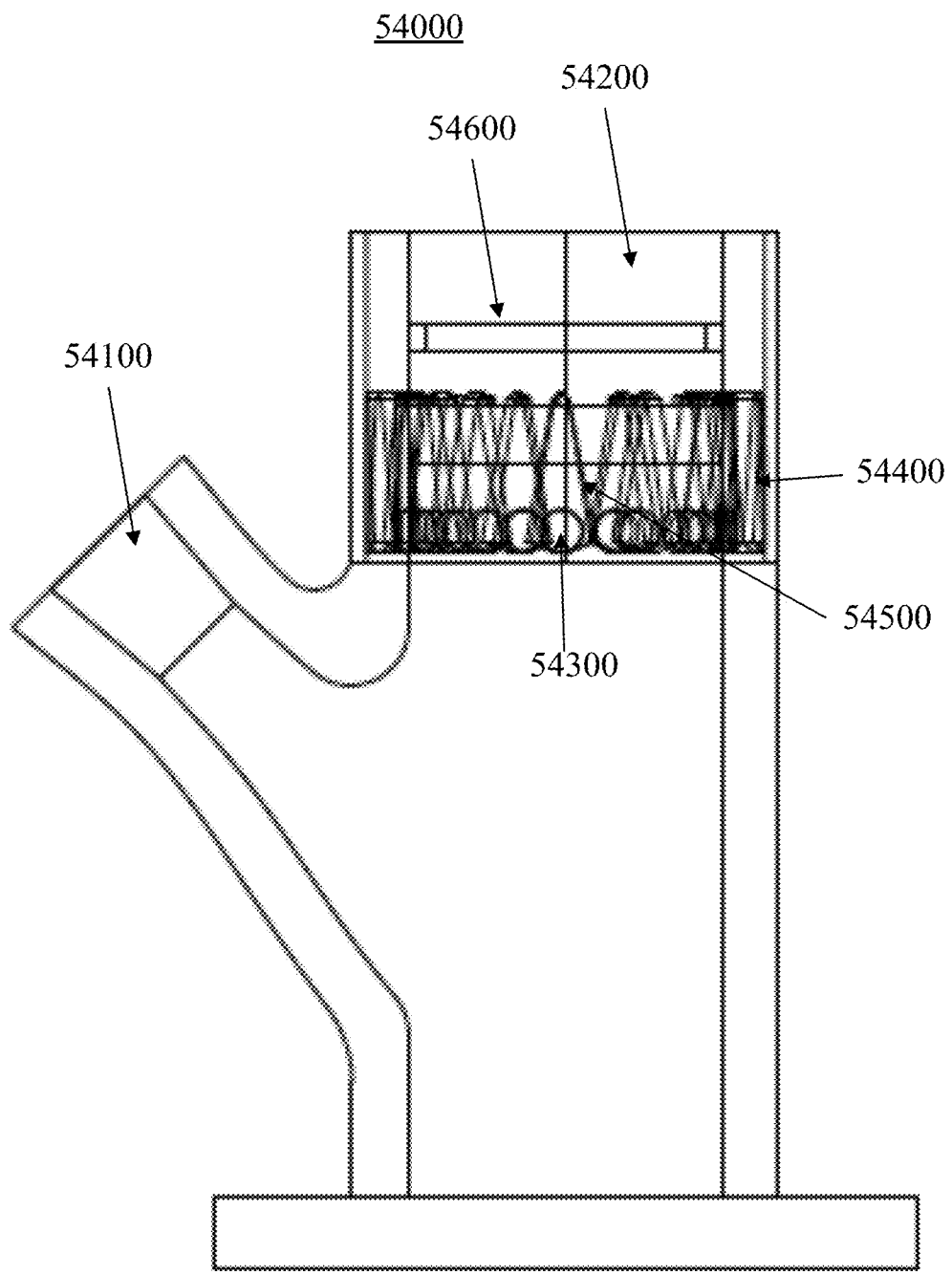
FIG. 55 is a diagram of a cross-sectional side view of exemplary fluid pipe 54000.

FIG. 55 is a diagram of a cross-sectional side view of exemplary fluid pipe 54000. Smoke entering smoke inlet 54100 is drawn through one or more apertures 54300 and negative space relief passages 54400. The smoke is filtered through a liquid held in reservoir 54500. Mist entrained in the filtered smoke is substantially removed via a mist separator 54600. The filtered smoke then passes to filtered smoke outlet 54200.

Figure 56:
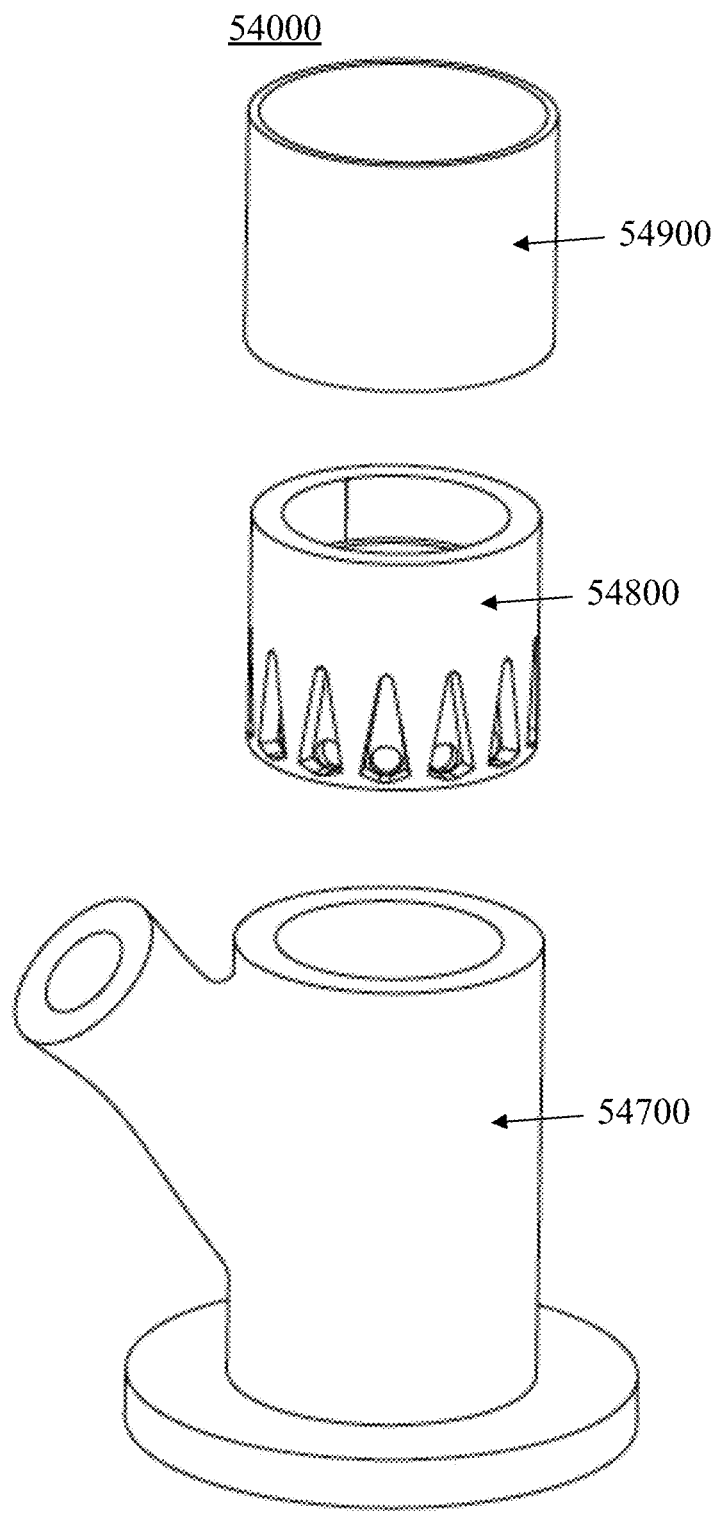
FIG. 56 is an exploded diagram of a perspective view of exemplary fluid pipe 54000.

FIG. 56 is an exploded diagram of a perspective view of exemplary fluid pipe 54000, which illustrates a three-piece construction. Fluid pipe 54000 comprises a base section 54700, a filtering section 54800, and an outlet section 54900.

Figure 57:
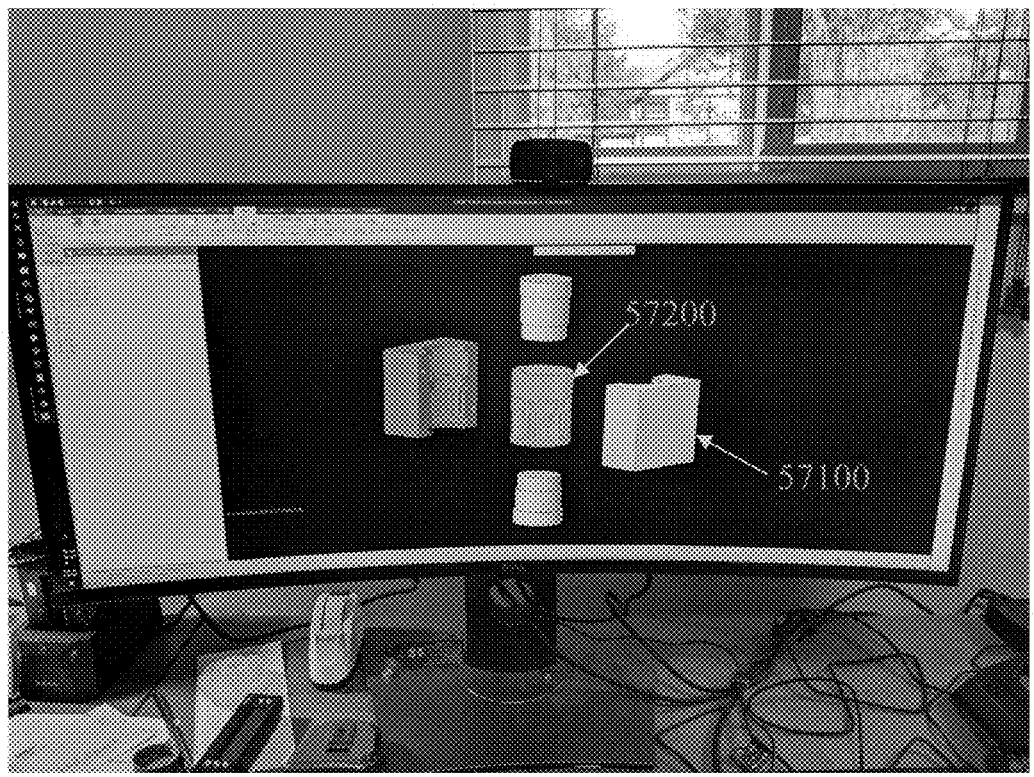

FIG. 57 is a photograph of a perspective view of an exemplary computer aided design ("CAD") 57000 of a mold 57100 and a vessel 57200 with a channel defined within the walls thereof. Such a vessel 57200 can be made via exemplary injection molding and/or compression molding processes as disclosed herein. Certain exemplary embodiments comprise a process that begins with CAD design of components.

Figure 58:
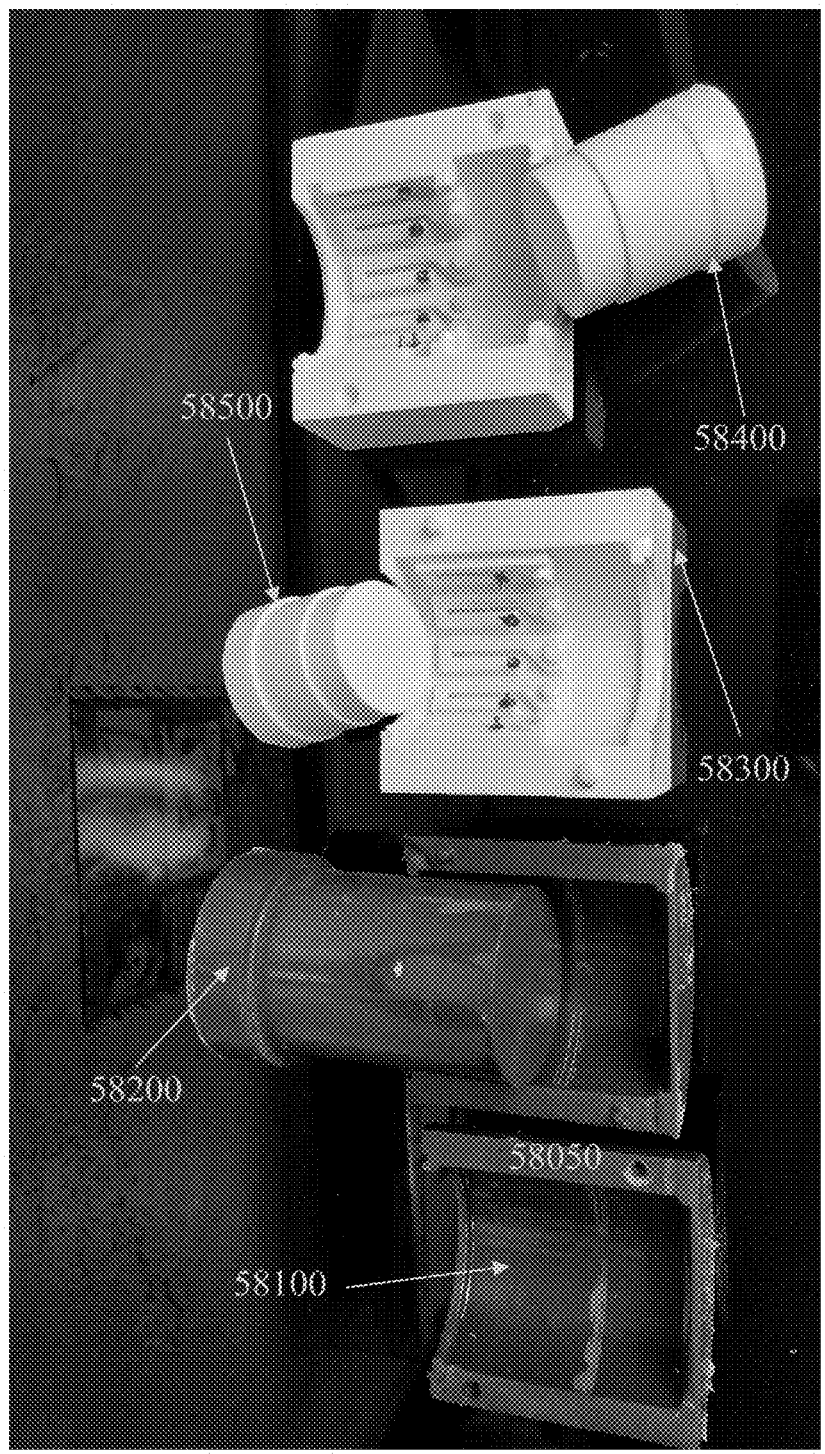

FIG. 58 is a photograph of a perspective view of an exemplary embodiment of a system 58000. System 58000 comprises first mold comprising a shell 58100 and a core 58200, which can be made via 3-D printing and/or CNC based upon a CAD design. In certain exemplary embodiments, components of system 58000 can comprise a silicone such as a Room-Temperature-Vulcanizing ("RTV") silicone. CNC applications can utilize Heat Transfer Vinyl ("HTV").

Silicone applications can utilize a process comprising:
mixing silicone;
degassing silicone under vacuum pressure;
injecting silicone;
curing silicone; and/or
removing and cleaning parts, etc.

Silicone parts can then be bonded with silicone prior to final curing. Some parts can be fixedly coupled such that nondestructive disassembly is not possible. Other parts are releasably coupled such that nondestructive disassembly is possible (e.g., to clean separate components).

Shell 58100 and/or core 58200 can be utilized as a mold 58050. Another illustrated mold 58300, a first core component 58400, a second core component 58500 of, for example, silicone can also be utilized as a mold. Via creation of a mold and utilizing an injection molding process and/or a compression molding process, components can be produced in relatively large quantities at a relatively low cost.

Figure 59:
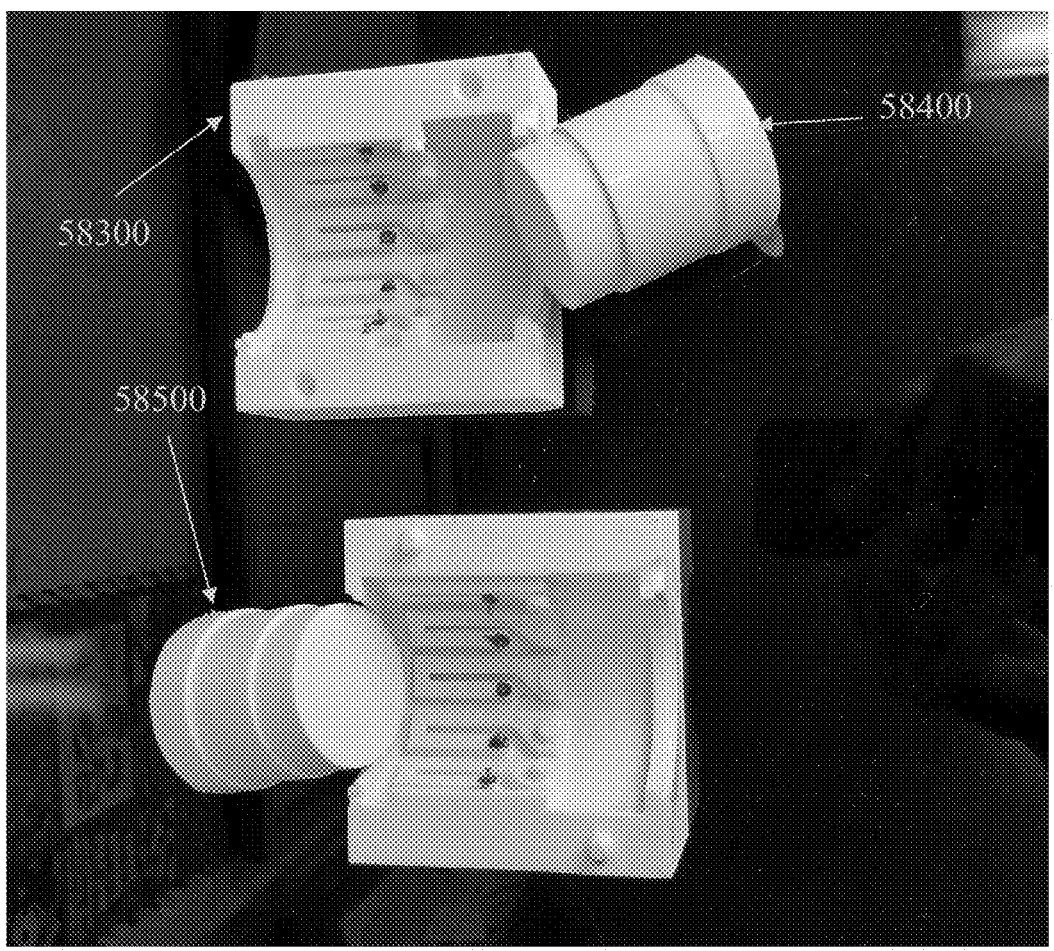

FIG. 59 is a photograph of a perspective view of an exemplary embodiment of a system 59000, which shows more detail of mold 58300, first core component 58400, and second core component 58500 of FIG. 58.

Figure 60:

FIG. 60 is a photograph of a perspective view of an exemplary embodiment of a system 60000, which comprises a catalyst 60200, a first rubber compound component 60300, a second rubber compound component 60400, and a syringe 60500. Syringe 60500 can be utilized to inject catalyzed and mixed rubber constituents into one or more molds to form silicone rubber components (e.g., inner body 61100 and outer shell 61200 of FIG. 61).

Figure 61:
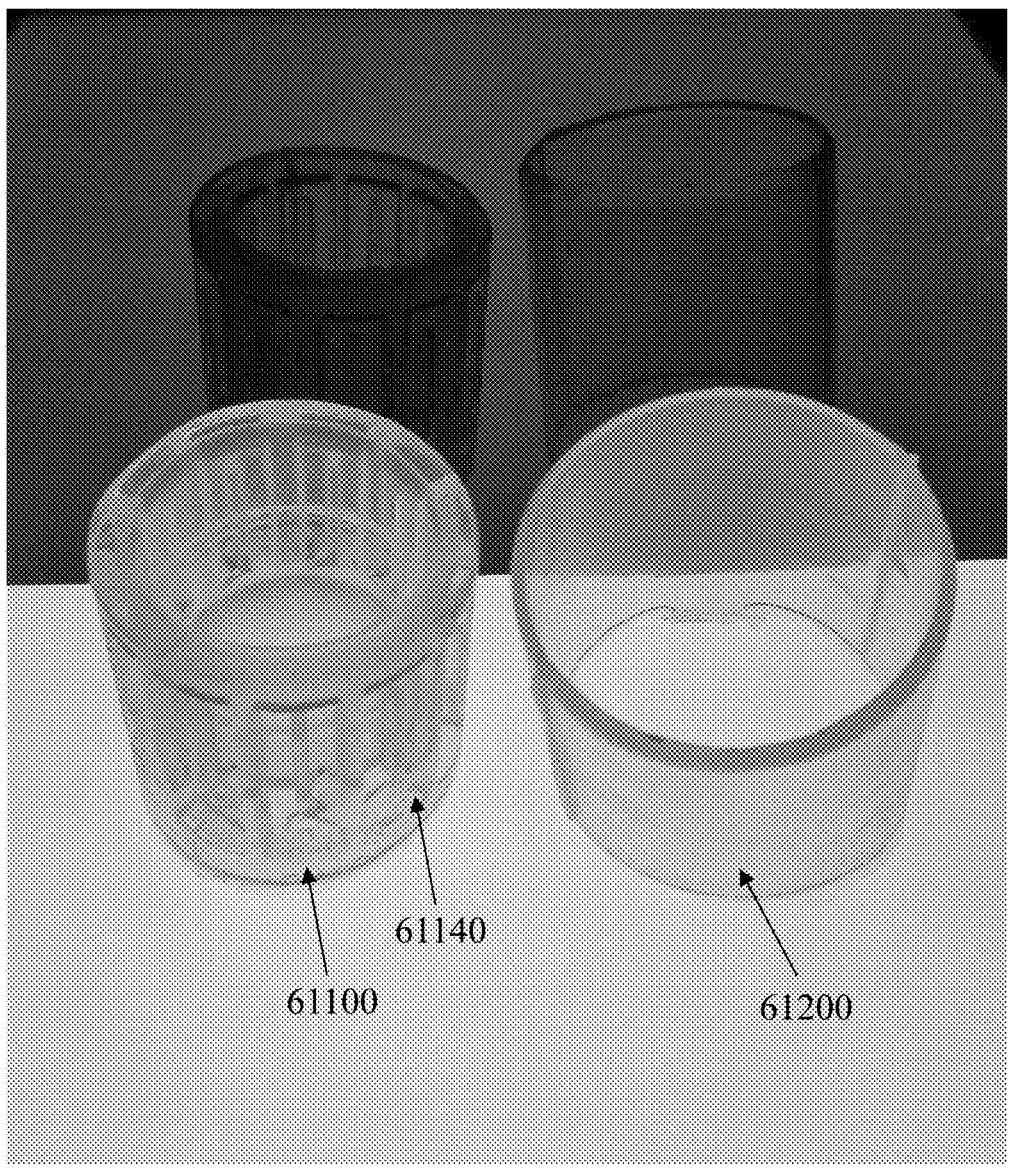

FIG. 61 is a photograph of a perspective view of an exemplary embodiment of a system 61000, which illustrates an inner body 61100 and outer shell 61200 coupled to components (e.g., glass components). Inner body 61100 and outer shell 61200 can be molded from one of the molds illustrated in FIG. 58.

Figure 62:
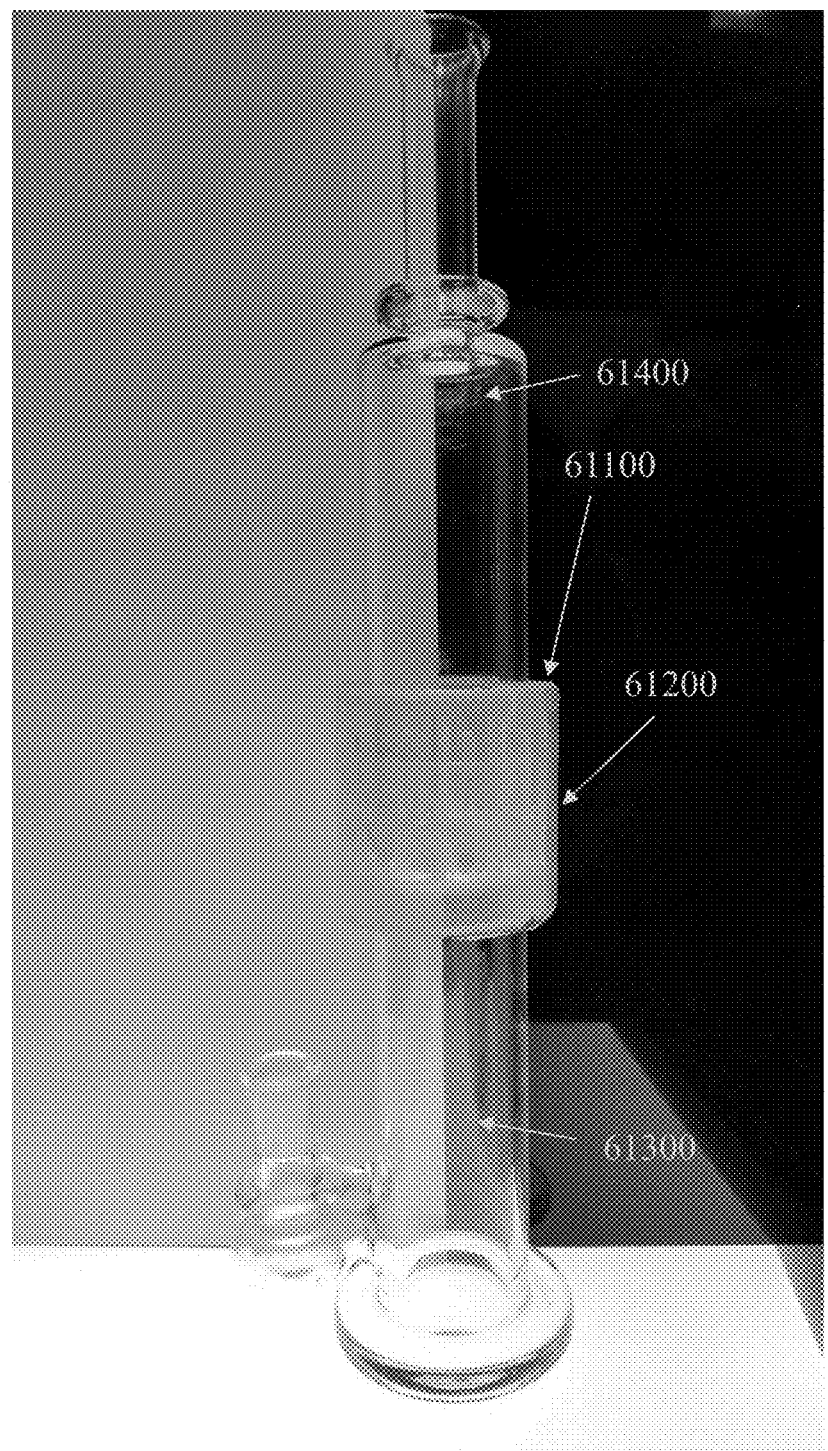

FIG. 62 is a photograph of a perspective view of an exemplary embodiment of a system 62000, which illustrates inner body 61100 and outer shell 61200 installed as an intermediate component coupling a first glass vessel component 61300 to a second glass vessel component 61400. When installed, inner body 61100 and outer shell 61200 form a percolator for system 62000. The percolator utilizes negative space relief defined by inner body 61100 and outer shell 61200.

Figure 63:
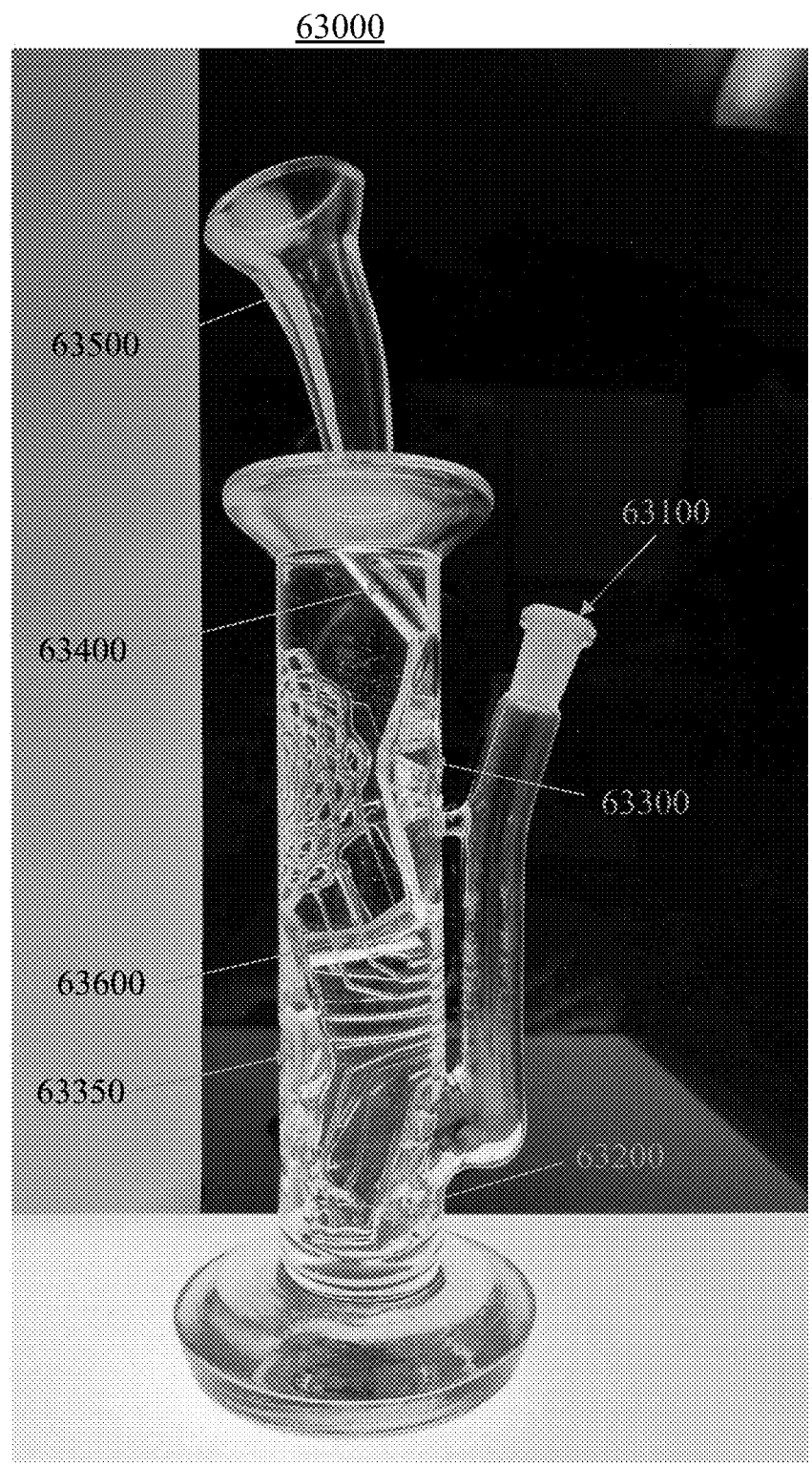

FIG. 63 is a photograph of a perspective view of an exemplary embodiment of a fluid pipe 63000, which comprises or defines an inlet 63100, a negative space relief image 63200, a first percolation void 63300, a second percolation void 63350, a first passage 63400, a mouth port 63500, and a passage 63600. In certain exemplary embodiments, fluid pipe 63000 can be produced from a substantially solid rod, which can be blasted, drilled, and sheathed. In certain exemplary embodiments, first passage 63400 and/or second passage 63600 can be drilled.

Figure 64:

FIG. 64 is a diagram of a perspective view of an exemplary embodiment of a fluid pipe 64000, which comprises a chamber 64100 and a defined specific volume negative space relief 64200.

Figure 65:
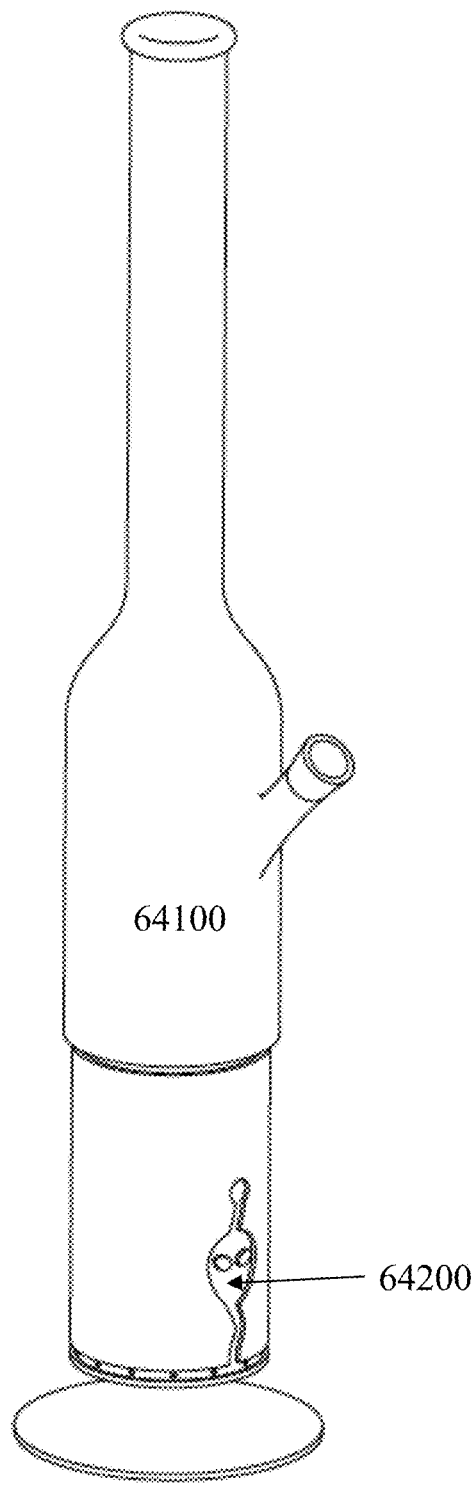
FIG. 65 is a diagram of an exploded perspective view of exemplary fluid pipe 64000.

FIG. 65 is a diagram of an exploded perspective view of exemplary fluid pipe 64000, which comprises chamber 64100 and defined specific volume negative space relief 64200.

Figure 66:
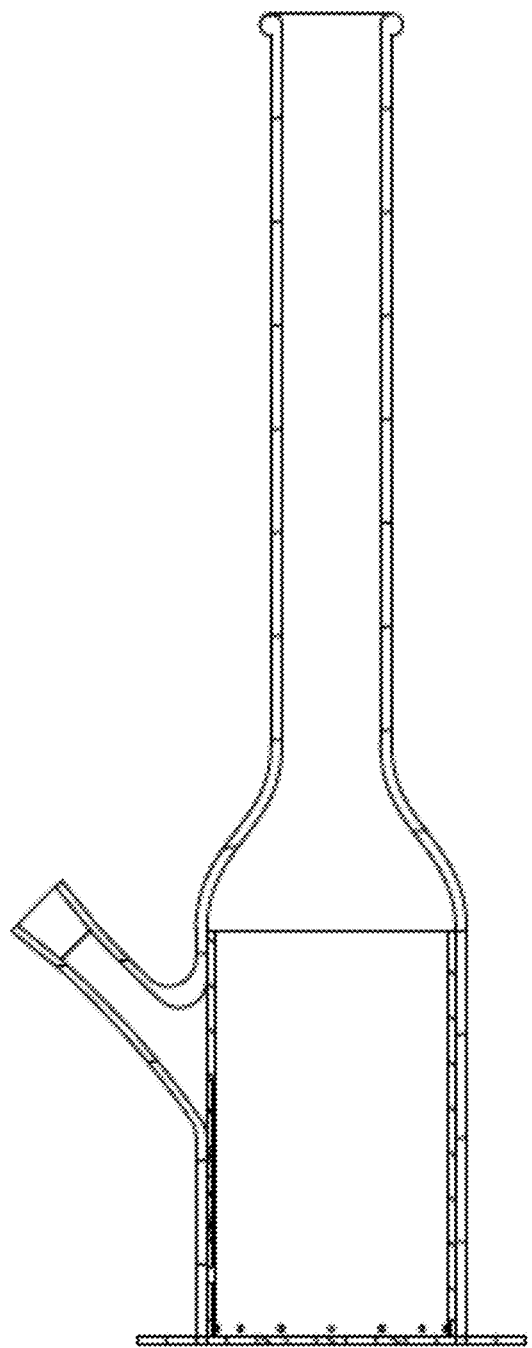
FIG. 66 is a diagram of a cross-sectional side view of exemplary fluid pipe 78000.

FIG. 66 is a diagram of a cross-sectional side view of exemplary fluid pipe 64000.

Figure 67:
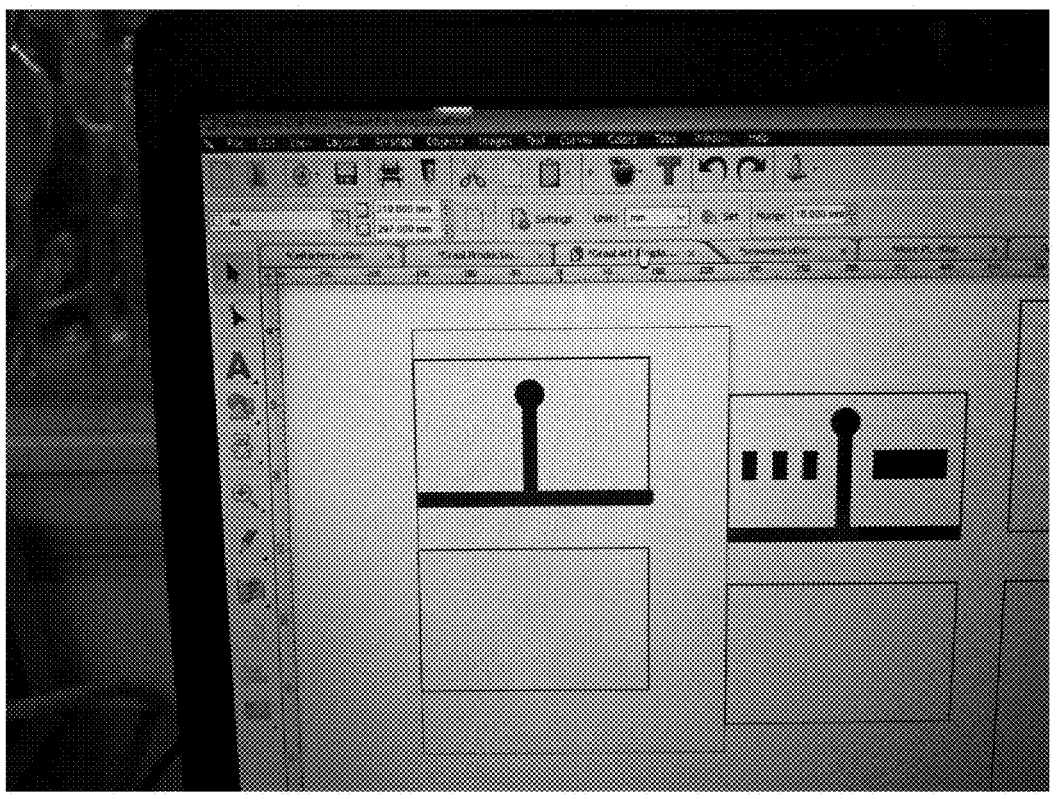

FIG. 67 is a photograph of a perspective view of an exemplary CAD design 67000.

Figure 68:
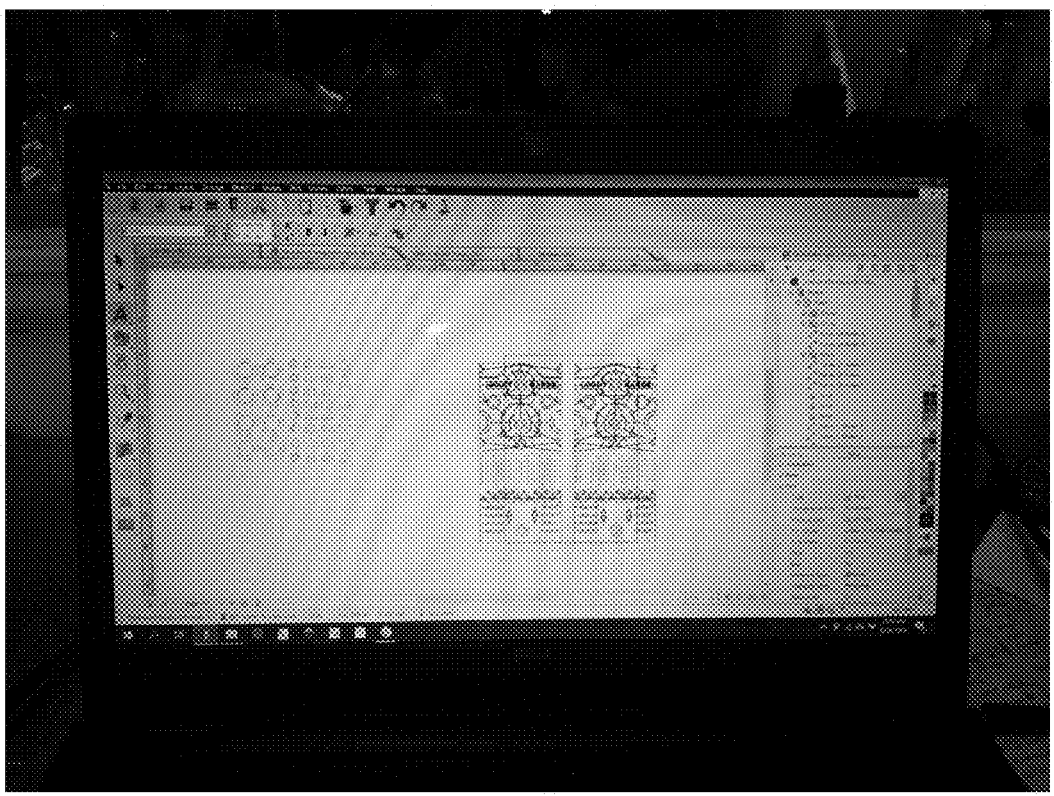

FIG. 68 is a photograph of an exemplary CAD design 68000.

Figure 69:
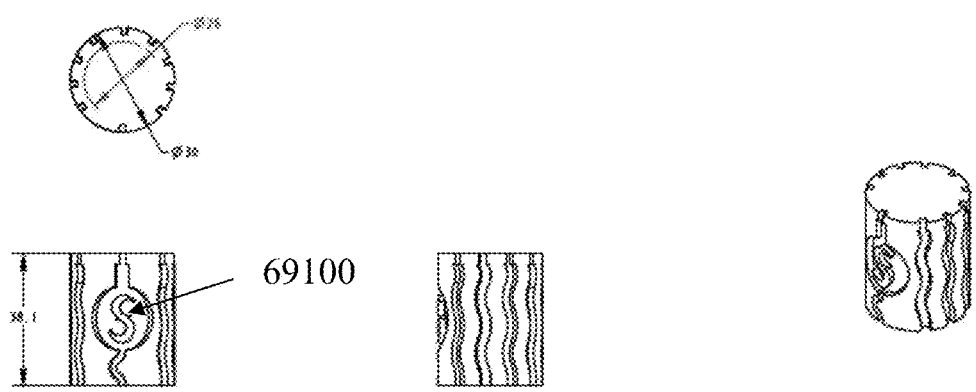
FIG. 69 is a set of views 69000 of an exemplary pipe insert.

FIG. 69 is a set of views 69000 of an exemplary pipe insert. The pipe insert defines negative space relief that can be utilized in a pipe or any other tube. When coupled to a pipe, the pipe insert allows passage of a smoke, gas, or liquid via the negative space relief. An artistic element 69100 can improve the aesthetics of a system comprising the pipe insert. The pipe insert is constructed for use in percolation. Certain exemplary embodiments provide percolation through any inserted object through a membrane or around the image like the one depicted. Certain exemplary embodiments provide a standalone insert or a coupling set up which can join two glass or other material tubes together, causing percolation through a membrane or image between layers.

Figure 70:
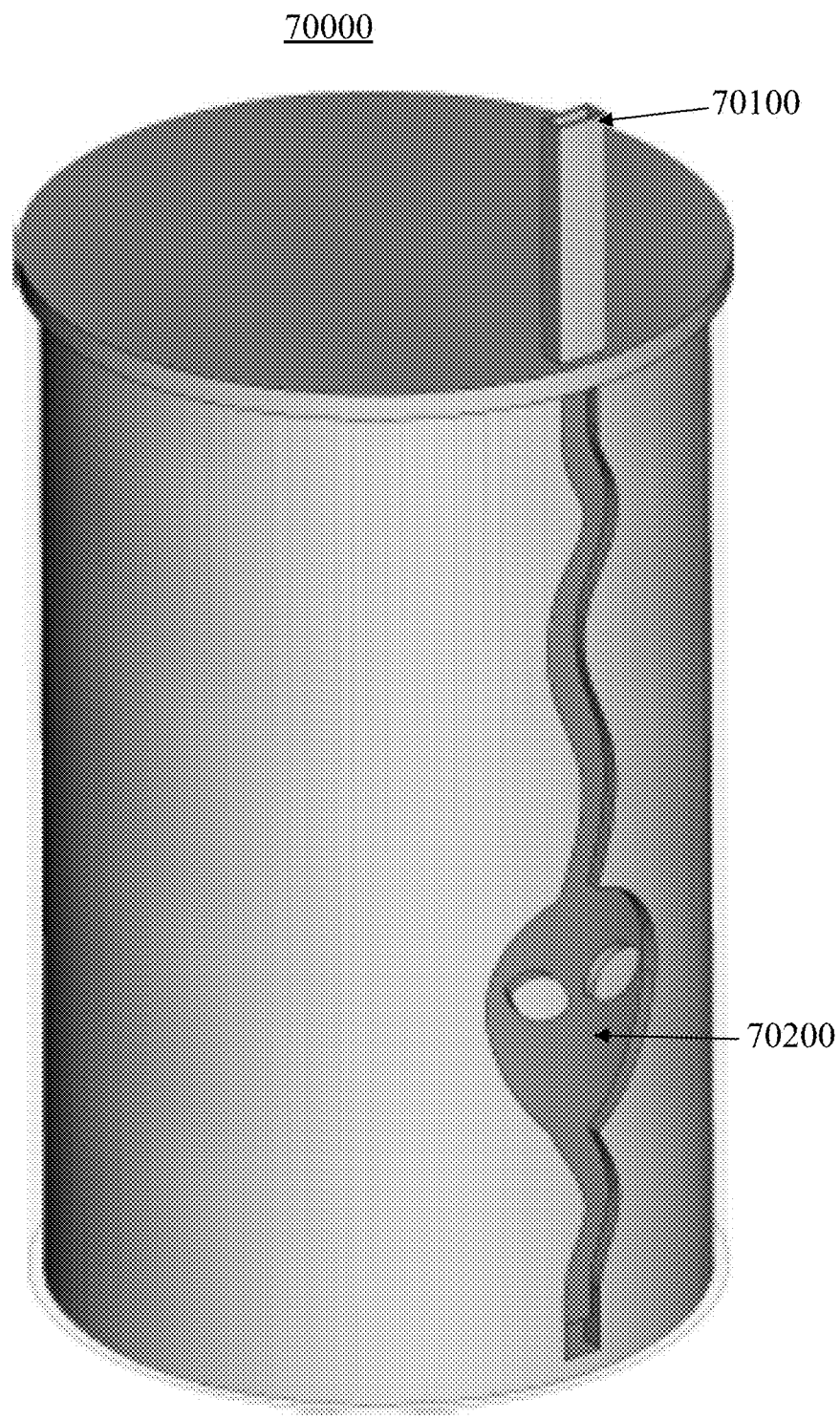

FIG. 70 is a diagram of a perspective view of an exemplary embodiment of a drinking cup 70000, which utilizes a straw 70100. Straw 70100 withdraws liquid from drinking cup 70000.

Figure 71:
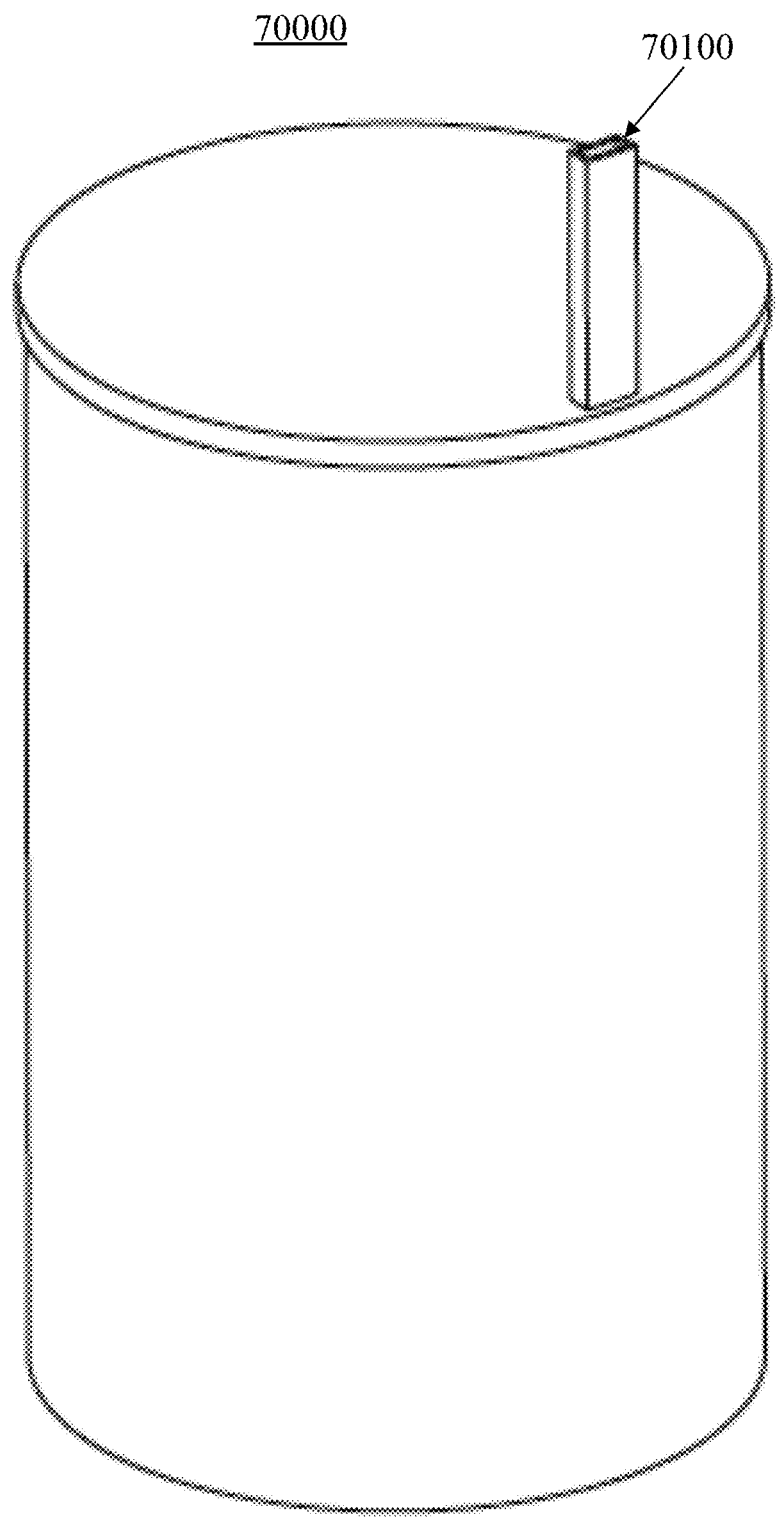
FIG. 71 is a diagram of a perspective view of an exemplary embodiment of drinking cup 70000.

FIG. 71 is a diagram of a perspective view of an exemplary embodiment of drinking cup 70000. Straw 70100 withdraws liquid through negative space relief defined by drinking cup 70000. The liquid is withdrawn from drinking cup 70000 via a liquid inlet at the bottom of drinking cup 70000. Straw 70100 draws liquid from the bottom of drinking cup 70000 through channels defined between inner and outer walls of drinking cup 70000. The straw can be plugged via a replaceable plug. The walls can further comprise a heat exchange liquid that either heats or cools a drink held in drinking cup 70000.

Figure 72:
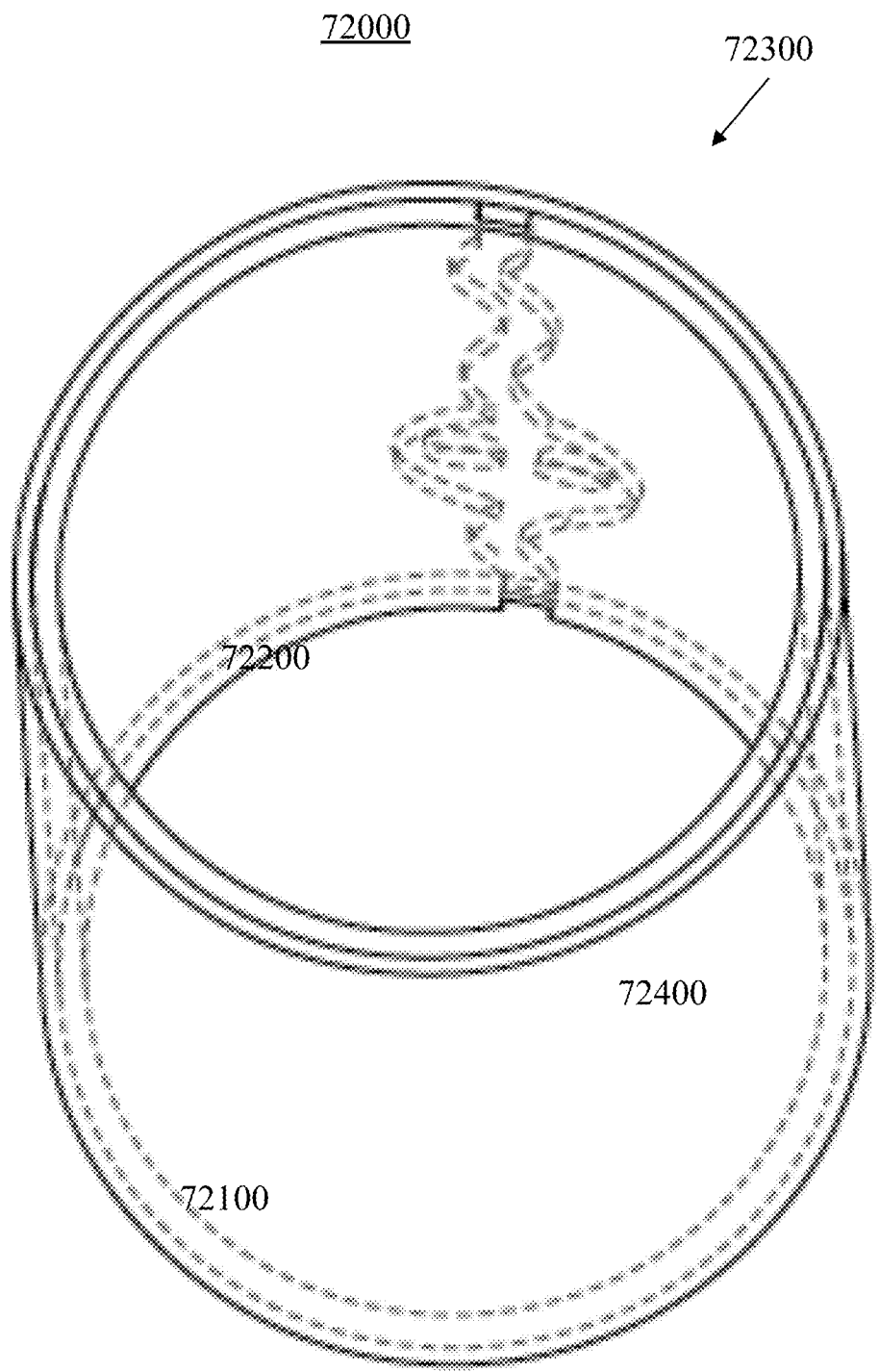
FIG. 72 is a diagram of a perspective view of an exemplary embodiment of a drinking cup 72000.

FIG. 72 is a diagram that comprises ghost lines of a perspective view of an exemplary embodiment of a drinking cup 72000.

Figure 73:
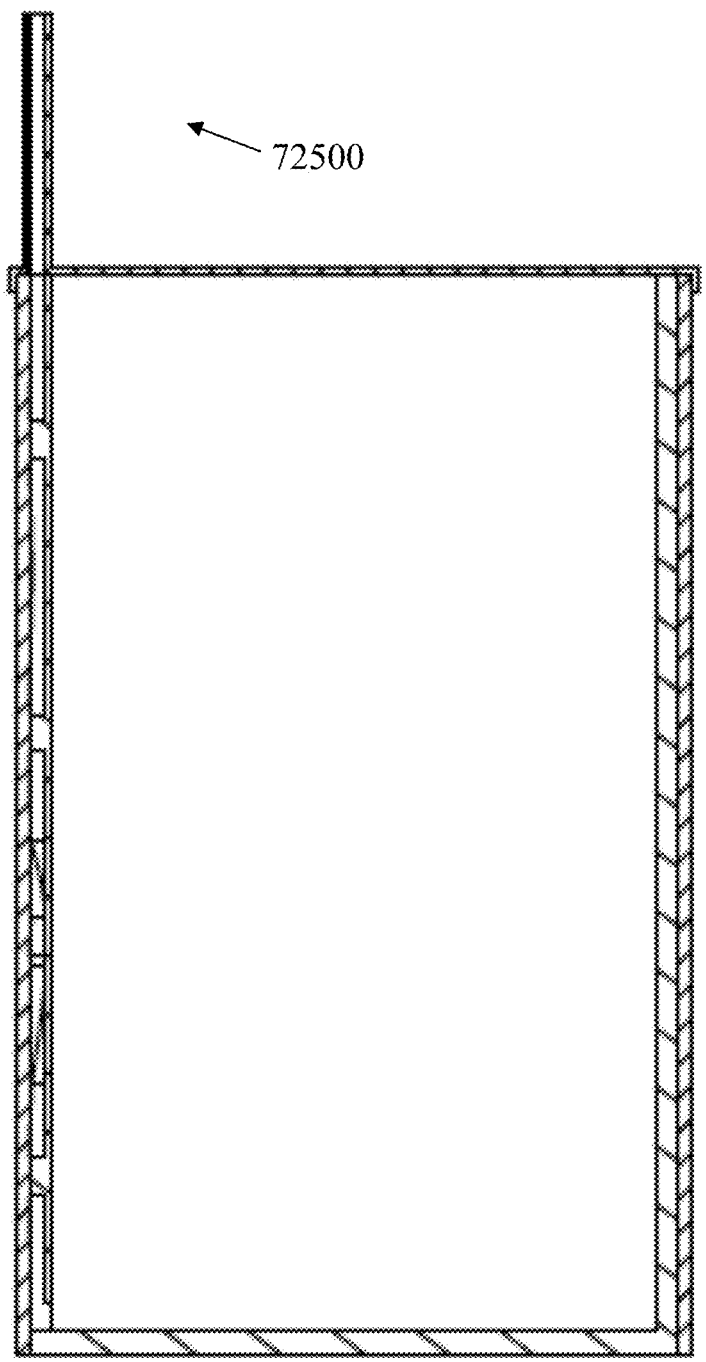
FIG. 73 is a diagram of a side view of exemplary drinking cup 72000.

FIG. 73 is a diagram of a side view of exemplary drinking cup 72000.

Figure 74:
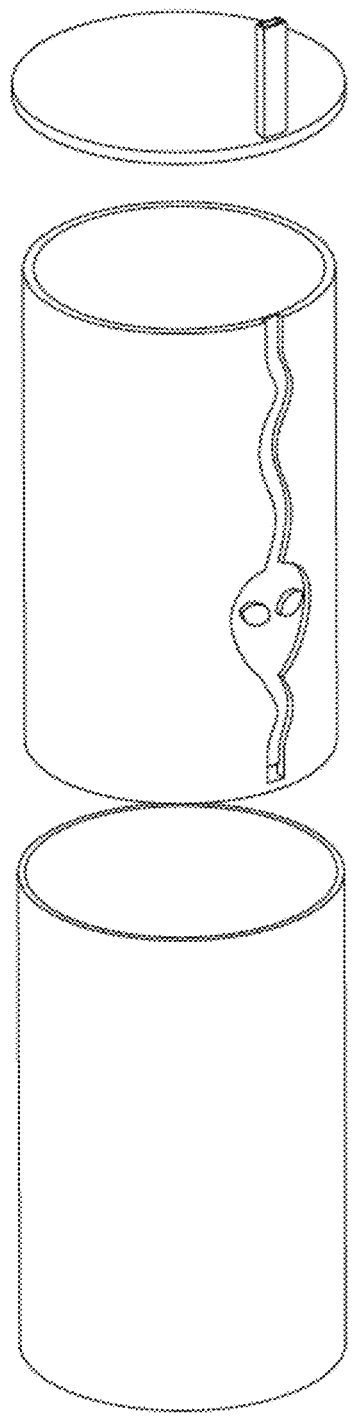
FIG. 74 is an exploded diagram of a perspective view of an exemplary embodiment of a drinking cup 74000.

FIG. 74 is an exploded diagram of a perspective view of an exemplary embodiment of a drinking cup 74000.

Figure 75:
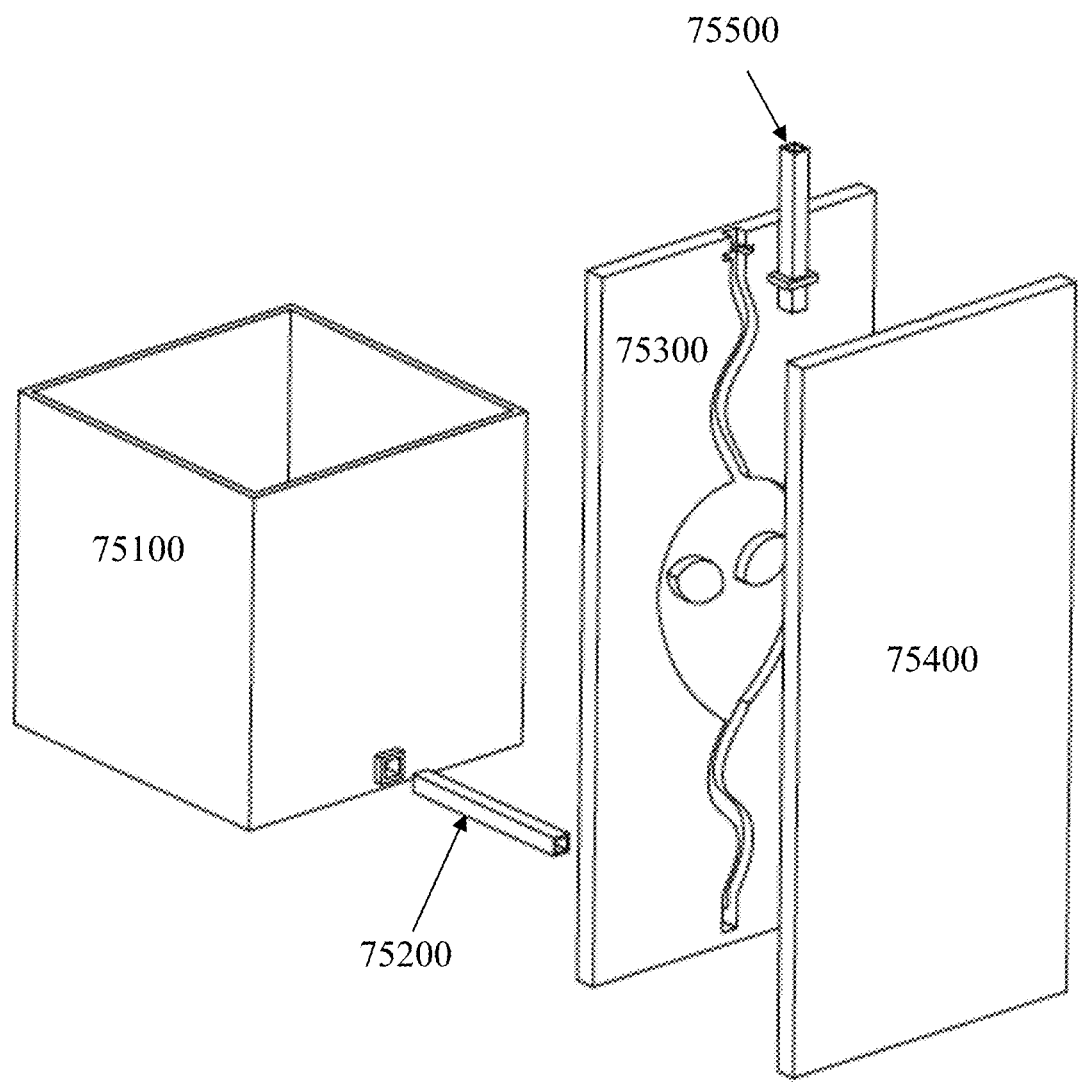
FIG. 75 is an exploded diagram of a perspective view of an exemplary embodiment of a drinking container 75000.

FIG. 75 is an exploded diagram of a perspective view of an exemplary embodiment of a drinking container 75000. Drinking container 75000 comprises a liquid reservoir 75100, a withdrawal tube 75200, a negative space relief plate 75300, a cover plate 75400, and a drinking straw 75500.

Figure 75B:
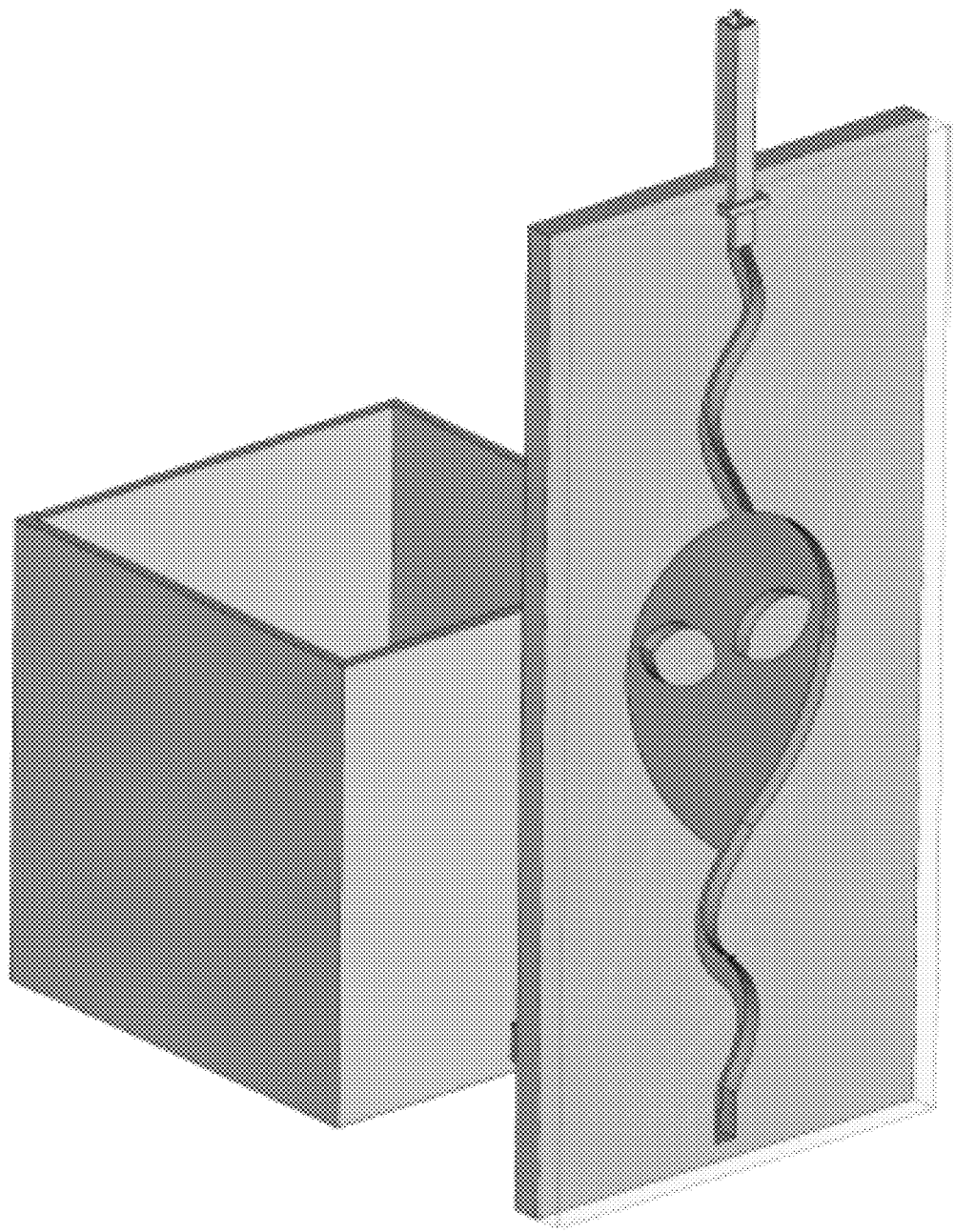

FIG. 75B is an exploded diagram of a perspective view of an exemplary embodiment of a drinking container 75550.

Figure 75C:
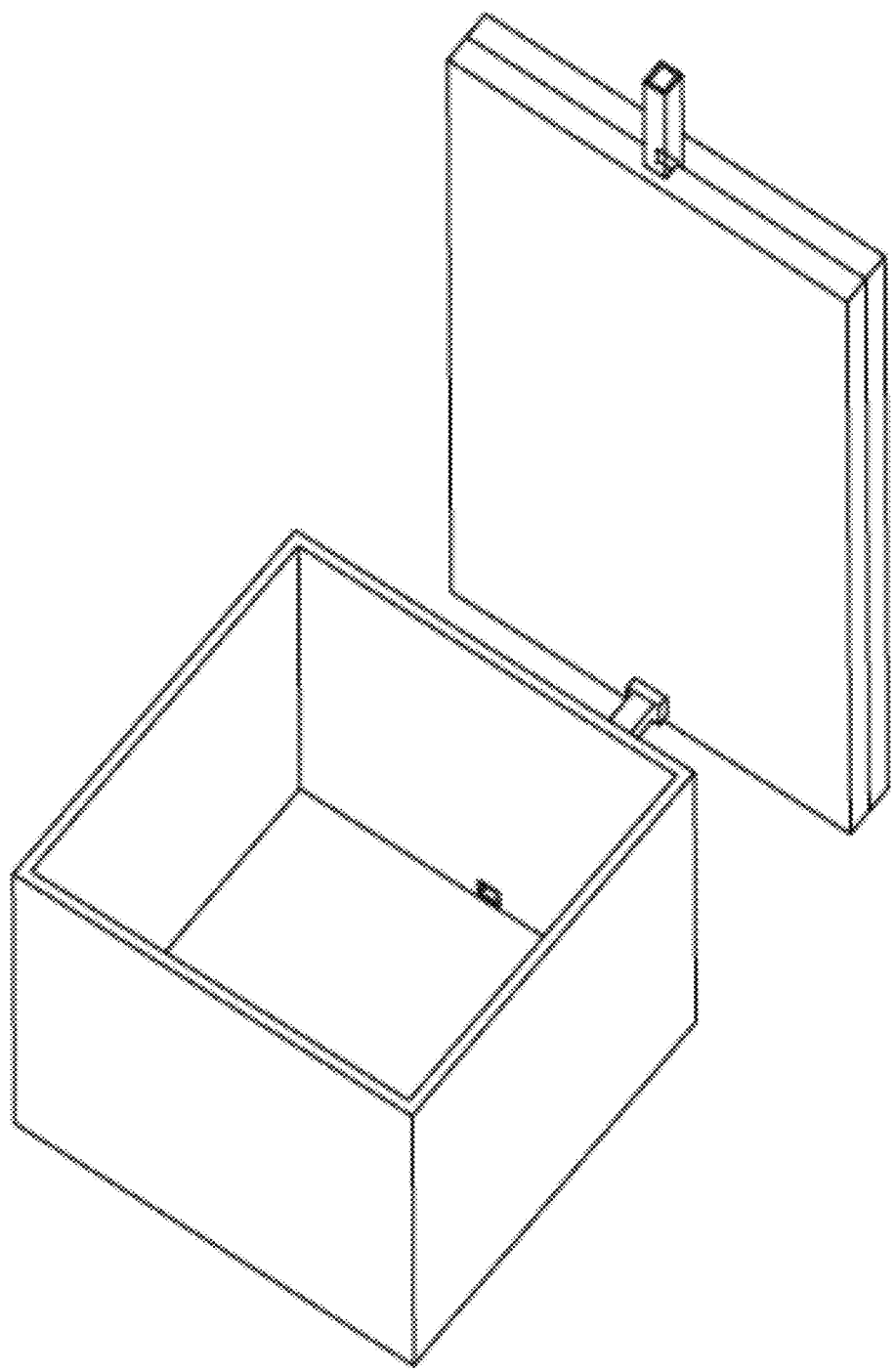
FIG. 75C is a perspective view of an exemplary embodiment of a drinking container 75600.

FIG. 75C is a perspective view of an exemplary embodiment of a drinking container 75600.

Figure 75D:
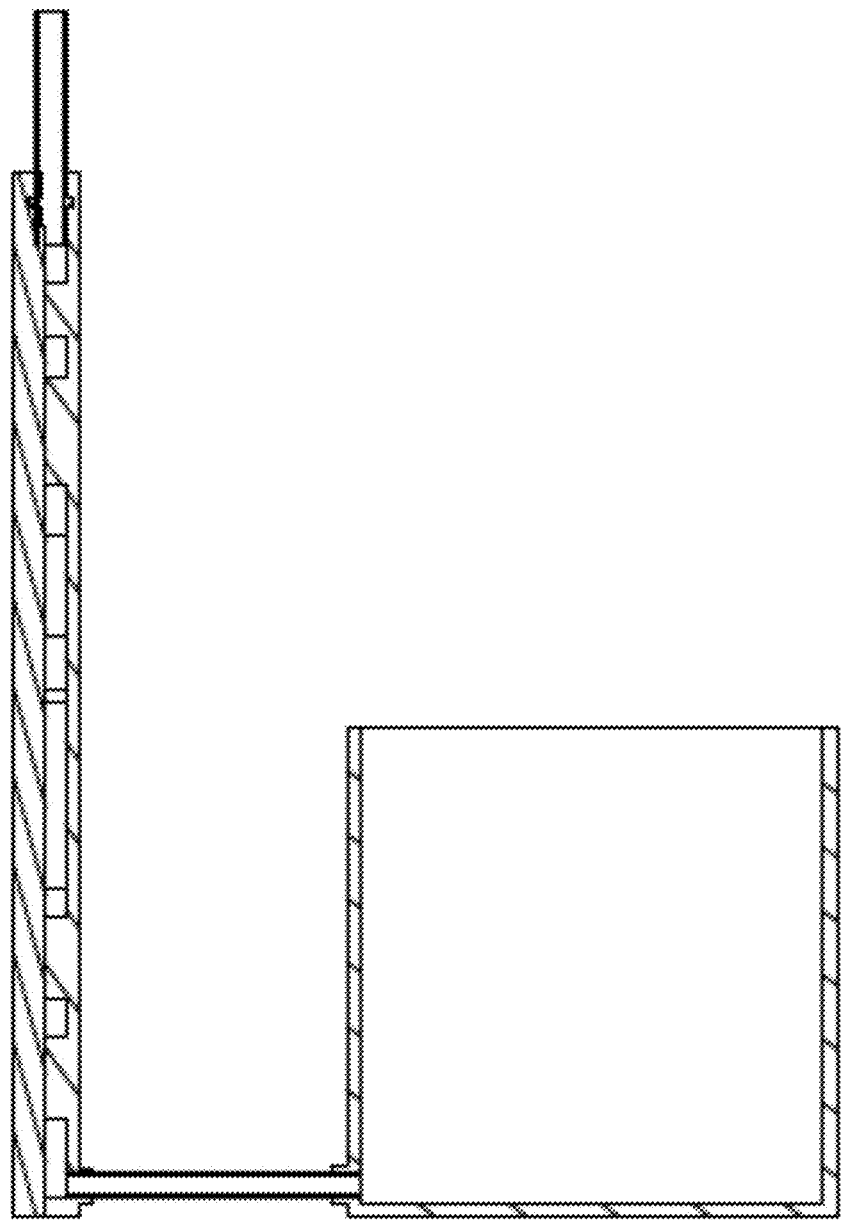
FIG. 75D is a cross-sectional side view of an exemplary embodiment of a drinking container 75700.

FIG. 75D is a cross-sectional side view of an exemplary embodiment of a drinking container 75700.

Figure 76:
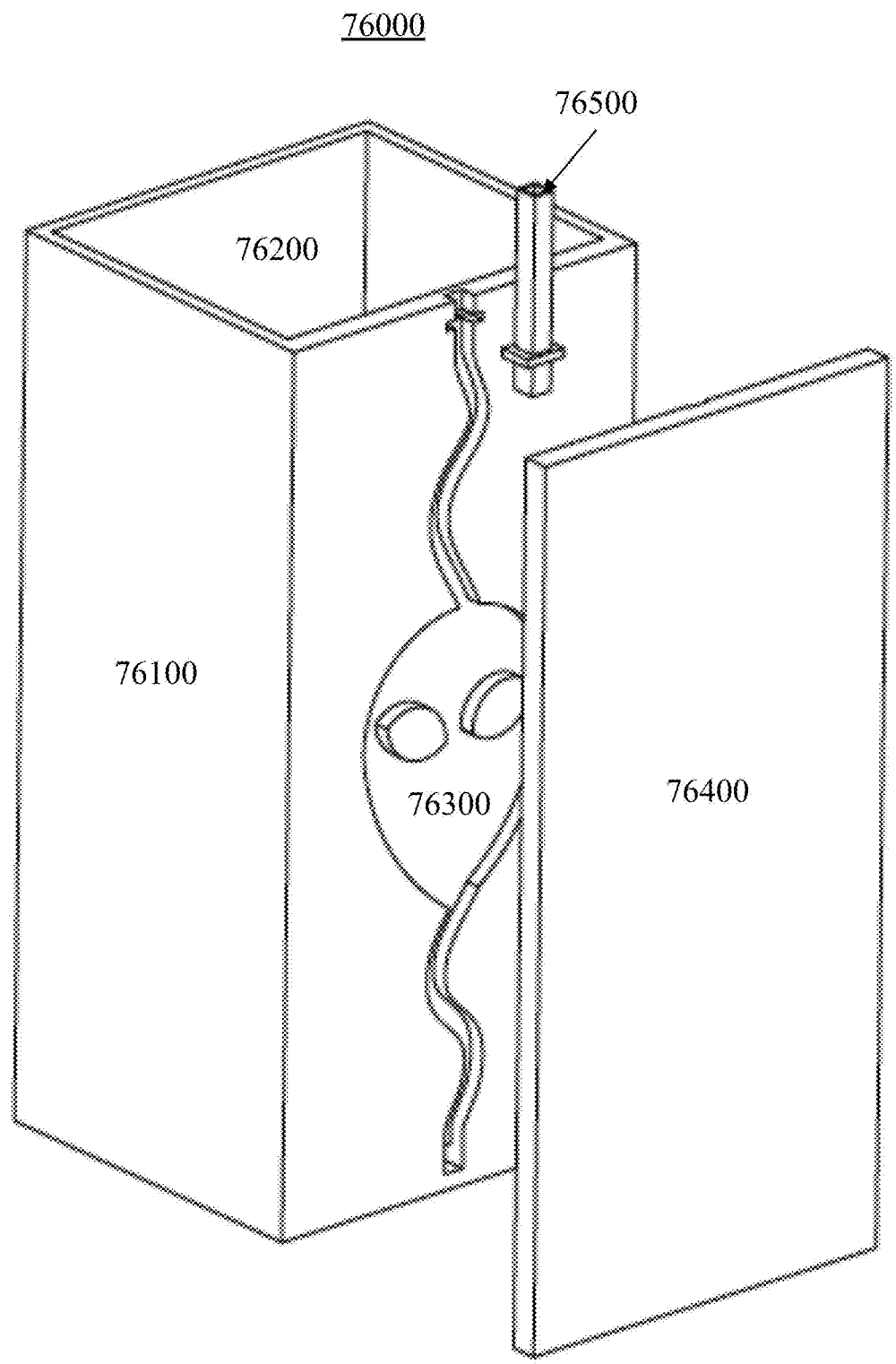
FIG. 76 is an exploded diagram of a perspective view of an exemplary embodiment of a drinking container 76000.

FIG. 76 is an exploded diagram of a perspective view of an exemplary embodiment of a drinking container 76000. Drinking container 75000 comprises a liquid reservoir 75100, a withdrawal tube 75200, a negative space relief plate 75300, a cover plate 75400, and a drinking straw 75500.

Figure 77:
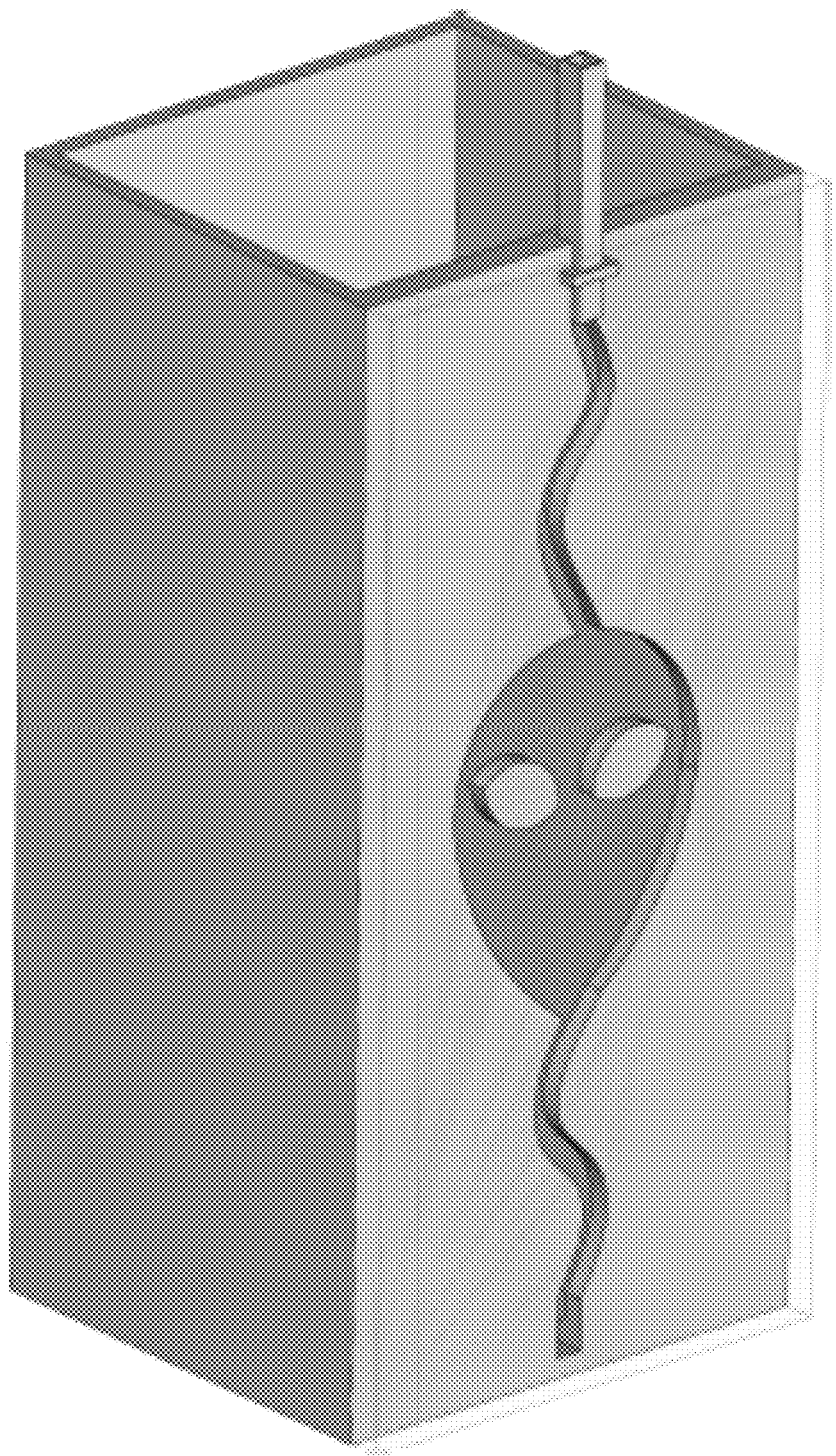

FIG. 77 is a diagram of a perspective view of an exemplary embodiment of a drinking container 77000.

Figure 77B:
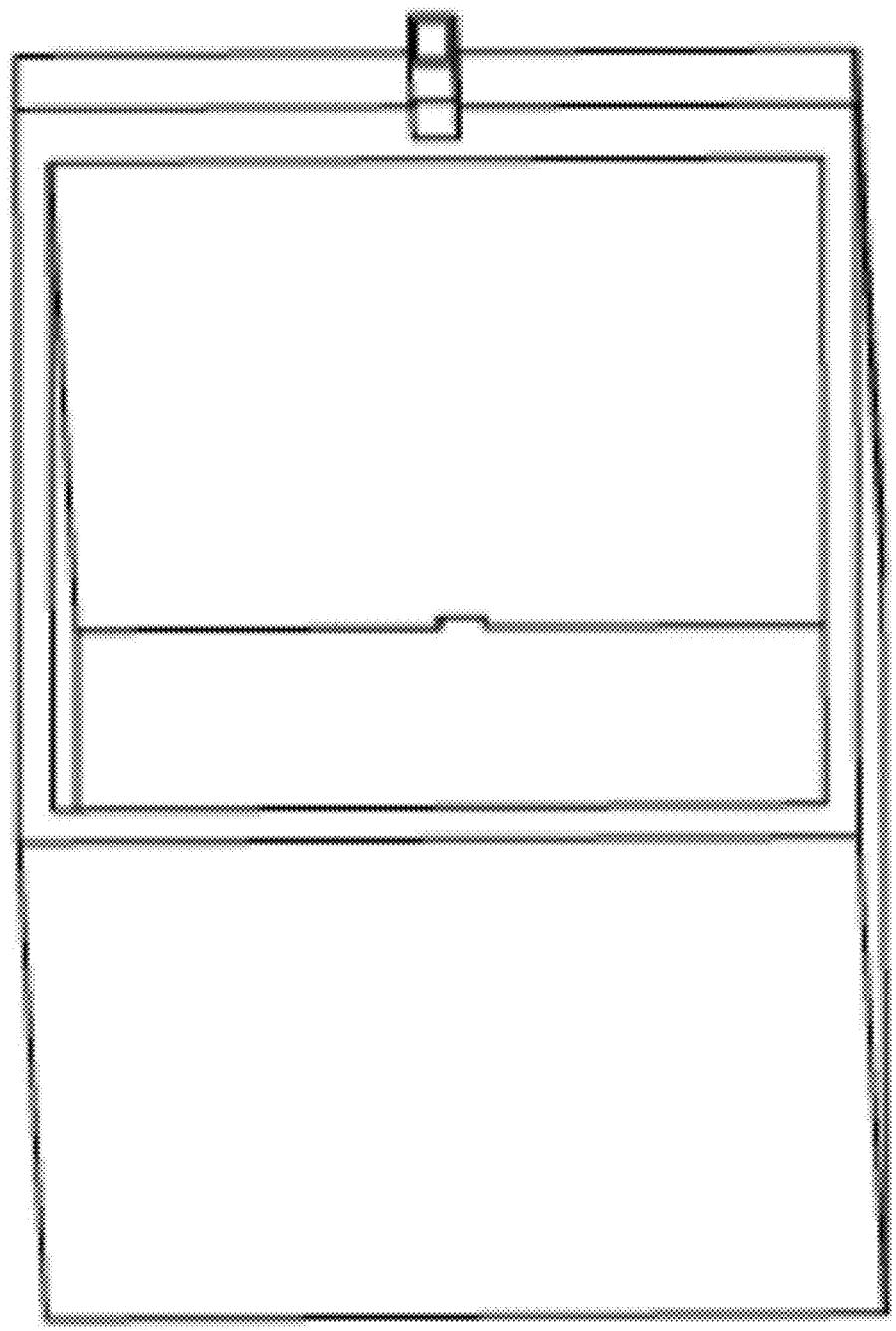
FIG. 77B is a perspective view of an exemplary embodiment of a drinking container 77300.

FIG. 77B is a perspective view of an exemplary embodiment of a drinking container 77300.

Figure 78:
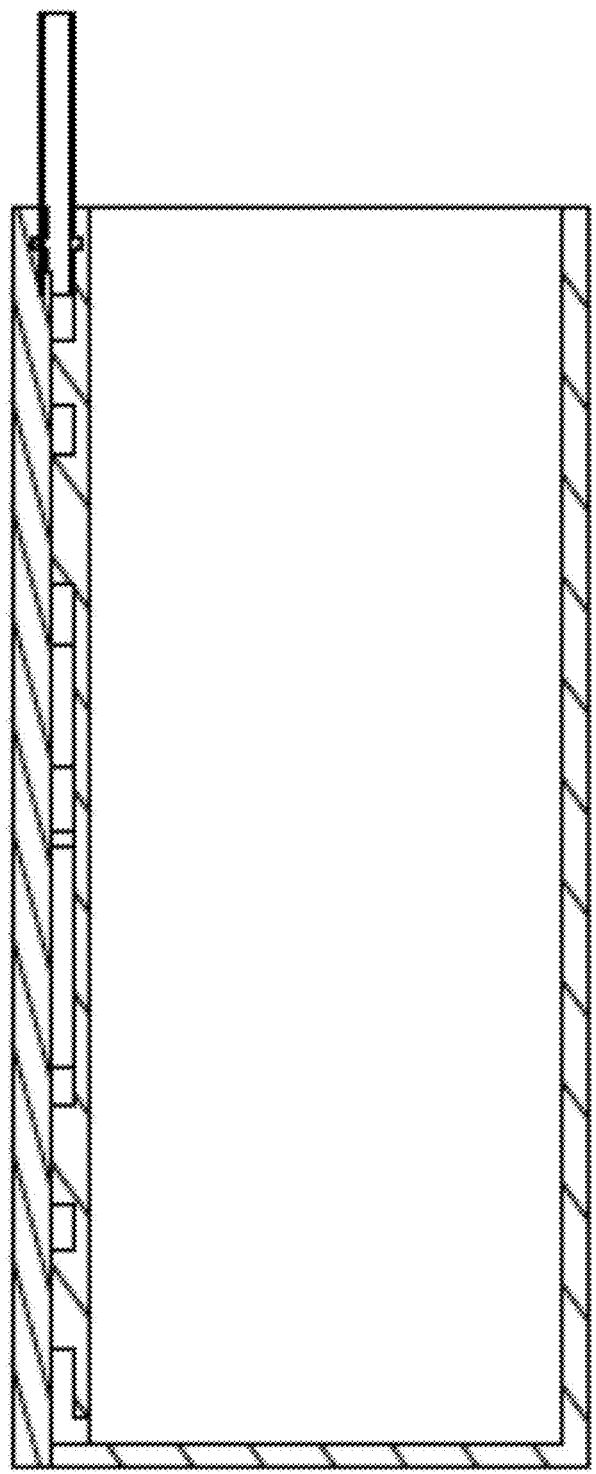
FIG. 78 is a cross-sectional side view of an exemplary embodiment of a drinking container 77600.

FIG. 78 is a cross-sectional side view of an exemplary embodiment of a drinking container 77600.

Figure 79:
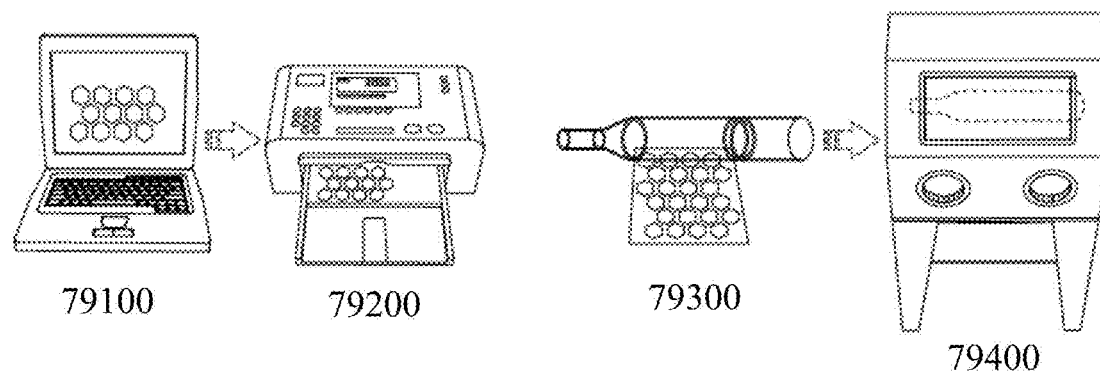
FIG. 79 is a diagram of an exemplary embodiment of a process flow 79000.
Figure 79:
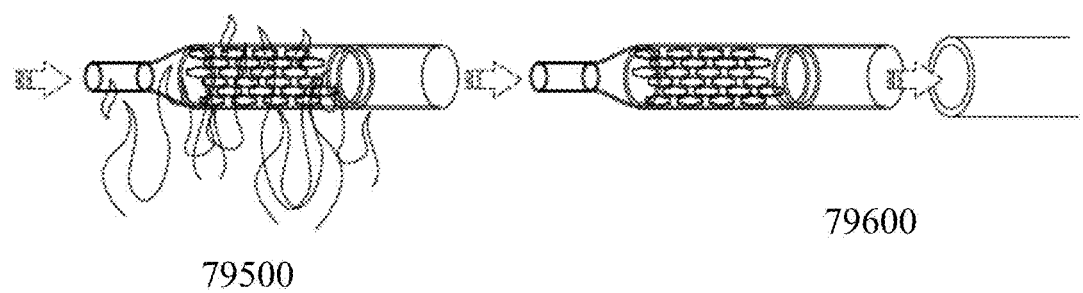

FIG. 79 is a diagram of an exemplary embodiment of a process flow 79000. At activity 79100 a CAD system can be utilized to create a mask. At activity 79200 the mask can be created, such as via a vinyl cutter. At activity 79300 the mask can be applied to a vessel, such as a glass vessel. At activity 79400 the mask and glass vessel can be heated to cause the mask to adhere to a surface of the glass vessel during treatment. At activity 79500, specific volume negative space relief can be defined by the glass vessel via the mask. At activity 79600, the glass vessel can be coupled to a shell that encloses the specific volume negative space relief.

Figure 80:
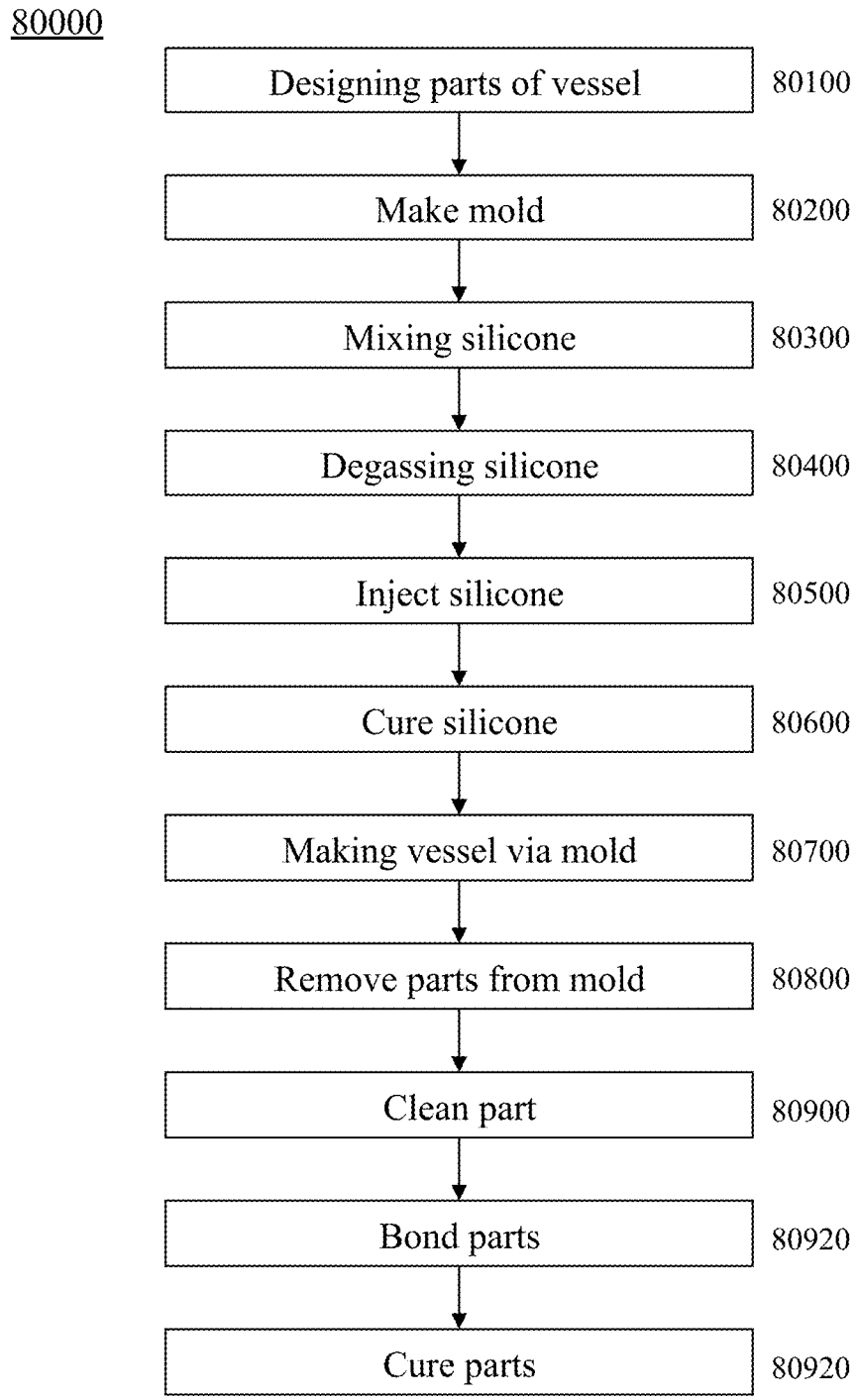
FIG. 80 is a flowchart of an exemplary embodiment of a method 80000.

FIG. 80 is a flowchart of an exemplary embodiment of a method 80000. At activity 80100 parts of a vessel can be designed. Certain exemplary embodiments provide, such as via computer aided design (see, e.g., CAD design 57000 of FIG. 57), designing parts of a non-metal vessel (see, e.g., system 61000 of FIG. 61) that comprises an outer shell (see, e.g., outer shell 61200 of FIG. 61) and an inner body (see, e.g., inner body 61100 of FIG. 61), at least one of the outer shell and the inner body defining a specific volume negative space relief (see, e.g., specific volume negative space relief defined by inner body 61100 of FIG. 61), wherein:

the specific volume negative space relief defines a channel (see, e.g., channel 61120 of FIG. 61) constructed to pass at least one of a fluid and a gas;

at least one of the outer shell and the inner body defines at least one aperture (see, e.g., aperture 61140 of FIG. 61); and via the aperture (see, e.g., aperture 61140 of FIG. 61) at least one of the fluid and the gas is passable via the channel between the outer shell and the inner body.

At activity 80200 parts of a mold can be made. Certain exemplary embodiments provide for making a mold (see, e.g., mold 58300 of FIG. 58) for the parts of the non-metal vessel via at least one of a 3-D printer, a machine tool that utilizes computer numerical control to create a silicone mold (see, e.g., mold 58300 of FIG. 58).

At activity 80300, silicone can be mixed, which can be used in the mold. At activity 80400, the silicone can be degassed, such as under vacuum. At activity 80500, the silicone can be injected in the silicone mold. At activity 80600, the silicone can be cured in the silicone mold. At activity 80700, a vessel can be made via a mold. For example, a part of the non-metal vessel can be made via the silicone mold (see, e.g., mold 58300 of FIG. 58). At activity 80800, parts can be removed from the silicone mold. At activity 80900, parts can be cleaned. At activity 80920, parts of the non-metal vessel can be bonded. At activity 80940, parts of the non-metal vessel can be fully cured after bonding.

Certain exemplary embodiments provide a system comprising a non-metal vessel (see, e.g., system 61000 of FIG. 61) that comprises an outer shell (see, e.g., outer shell 61200 of FIG. 61) and an inner body (see, e.g., inner body 61100 of FIG. 61), at least one of the outer shell and the inner body defining a specific volume negative space relief (see, e.g., specific volume negative space relief defined by inner body 61100 of FIG. 61), wherein:

the specific volume negative space relief defines a channel (see, e.g., channel 61120 of FIG. 61) constructed to pass at least one of a fluid and a gas;

at least one of the outer shell and the inner body defines at least one aperture (see, e.g., aperture 61140 of FIG. 61); and via the aperture at least one of the fluid and the gas is passable via the channel between the outer shell and the inner body.

In certain exemplary embodiments, the vessel comprises a smoke inlet (see, e.g., inlet 53100 of FIG. 53) and a smoke outlet (see, e.g., outlet 53200 of FIG. 53). The smoke inlet and the vessel can be constructed for smoke to be drawn from the smoke inlet through a specific volume negative space relief.

In certain exemplary embodiments, the vessel comprises a smoke inlet and the vessel is constructed for smoke to mix with water and be drawn from the smoke inlet through the specific volume negative space relief. The vessel can comprise a first chamber and a second chamber, wherein the vessel is constructed for a fluid held in the first chamber to be mixed with a gas and passed via the specific volume negative space relief to the second chamber. The vessel can comprise a first chamber and a second chamber, wherein the vessel is constructed for a fluid held in the first chamber to be mixed with a gas and passed via the specific volume negative space relief to the second chamber; and the fluid is returned via gravity to the first chamber from the second chamber.

In certain exemplary embodiments, when at least one of the fluid and the gas passes through at least one aperture, at least one of the fluid and the gas can flow to a chamber defined by the vessel. When at least one of the fluid and the gas passes through at least one aperture, at least one of the fluid and the gas can change of temperature of something held in the vessel. The vessel can be constructed to separate the fluid or the gas into separate chambers defined by the vessel. The vessel can be constructed to combine or recombine portions of the fluid or the gas via separate chambers defined by the vessel. The vessel is constructed to do at least one of heating, condensing, conducting or trapping of a portion of the gas, fluid, or solid.

The inner body can comprise silicone. The vessel can be constructed for use as a cooling distiller. The vessel can be constructed for use as a deepwater culture under-current bucket. The vessel can be constructed for use as a drinking cup and the specific volume negative space relief functions as passage to draw drinking liquid to a mouth of a user. The vessel can be constructed for use as an insulated sleeve that is constructed to cover a beverage container. The vessel can be constructed for use as an aeration bucket.

Certain exemplary embodiments can cause fabricating a vessel that comprises an outer shell and an inner body, the inner body defining a specific volume negative space relief. The specific volume negative space relief can be defined via a vectorized digital image. The specific volume negative space relief can be formed via welding, extruding, injection molding, compression molding, 3D printing, and/or abrasive blasting with an abrasive resistant mask. The specific volume negative space relief can be defined via use of a mask produced via one of 3D printing, injection molding, compression molding, bonding, abrasive blasting, sandblasting, and/or resisted vinyl removal.

Certain exemplary embodiments can cause one or more of:
- cutting a resistant media image from a vectorized digital image, wherein the image is formed utilizing the resistant media image;
- carving the image or specific volume negative space relief;
- coupling a resistant media image to the inner body, wherein the resistant media image is used to cut the image into the inner body;
- coupling a negative resistant media image is to the inner body via an adhesive;
- etching the inner body with the negative resistant media image coupled thereto to cut the image into the inner body;
- removing the negative resistant media image after the image is cut into the inner body;
- coupling a negative resistant media image is to the inner body via an adhesive;
- sandblasting the inner body with the negative resistant media image coupled thereto to cut the image into the inner body;
- removing the negative resistant media image after the image is cut into the inner body;
- drilling at least one aperture in the vessel, wherein the at least one aperture is coupled to the specific volume negative space relief;
- placing the outer shell around the inner body;
- fusing the outer shell to the inner body;
- turning the inner body and the outer shell on a lathe;
- heating the inner body and the outer shell;
- shaping the outer shell to conform to the inner body via a graphite paddle;
- fusing the outer shell to the inner body via heat; and/or
- removing air from the outer shell and leaving negative space relief.

Certain exemplary embodiments provide for fabricating a vessel that comprises an outer shell and an inner body, the inner body defining a specific volume negative space relief, wherein: the specific volume negative space relief is constructed for delivering, draining, holding, or recirculating electricity or plasma.

Definitions

When the following terms are used substantively herein, the accompanying definitions apply. These terms and definitions are presented without prejudice, and, consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

- 3-D printer—a device constructed to join or solidify a material under computer control to create a three-dimensional object, with material being added together (such as liquid molecules or powder grains being fused together), typically layer by layer.
- a—at least one.
- abrasive—a material, often a mineral, that is used to shape or finish a surface through rubbing which leads to part of the surface being worn away by friction.
- abrasive blasting—a process of forcibly propelling a stream of abrasive material against a surface under high pressure to smooth a rough surface, roughen a smooth surface, shape a surface or remove surface contaminants.
- abrasive resistant mask—a cover constructed to, when coupled to a surface, to shield the surface from contact with an abrasive that has been propelled toward the surface.
- activity—an action, act, step, and/or process or portion thereof
- adapter—a device used to effect operative compatibility between different parts of one or more pieces of an apparatus or system.
- adhesive—a substance applied to one surface, or both surfaces, of two separate items that binds the two items together and resists separation of the two items.
- aeration bucket—a cylindrical vessel constructed to hold a liquid and into which a gas can be mixed with the liquid.
- airtight—constructed to substantially not allow air to escape from an enclosure.
- and/or—either in conjunction with or in alternative to.
- aperture—an opening in something.
- apparatus—an appliance or device for a particular purpose.
- application—the use of
- around—situated so as to partially surround.
- associate—to join, connect together, and/or relate.
- automatically—acting or operating in a manner essentially independent of external influence or control. For example, an automatic light switch can turn on upon "seeing" a person in its view, without the person manually operating the light switch.
- beverage container—a bottle or can constructed to hold a drink for a human.
- bond—to fasten together such as via an adhesive or material fusion.
- body—a significant part of an object.
- can—is capable of, in at least some embodiments.
- carve—to make something by cutting and/or shaping.
- cause—to produce an effect.
- chamber—an enclosed space of cavity.
- channel—an enclosed passage.
- circuit—an electrically conductive pathway and/or a communications connection established across two or more switching devices comprised by a network and between corresponding end systems connected to, but not comprised by the network.
- clean—to remove contaminants.
- combine—to cause to unite.
- comprising—including but not limited to.
- computer aided design—the use of information devices to aid in the creation, modification, analysis, or optimization of a design of a thing.

computer numerical control—the automated control of machining tools (e.g., drills, boring tools, and/or lathes, etc.) by means of an information device.
condense—to change from a gas to a liquid.
conduct—to direct.
configure—to make suitable or fit for a specific use or situation.
conform—to give a substantially same size and shape.
connect—to join or fasten together.
constructed to—made to and/or designed to.
convert—to transform, adapt, and/or change.
cooling distiller—a system that separates components or substances from a liquid mixture via condensation incident to reducing the temperature of the liquid mixture.
coupleable—capable of being joined, connected, and/or linked together.
coupling—linking in some fashion.
create—to bring into being.
cure—to prepare or alter especially by chemical or physical processing.
cut—to carve or remove material.
data—distinct pieces of information, usually formatted in a special or predetermined way and/or organized to express concepts.
deepwater culture under-current bucket—a system in which plants can be grown hydroponically, which system comprises an air bubbler to cause aeration that facilitates plant growth.
define—to establish the outline, form, or structure of
degas—to remove gas from.
deliver—to provide something at a predetermined location.
design—to intentionally create a plan, process, or specification for the construction of an object.
determine—to obtain, calculate, decide, deduce, and/or ascertain.
device—a machine, manufacture, and/or collection thereof.
digital—non-analog; discrete.
drain—to remove a substance via a flow.
draw—to inhale.
drill—to make an aperture via boring with a bit.
drink—to imbibe a liquid.
electricity—the set of physical phenomena associated with the presence and motion of matter that has a property of electric charge.
encase—to completely surround and enclose something.
estimate—to calculate and/or determine approximately and/or tentatively.
etch—to cut into something via a substance such as an acid.
extrude—to make by forcing through mold.
fabricate—to construct.
flow—to circulate or move a fluid.
fluid—a liquid and/or gas.
form—to create.
fully—substantially completely.
fuse—to fixedly couple by melting together.
gas—a substance (such as air) that has neither independent shape nor volume but tends to expand indefinitely.
generate—to create, produce, give rise to, and/or bring into existence.
glass—a non-crystalline amorphous solid that is transparent and/or translucent.
graphite paddle—a flat bladed glass working tool that comprises a soft black form of carbon.
haptic—involving the human sense of kinesthetic movement and/or the human sense of touch. Among the many potential haptic experiences are numerous sensations, body-positional differences in sensations, and time-based changes in sensations that are perceived at least partially in non-visual, non-audible, and non-olfactory manners, including the experiences of tactile touch (being touched), active touch, grasping, pressure, friction, traction, slip, stretch, force, torque, impact, puncture, vibration, motion, acceleration, jerk, pulse, orientation, limb position, gravity, texture, gap, recess, viscosity, pain, itch, moisture, temperature, thermal conductivity, and thermal capacity.
heat—(n) thermal energy; (v) to apply thermal energy.
hold—to contain something.
image—an at least two-dimensional representation of an object, person, logo design, shape, and/or phenomenon.
information device—any device capable of processing data and/or information, such as any general purpose and/or special purpose computer, such as a personal computer, workstation, server, minicomputer, mainframe, supercomputer, computer terminal, laptop, wearable computer, and/or Personal Digital Assistant (PDA), mobile terminal, Bluetooth device, communicator, "smart" phone (such as a Treo-like device), messaging service (e.g., Blackberry) receiver, pager, facsimile, cellular telephone, a traditional telephone, telephonic device, a programmed microprocessor or microcontroller and/or peripheral integrated circuit elements, an ASIC or other integrated circuit, a hardware electronic logic circuit such as a discrete element circuit, and/or a programmable logic device such as a PLD, PLA, FPGA, or PAL, or the like, etc. In general any device on which resides a finite state machine capable of implementing at least a portion of a method, structure, and/or or graphical user interface described herein may be used as an information device. An information device can comprise components such as one or more network interfaces, one or more processors, one or more memories containing instructions, and/or one or more input/output (I/O) devices, one or more user interfaces coupled to an I/O device, etc.
initialize—to prepare something for use and/or some future event.
inject—to introduce into something forcefully.
injection molding—a manufacturing process that produces parts by injecting molten material into a mold.
inlet—an entry passage.
inner—internal relative to an outer shell.
input/output (I/O) device—any sensory-oriented input and/or output device, such as an audio, visual, haptic, olfactory, and/or taste-oriented device, including, for example, a monitor, display, projector, overhead display, keyboard, keypad, mouse, trackball, joystick, gamepad, wheel, touchpad, touch panel, pointing device, microphone, speaker, video camera, camera, scanner, printer, haptic device, vibrator, tactile simulator, and/or tactile pad, potentially including a port to which an I/O device can be attached or connected.
install—to connect or set in position and prepare for use.
insulated sleeve—a covering that is designed to substantially surround a container, which restricts heat transfer to and from the container.
lathe—a machine in which work is rotated about a horizontal axis and shaped by a fixed tool.
machine instructions—directions adapted to cause a machine, such as an information device, to perform one or more particular activities, operations, or functions. The directions, which can sometimes form an entity called a "processor", "kernel", "operating system", "program", "application", "utility", "subroutine", "script", "macro", "file", "project", "module", "library", "class", and/or "object", etc., can be embodied as machine code, source code, object code, compiled code, assembled code, interpretable code, and/or executable code, etc., in hardware, firmware, and/or software.

machine readable medium—a physical structure from which a machine can obtain data and/or information. Examples include a memory, punch cards, etc.

machine tool—a system constructed for shaping or machining metal or other rigid materials, usually by cutting, boring, grinding, shearing, or other forms of deformation.

may—is allowed and/or permitted to, in at least some embodiments.

memory device—an apparatus capable of storing analog or digital information, such as instructions and/or data. Examples include a non-volatile memory, volatile memory, Random Access Memory, RAM, Read Only Memory, ROM, flash memory, magnetic media, a hard disk, a floppy disk, a magnetic tape, an optical media, an optical disk, a compact disk, a CD, a digital versatile disk, a DVD, and/or a raid array, etc. The memory device can be coupled to a processor and/or can store instructions adapted to be executed by processor, such as according to an embodiment disclosed herein.

method—a process, procedure, and/or collection of related activities for accomplishing something.

mix—to combine or blend.

mold—a cavity in which a substance is shaped.

network—a communicatively coupled plurality of nodes. A network can be and/or utilize any of a wide variety of sub-networks, such as a circuit switched, public-switched, packet switched, data, telephone, telecommunications, video distribution, cable, terrestrial, broadcast, satellite, broadband, corporate, global, national, regional, wide area, backbone, packet-switched TCP/IP, Fast Ethernet, Token Ring, public Internet, private, ATM, multi-domain, and/or multi-zone sub-network, one or more Internet service providers, and/or one or more information devices, such as a switch, router, and/or gateway not directly connected to a local area network, etc.

network interface—any device, system, or subsystem capable of coupling an information device to a network. For example, a network interface can be a telephone, cellular phone, cellular modem, telephone data modem, fax modem, wireless transceiver, ethernet card, cable modem, digital subscriber line interface, bridge, hub, router, or other similar device.

non-metal—a substance (such as comprising boron, carbon, and/or nitrogen) that lacks the characteristics of a metal.

outer—external relative to other components.

outlet—an exit passage.

part—component.

pass—to go through something.

pass through—to transmit and/or convey in one side and out an opposite or another side of something.

perform—to accomplish something.

place—to put something in a particular location.

placement—a positioning of something in a particular location.

plasma—an electrically conducting medium in which there are roughly equal numbers of positively and negatively charged particles, produced when the atoms in a gas become ionized.

plate—a substantially planar sheet of material having a thickness.

plurality—the state of being plural and/or more than one.

portion—a part of a whole.

predetermined—established in advance.

probability—a quantitative representation of a likelihood of an occurrence.

processor—a device and/or set of machine-readable instructions for performing one or more predetermined tasks. A processor can comprise any one or a combination of hardware, firmware, and/or software. A processor can utilize mechanical, pneumatic, hydraulic, electrical, magnetic, optical, informational, chemical, and/or biological principles, signals, and/or inputs to perform the task(s). In certain embodiments, a processor can act upon information by manipulating, analyzing, modifying, converting, transmitting the information for use by an executable procedure and/or an information device, and/or routing the information to an output device. A processor can function as a central processing unit, local controller, remote controller, parallel controller, and/or distributed controller, etc. Unless stated otherwise, the processor can be a general-purpose device, such as a microcontroller and/or a microprocessor, such the Pentium IV series of microprocessor manufactured by the Intel Corporation of Santa Clara, Calif. In certain embodiments, the processor can be dedicated purpose device, such as an Application Specific Integrated Circuit (ASIC) or a Field Programmable Gate Array (FPGA) that has been designed to implement in its hardware and/or firmware at least a part of an embodiment disclosed herein.

project—to calculate, estimate, or predict.

propel—to cause to move.

provide—to furnish, supply, give, and/or make available.

receive—to get as a signal, take, acquire, and/or obtain.

recirculate—to move or pass through a circuit back to a starting point.

recombine—to cause to unite after having been previously united and separated.

recommend—to suggest, praise, commend, and/or endorse.

remove—to take something out of a space (e.g., to take something off of a surface).

render—to make perceptible to a human, for example as data, commands, text, graphics, audio, video, animation, and/or hyperlinks, etc., such as via any visual, audio, and/or haptic means, such as via a display, monitor, electric paper, ocular implant, cochlear implant, speaker, etc.

repeatedly—again and again; repetitively.

request—to express a desire for and/or ask for.

reservoir—a fluid storage vessel or a portion of a vessel.

resistant media—a substance usable as a mask for a cuttable material that is less susceptible to being cut than the cuttable material when exposed to a cutting environment.

resisted vinyl removal—a process of taking away material from a vinyl surface with certain portions of the vinyl surface shielded from being taken away by the process.

sandblast—to forcibly propel a stream of abrasive material against a surface under high pressure to cause material to be removed from the surface.

select—to make a choice or selection from alternatives.
set—a related plurality.
shape—to form into a particular contour.
shell—a protective encasement.
silicone—also known as polysiloxane, is a polymer that includes any synthetic compound made up of repeating units of siloxane, which is a chain of alternating silicon atoms and oxygen atoms, combined with carbon, hydrogen, and sometimes other elements.
signal—information, such as machine instructions for activities and/or one or more letters, words, characters, symbols, signal flags, visual displays, and/or special sounds, etc. having prearranged meaning, encoded as automatically detectable variations in a physical variable, such as a pneumatic, hydraulic, acoustic, fluidic, mechanical, electrical, magnetic, optical, chemical, and/or biological variable, such as power, energy, pressure, flowrate, viscosity, density, torque, impact, force, frequency, phase, voltage, current, resistance, magnetomotive force, magnetic field intensity, magnetic field flux, magnetic flux density, reluctance, permeability, index of refraction, optical wavelength, polarization, reflectance, transmittance, phase shift, concentration, and/or temperature, etc. Depending on the context, a signal and/or the information encoded therein can be synchronous, asynchronous, hard real-time, soft real-time, non-real time, continuously generated, continuously varying, analog, discretely generated, discretely varying, quantized, digital, broadcast, multicast, unicast, transmitted, conveyed, received, continuously measured, discretely measured, processed, encoded, encrypted, multiplexed, modulated, spread, de-spread, demodulated, detected, de-multiplexed, decrypted, and/or decoded, etc.
smoke—a gaseous product from burning a plant material.
specific volume negative space relief—a cavity that defines a pathway constructed for retention and/or passage of liquids and/or gases.
store—to place, hold, and/or retain data, typically in a memory.
subsequent—after in time.
substantially—to a great extent or degree.
support—to bear the weight of, especially from below.
system—a collection of mechanisms, devices, machines, articles of manufacture, processes, data, and/or instructions, the collection designed to perform one or more specific functions.
trap—to substantially prevent passage of something.
turn—to rotate about an axis.
user interface—any device for rendering information to a user and/or requesting information from the user. A user interface includes at least one of textual, graphical, audio, video, animation, and/or haptic elements. A textual element can be provided, for example, by a printer, monitor, display, projector, etc. A graphical element can be provided, for example, via a monitor, display, projector, and/or visual indication device, such as a light, flag, beacon, etc. An audio element can be provided, for example, via a speaker, microphone, and/or other sound generating and/or receiving device. A video element or animation element can be provided, for example, via a monitor, display, projector, and/or other visual device. A haptic element can be provided, for example, via a very low frequency speaker, vibrator, tactile stimulator, tactile pad, simulator, keyboard, keypad, mouse, trackball, joystick, gamepad, wheel, touchpad, touch panel, pointing device, and/or other haptic device, etc. A user interface can include one or more textual elements such as, for example, one or more letters, number, symbols, etc. A user interface can include one or more graphical elements such as, for example, an image, photograph, drawing, icon, window, title bar, panel, sheet, tab, drawer, matrix, table, form, calendar, outline view, frame, dialog box, static text, text box, list, pick list, pop-up list, pull-down list, menu, tool bar, dock, check box, radio button, hyperlink, browser, button, control, palette, preview panel, color wheel, dial, slider, scroll bar, cursor, status bar, stepper, and/or progress indicator, etc. A textual and/or graphical element can be used for selecting, programming, adjusting, changing, specifying, etc. an appearance, background color, background style, border style, border thickness, foreground color, font, font style, font size, alignment, line spacing, indent, maximum data length, validation, query, cursor type, pointer type, autosizing, position, and/or dimension, etc. A user interface can include one or more audio elements such as, for example, a volume control, pitch control, speed control, voice selector, and/or one or more elements for controlling audio play, speed, pause, fast forward, reverse, etc. A user interface can include one or more video elements such as, for example, elements controlling video play, speed, pause, fast forward, reverse, zoom-in, zoom-out, rotate, and/or tilt, etc. A user interface can include one or more animation elements such as, for example, elements controlling animation play, pause, fast forward, reverse, zoom-in, zoom-out, rotate, tilt, color, intensity, speed, frequency, appearance, etc. A user interface can include one or more haptic elements such as, for example, elements utilizing tactile stimulus, force, pressure, vibration, motion, displacement, temperature, etc.
utilize—to employ in a task.
vectorize—to convert from a bitmapped image into vector graphics (i.e., a mathematical representation that utilizes 2D point located polygons to represent the image).
vessel—a container.
via—by way of and/or utilizing.
vinyl—a material comprising a polymer that comprises a functional group with the formula —CH=CH$_2$.
weld—to join materials by using heat to melt the parts together and allowing them to cool causing fusion.
working—used in operation of a device, method, and/or system.

Note

Still other substantially and specifically practical and useful embodiments will become readily apparent to those skilled in this art from reading the above-recited and/or herein-included detailed description and/or drawings of certain exemplary embodiments. It should be understood that numerous variations, modifications, and additional embodiments are possible, and accordingly, all such variations, modifications, and embodiments are to be regarded as being within the scope of this application.

Thus, regardless of the content of any portion (e.g., title, field, background, summary, description, abstract, drawing figure, etc.) of this application, unless clearly specified to the contrary, such as via explicit definition, assertion, or argument, with respect to any claim, whether of this application and/or any claim of any application claiming priority hereto, and whether originally presented or otherwise:

there is no requirement for the inclusion of any particular described or illustrated characteristic, function, activity, or element, any particular sequence of activities, or any particular interrelationship of elements;

no characteristic, function, activity, or element is "essential";

any elements can be integrated, segregated, and/or duplicated;

any activity can be repeated, any activity can be performed by multiple entities, and/or any activity can be performed in multiple jurisdictions; and any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

When any claim element is followed by a drawing element number, that drawing element number is exemplary and non-limiting on claim scope. No claim of this application is intended to invoke paragraph six of 35 USC 112 unless the precise phrase "means for" is followed by a gerund.

Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such material is specifically not incorporated by reference herein.

Accordingly, every portion (e.g., title, field, background, summary, description, abstract, drawing figure, etc.) of this application, other than the claims themselves, is to be regarded as illustrative in nature, and not as restrictive, and the scope of subject matter protected by any patent that issues based on this application is defined only by the claims of that patent.

What is claimed is:

1. A method comprising:
   via computer aided design, designing parts of a non-metal vessel that comprises an outer shell and an inner body, at least one of the outer shell and the inner body defining a specific volume negative space relief, wherein:
      the specific volume negative space relief defines a channel constructed to pass at least one of a fluid and a gas;
      at least one of the outer shell and the inner body defines at least one aperture; and
      via the aperture at least one of the fluid and the gas is passable via the channel between the outer shell and the inner body;
   making a silicone mold for the parts of the non-metal vessel via at least one of a 3-D printer, a machine tool that utilizes computer numerical control to create the silicone mold; and
   making a part of the non-metal vessel via the silicone mold.

2. The method of claim 1, further comprising:
   mixing silicone usable in the silicone mold;
   degassing the silicone under vacuum;
   injecting the silicone in the silicone mold;
   curing the silicone in the silicone mold;
   removing the part from the silicone mold; and
   cleaning the part.

3. The method of claim 1, further comprising:
   bonding silicone parts of the non-metal vessel; and
   fully curing the silicone parts after bonding.

4. A method comprising:
   fabricating a vessel that comprises an outer shell and an inner body, the inner body defining a specific volume negative space relief, wherein:
      the specific volume negative space relief is defined via a vectorized digital image;
      the specific volume negative space relief is formed via welding, extruding, injection molding, 3D printing, or abrasive blasting with an abrasive resistant mask;
      the specific volume negative space relief is defined via use of a working mask produced via one of 3D printing, injection molding, bonding, abrasive blasting, sandblasting, or resisted vinyl removal; and
   turning the inner body and the outer shell on a lathe;
   heating the inner body and the outer shell;
   shaping the outer shell to conform to the inner body via a graphite paddle, and
   fusing the outer shell to the inner body via heat.

5. The method of claim 4, further comprising:
   cutting a resistant media image from a vectorized digital image, wherein the specific volume negative space relief is formed utilizing the resistant media image.

6. The method of claim 4, further comprising:
   carving the specific volume negative space relief.

7. The method of claim 4, further comprising:
   coupling a resistant media image to the inner body, wherein the resistant media image is used to cut the specific volume negative space relief into the inner body.

8. The method of claim 4, further comprising:
   coupling a negative resistant media image is to the inner body via an adhesive;
   etching the inner body with the negative resistant media image coupled thereto to cut the specific volume negative space relief into the inner body; and
   removing the negative resistant media image after the specific volume negative space relief is cut into the inner body.

9. The method of claim 4, further comprising:
   coupling a negative resistant media image is to the inner body via an adhesive;
   sandblasting the inner body with the negative resistant media image coupled thereto to cut the specific volume negative space relief into the inner body; and
   removing the negative resistant media image after the specific volume negative space relief is cut into the inner body.

10. The method of claim 4, further comprising:
    drilling at least one aperture in the vessel, wherein the at least one aperture is coupled to the specific volume negative space relief.

11. The method of claim 4, further comprising:
    placing the outer shell around the inner body; and
    fusing the outer shell to the inner body.

12. The method of claim 4, further comprising:
    fusing the outer shell to the inner body.

13. The method of claim 4, further comprising:
removing air from the outer shell and leaving negative space relief.

\* \* \* \* \*